United States Patent [19]

Nick

[11] Patent Number: 6,003,012
[45] Date of Patent: *Dec. 14, 1999

[54] METHODOLOGY AND COMPUTER-BASED TOOLS FOR DESIGN, PRODUCTION AND SALES OF CUSTOMIZED SWITCHBOARDS

[75] Inventor: Sascha Nick, Chicago, Ill.

[73] Assignee: Square D Company, Palatine, Ill.

[ * ] Notice: This patent is subject to a terminal disclaimer.

[21] Appl. No.: 08/986,096

[22] Filed: Dec. 5, 1997

[51] Int. Cl.$^6$ .................................................. G06F 15/24
[52] U.S. Cl. ............................ 705/10; 705/1; 364/468.01
[58] Field of Search .................................. 705/1, 7, 8, 10, 705/29; 364/468.01, 468.03, 468.13, 468.14, 468.24, 468.02, 468.1, 468.19, 468.12

[56] References Cited

U.S. PATENT DOCUMENTS

| | | | |
|---|---|---|---|
| 4,203,204 | 5/1980 | Murphy | 29/703 |
| 4,310,964 | 1/1982 | Murphy | 29/469 |
| 4,332,012 | 5/1982 | Sekine et al. | 364/468 |
| 4,472,783 | 9/1984 | Johnstone et al. | 364/474 |
| 4,484,289 | 11/1984 | Hemond | 364/478 |
| 4,504,919 | 3/1985 | Fujii et al. | 364/478 |
| 4,509,123 | 4/1985 | Vereen | 364/300 |
| 4,591,983 | 5/1986 | Bennett et al. | 364/403 |
| 4,984,155 | 1/1991 | Geier et al. | 364/401 |
| 5,047,959 | 9/1991 | Phillips et al. | 364/521 |
| 5,121,330 | 6/1992 | Blaha et al. | 364/468 |
| 5,260,866 | 11/1993 | Lisinski et al. | 364/401 |
| 5,263,164 | 11/1993 | Kannady et al. | 395/700 |
| 5,287,267 | 2/1994 | Jayaraman et al. | 364/403 |

OTHER PUBLICATIONS

Robert M. Curtice, Product Structure Data Systems, "Production & Inventory Management—4th Qtr," Arthur D. Little, Inc., (1973) pp. 27–37.

John McDermott, "R1: A Rule–Based Configurer of Computer Systems," Carnegie–Mellon Univ. Rep. CMU–CS–80–119 (Apr. 1980).

John McDermott, "Domain Knowledge and the Design Process," Carnegie–Mellon Univ. (18th Design Automation Conference, 1981) pp. 580–588.

McDermott & Steele, "Extending a Knowledge–Based System to Deal with Ad Hoc Constraints," NCAI (1981) pp. 824–828.

J. McDermott, "XSEL: A Computer Sales Person's Assistant," Intelligent Systems: Practice and Perspective, Machine Intelligence vol. 10, Halsted Press, (1982), pp. 325–337.

(List continued on next page.)

*Primary Examiner*—Allen R. MacDonald
*Assistant Examiner*—Susanna Meinecke-Díaz
*Attorney, Agent, or Firm*—Kareem M. Irfan; Larry I. Golden

[57] ABSTRACT

An in-depth review of the switchboard business, including customer interviews, revealed that customer specifications were more complex than customer needs. Customer needs were quantified, and a reduced set of standard switchboard configuration classes was selected so that about 80% of customer orders based on actual customer needs could be satisfied by the standard switchboard configuration classes, and the remaining orders would be satisfied by custom designed switchboards. Major components in the standard switchboards were themselves standardized. A standard switchboard, for example, has a continuous current capacity of no more than 4000 Amps, a maximum voltage rating of 480 Vac, a short circuit current rating of no more than 200 kA, and an aluminum or copper bus. The manufacture of the standard switchboards was optimized for a one-day manufacturing cycle and separated from the manufacture of the custom designed switchboards. A sales office and manufacturing plant roll-out schedule was implemented and managed by computer-based spreadsheet tools. A switchboard configuration computer program module was designed and interfaced between a product selector and a materials management (MRP) system in order to automate the process of entering orders, designing standard switchboards, ordering parts, and scheduling assembly of standard switchboards.

69 Claims, 29 Drawing Sheets

OTHER PUBLICATIONS

John McDermott, "Extracting Knowledge from Expert Systems," IJCAI (1983), pp. 100–107.

Kirk L. Prather, "Streamline Manufacturing Costs via Better Bills of Material," Readings in Computers and Software, (APICS 27th Annual International Conference—Oct. 9–12, 1984) pp. 25–28.

Paul N. Funk, "Sales Order Option Configurations—How to Assemble–to–Order for Profit," Readings in Computers and Software, (APICS 27th Annual International Conference—Oct. 9–12, 1984) pp. 63–64.

S. Marcus et al., "Knowledge Acquisition for Constructive Systems," IJCAI (1985), pp. 637–639.

David C. Brown, "Failure Handling in a Design Expert System," Computer–Aided Design, Computer, IEEE, vol. 17, No. 9 Butterworth & Co. (pub), (Nov. 1985), pp. 436–442.

S. Mittal et al., "PRIDE: An Expert System for the Design of Paper Handling Systems," (Jul. 1986), pp. 102–114.

Mather, H. F., "Design, Bills of Materials, and Forecasting—the Inseparable Threesome", Production and Inventory Management, First Quarter 1986, Journal of the American Production and Inventory Control Society, vol. 27, No. 1, pp. 90–107.

"Integrated Manufacturing—America's Competitive Strategy," Production Engineering Penton/PC Feb. 1986, pp. IM1–IM32.

Frayman & Mittal, "COSSACK: A Constraints–Based Expert System for Configuration Tasks" (2nd Int'l Conf. on Applications of AI to Engineering Proceedings, Aug. 1987), pp. 1–24.

"Product Data—Switchboard Short Circuit Current Testing", Bulletin P–27C, Square D Co., Feb. 1987, pp. 1–7.

"Calculation of Section Bus Ampacity," NEMA Application Standards Section 6.4.1, PB2–1989, p. 20.

"Laser$^{SM}$ Speed–D® SB/SF Fast Track Program", Service Section Switchboards, Class 2710 Selection Guide, Square D Co., Mar. 1991, pp. 1–8.

"Power–Style® Switchboards", Class 2700, Square D Co., Oct. 1991, pp. 1–4.

"Product News QED–4: A Rugged Industrial Switchboard", Square D Co., Groupe Schneider, Feb. 1992, pp. 1–4.

QMB High Density Fusible Switchboards, Square D Co., 1992, pp. 1–9.

McClelland, Marilyn K., "Using Simulation to Facilitate Analysis of Manufacturing Strategy", Journal of Business Logistics, vol. 13, No. 1, 1992, pp. 215–237.

Jennison, Jerome B., "Computer Aided Engineering at Western Area Power Increase Productivity," Transmission & Distribution, vol. 44, No. 8, Aug. 1992, pp. 34–38.

"Power–Style® Switchboard Products", Square D Co., Groupe Schneider, 1993, pp. 1–19.

A. Balkany et al., "An Analysis of Several Configuration Design Systems,"AI EDAM, Academic Press Limited, (1993), pp. 1–17.

"Class 2756 New From Square D—Commercial Multi–Metering", Square D Co., Groupe Schneider, Sep. 1993.

Carey et al., "Proper Data Management Strengthens Design Quality", Electronics Design, Oct. 14, 1993 pp. 90–95.

Stein, Martin M. "The Ultimate Customer–Supplier Relationship at Bose", National Productivity Review, vol. 12, No. 4, (1993) pp. 543–548.

Suare D, Switchboards Class 2700, Q/To™ Worksheet For Switchboards, Square D. Corp., (6 pages) Oct. 1993.

"Square D—Unitized Distribution Switchboard," Class 2700, Square D Co., Groupe Schneider, Feb. 1994, pp. 1–2.

"Dead Front Switchboards—UL Rule 891," Underwriters Laboratory, Feb. 14, 1994, p. 47.

Mark Stefik, Knowledge Systems, Morgan Kaufmann Publishers, Inc. (1995), pp. 608–669.

"Power–Style® QED–2 Switchboards Group Mounted", Class 2742, Square D Co., Groupe Schneider, Dec. 1995, pp. 1–44.

Ryan C. and Riggs, W.R., "Redefining the Product Life Cycle: The Five–Element Product Wave," Business Horizons, vol. 39, No. 5, JAI Press, Inc., Sep.–Oct. 1996, pp. 33–40.

"Bridging What We Make With What We Sell," Connections, Groupe Schneider (2nd Qtr. 1997), pp. 8–9.

"Switchboard Automatic Throwover System", Square D Co., Feb. 1998, pp. 1–4.

STANDARD SWITCHBOARD PROJECT STATUS AS OF JUNE 6, 1997

| SUB-PROJECT | DESCRIPTION | ENGR. | ENGR HOURS | START DATE | LOCAL ENGR. REL. DATE | SCHED. EFF. DATE | ON SCHED. (DAYS) | % COMP | % OF ECOs ENG. REL. | % OF ECOs PROD REL. |
|---|---|---|---|---|---|---|---|---|---|---|
| SW094 | CT/PT MOUNTING | | 933 | 27-JAN | 16-MAY | 23-MAY | .8 | 100% | 100% | 25% |
| SW135 | COMPRESSION LUGS | | 473 | 27-JAN | 18-APR | 28-APR | | 100% | 100% | 50% |
| SW163 | NORTHERN STATES POWER | FAUGHT | 307 | 29-JAN | 15-JUL | 22-JUL | 0 | 30% | 100% | 0% |
| SW164 | PUBLIC SERVICE E & G | ROBINSON | 1641 | 29-JAN | 18-JUL | 25-JUL | 0 | 70% | 0% | TRUE |
| SW166 | VIRGINIA ELECTRIC POWER | DOZIER | 2471 | 29-JAN | 16-JUL | 23-JUL | .6 | 85% | 38% | 0% |
| SW176 | FULL HT. SIX CIR. MAINS | SLIMMER | 1032 | 3-APR | 15-JUL | 22-JUL | 15 | 80% | 0% | 0% |
| SW178 | STACKED SIX CIR. MAINS | | 94 | 3-MAR | 3-JUL | 10-JUL | 2 | 100% | 100% | 0% |
| SW175 | COMM ED DEPTH CHANGE | VISOCKY | 1711 | 3-APR | 15-JUL | 22-JUL | 0 | 50% | 0% | 0% |
| SW170 | NORTHERN UTILITIES | | 2815 | 29-JAN | TBT | TBT | 0 | 5% | 0% | 0% |
| SW171 | DETROIT ELECTRIC | ROBINSON | 896 | 3-MAR | 18-JUL | 25-JUL | 0 | 30% | 0% | 0% |

*Fig. 8*

LEFT SIDE VIEW

To Fig. 21

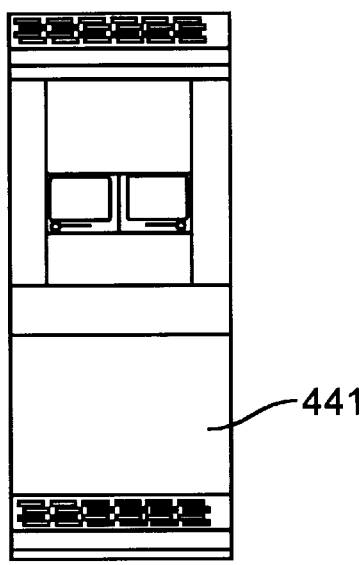
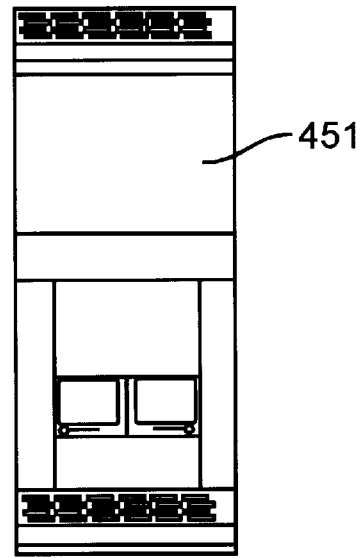
Fig. 42  Fig. 43
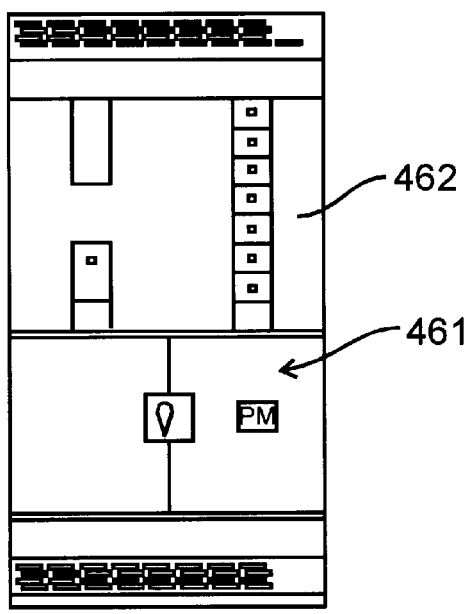
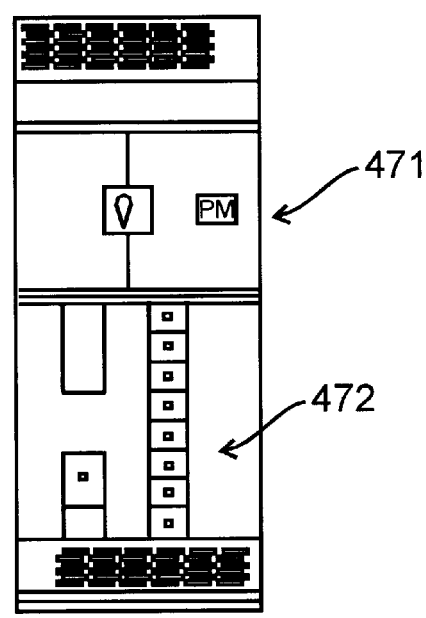
Fig. 44  Fig. 45

METHODOLOGY AND COMPUTER-BASED TOOLS FOR DESIGN, PRODUCTION AND SALES OF CUSTOMIZED SWITCHBOARDS

BACKGROUND OF THE INVENTION

1. Field of the Invention.

The present invention relates generally to electrical equipment that is assembled to satisfy individual customer orders, and more particularly to switchboards.

2. Description of the Related Art.

A switchboard is a kind of electrical power distribution unit. Electrical power to a building flows from high voltage utility lines to step-down transformers, from the transformers to one or more switchboards, and from the switchboards to branch or distribution circuits for lighting, heating and air conditioning, elevators, pumps, and electrical outlets. The switchboards include utility metering devices, mains protection devices, and branch or distribution protection devices. Each switchboard may have only utility metering devices, only mains protection devices or only branch or distribution protection devices, or various combinations of these devices. Each switchboard includes a metal box typically mounted as a free standing unit on the floor of a utility room in the building. A switchboard typically has a current rating of 600 to 4000 amperes. A very large building or installation such as an airport will typically have a number of switchboards.

Traditionally, a customer through a sales person provided specifications for a switchboard to an order engineer. The order engineer custom designed the entire switchboard using a software tool. There are millions of possible switchboard configurations, about 3,000 of which were designed annually. About 30% of the time, the order engineer would use an existing standard switchboard configuration. The other 70% of the time, the order engineer would custom engineer a new configuration. Custom designs were almost never re-used. The components were then fabricated, purchased, or taken from inventory, and then assembled according the desired switchboard configuration.

The software tool used by the order engineer was a kind of order entry computer system. An example of such an order entry system is described in Geier et al., U.S. Pat. No. 4,984,155 entitled "Order Entry System Having Catalog Assistance," incorporated herein by reference, and Phillips et al., U.S. Pat. No. 5,047,959 entitled "Flexible Data Display," incorporated herein by reference. Once the order engineer chose the components to be custom assembled into a switchboard, the software tool generated a bill of materials to be used by a materials management (MRP) computer system. The software tool was automatically linked to the MRP system. The MRP system managed inventory, ordered parts, and managed production capacity. The MRP system ensured that all of the components needed for assembling the switchboard were available at or delivered to an assembly location by the time when the switchboard would be scheduled for assembly.

The switchboard market is rather mature. It is a very competitive market. The complexity of the product has traditionally had a strong impact on the profitability of the switchboard business. Computer-based tools and modern management techniques, such as flexible manufacturing, just-in-time inventory, component count and cost reduction programs, and a total customer satisfaction objective, have been applied over the years with some success to deliver a quality product at a reasonable price. Small players have survived in the market due to their flexibility, short lead-times, low labor costs, and close customer relationships.

SUMMARY OF THE INVENTION

An in-depth review of the switchboard business, including customer interviews, revealed a discrepancy between the actual needs of the customers and the needs expressed in the customer specifications. The customer specifications were much more complex than the customer needs. The complexity was quantified and expressed by a histogram or graph of the frequency of assembly hours for custom design configurations in an ensemble of about three-thousand custom engineered switchboards. This histogram identified the specific switchboard configurations that were the least complex and the most frequent, and the switchboard configurations that were the most complex and the least frequent.

The customer needs were quantified and classified in terms of site specific needs, area specific needs, and general needs, in order to identify specific switchboard configurations that could satisfy the most frequent customer needs. The more frequent and less complex configurations were grouped into standard configuration classes, and standardized with an understanding of the area-specific needs and how components could be physically assembled to satisfy the customers' actual needs. For utility sections, an effort was made to obtain variances of utility requirements that were necessary for approval of standard designs among a number of the utility companies.

If a customer's actual needs could not be satisfied by a switchboard assembled from the standard configuration classes, then the customer's actual needs would be satisfied by custom design and assembly of a switchboard. A reduced set of nineteen standard configuration classes was selected so that about 80% of customer orders based on actual customer needs could be satisfied by the nineteen standard configuration classes, and the remaining orders would be satisfied by custom-designed switchboards. A standard switchboard, for example, has a continuous current capacity of no more than 4000 Amps, a maximum voltage rating of 480 Vac, a short circuit current rating of no more than 200 kA, and an aluminum or copper bus. Major components used in the standard switchboards were themselves standardized, which involved reducing the number of such standard components and modifying the standard components to have a wider range of applicability.

The manufacture of the standard switchboards was optimized and separated from the manufacture of the custom designed switchboards. The standard switchboards were scheduled for manufacture about one day prior to the delivery date requested by the customer. Pricing chosen for the various possible switchboard configurations was more fairly based on the actual customer demand for and the cost of supplying each possible switchboard configuration. A premium price was established for an order time to delivery time substantially shorter than the time that was generally required in the industry for designing and manufacturing a custom switchboard.

A sales office and manufacturing plant roll-out schedule was established for implementation of the new switchboard sales and production methodology. Computer based tools, in the form of spreadsheets, were designed to monitor the implementation of the new methodology and to report the profitability of the standard and custom designs.

A switchboard configuration computer program module was designed in order to determine whether a customer specification could be satisfied by standard switchboard sections, and if not, to warn a sales engineer of a penalty associated with the required custom assembly, and to indicate why the specification could not be met by a standard switchboard. If the customer specification could be satisfied by one of the standard switchboard configuration classes, then the switchboard configuration module generated a specific switchboard design to meet the customer specification, including an assembly drawing and a bill of materials for the specific switchboard design. The switchboard product configuration module can generate about 300 switchboard configurations from the nineteen standard configuration classes. The switchboard configuration module provided a link between a product selector and a materials management (MRP) system, in order to automate the process of entering orders, designing standard switchboards, ordering parts, and scheduling assembly of standard switchboards.

BRIEF DESCRIPTION OF THE DRAWINGS

Other objects and advantages of the invention will become apparent upon reading the following detailed description with reference to the accompanying drawings wherein:

FIG. 8 is a print-out from a spread-sheet software tool used to manage the implementation of the design process flow of FIG. 6;

FIG. 42 is a front elevation of a full-height switchboard section having a lower main lug compartment and an upper compartment for fusible distribution;

FIG. 43 is a front elevation of a full-height switchboard section having an upper main lug compartment and a lower compartment for fusible distribution;

FIG. 44 is a front elevation of a full-height switchboard section having a lower main circuit breaker compartment and an upper compartment for two rows of I-LINE® distribution breakers;

FIG. 45 is a front elevation of a full-height switchboard section having an upper main circuit breaker compartment and a lower compartment for two rows of I-LINE® distribution breakers;

Figure 1:
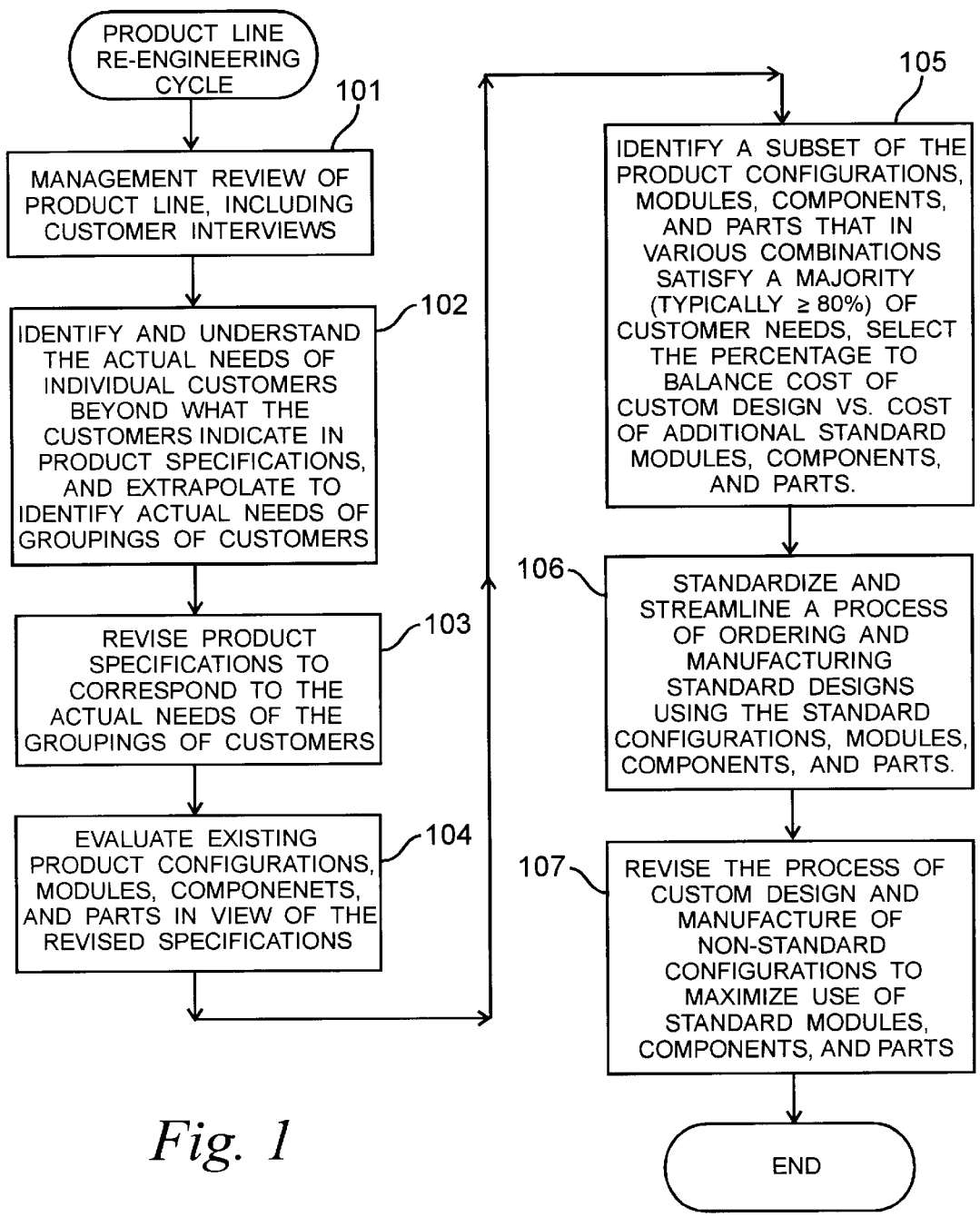
FIG. 1 is a general flowchart of a product line re-engineering cycle involving a product that is assembled to satisfy individual customer orders.

While the invention is susceptible to various modifications and alternative forms, a specific embodiment thereof has been shown in the drawings and will be described in detail. It should be understood, however, that it is not intended to limit the invention to the particular form shown, but on the contrary, the intention is to cover all modifications, equivalents, and alternatives falling within the scope of the invention as defined by the appended claims.

DETAILED DESCRIPTION OF THE PREFERRED EMBODIMENT

Referring to FIG. 1 of the drawings, there is shown a general flowchart of a product line re-engineering cycle involving a product that is assembled to satisfy individual customer orders. This re-engineering process has been found to be especially useful for enhancing customer satisfaction and profitability in the manufacture and sale of switchboards, and as will be further discussed below, it should also be applicable to other products, such as other electrical equipment, that have had a relatively high degree of complexity in the manufacture and assembly process in comparison to customer needs for the products. An overview of the entire re-engineering cycle will be presented as it applies generally to any product line, and then the re-engineering cycle will be described in detail as it has been applied to switchboards.

In a first step 101, management conducts an in-depth review of the product line, including a study of the product offerings, a study of the manner in which the product is manufactured and sold, and extensive customer interviews to obtain information on the customers' actual needs that should be satisfied by the product. Next, in step 102, the results of the management review and customer interviews are used to identify and understand the actual needs of individual customers beyond what the customers indicate in the product specifications from the customers, and this identification and understanding of the actual needs of individual customers is extrapolated to identify actual needs of groupings of customers. This is done because in a mature product line, the process of production and sales cannot be substantially streamlined beginning with existing forms of customer specifications. During maturation of a product line, an inherent process of product evolution and gradual, incremental improvements will tend to streamline the process of production and sales from the existing forms of customer specifications. However, in many cases, this process of product line maturation will not lead to a simplification of the customer specifications, due to a divergence between what the customer actually needs and what the customer will ask for when attempting to express the needs in the form of a customer specification. Instead, the forms of customer specifications tend to become much more complex than necessary to define the customers' actual needs.

Nor is the problem of specification complexity solved by attempting to satisfy individually the actual needs of each customer. Custom design is the traditional way of satisfying individually the actual needs of each customer, but custom design is very costly. Instead, the problem can be solved by recognizing that it is possible to more economically satisfy actual needs of defined groups of customers when the individual customers have actual needs beyond those indicated in the customer specifications. Moreover, information obtained from the customer interviews about the actual needs of each customer may not appear important to each customer, but when the information is compiled with similar information from the other customers, there will emerge a pattern of general customer needs beyond those expressed in the customer specifications, and those general customer needs can be satisfied by less complexity and cost in a revised sales and production process. It is expected that this should be the case in the electrical equipment industry, where custom design has been a traditional way of satisfying individual customer needs, where established product lines tend to be either 100% custom products or 100% standard products, and where customer specifications are often provided by consulting engineers who are concerned with product safety and tend to over-engineer in case of doubt or lack of time to investigate all available options or specific circumstances of a particular job.

Next, in step 103, management revises the product specifications to more precisely correspond to the actual needs of the groupings of customers that were identified in the previous step 102. Then, in step 104, the existing product configurations, modules, components, and parts are evaluated in view of the revised specifications. This evaluation is done to determine whether some of the existing product configurations, modules, components, and parts are no longer needed, to determine whether to design entirely new product configurations, modules, components, and parts to better satisfy the customers' actual needs, and then to organize and rank the product configurations, modules, components, and parts on a scale of those that are most likely to be used to satisfy the customers' actual needs to those that are least likely to be used to satisfy the customers' actual needs.

In step 105, management identifies a subset of the product configurations, modules, components, and parts that in various combinations satisfy a majority (typically about 80%) of the customer needs. The specific percentage is selected to balance the increased cost of custom design (for a lower percentage) verses the increased cost of maintaining additional standard modules, components, and parts (for a higher percentage).

In step 106, management standardizes and streamlines a process of ordering and manufacturing standard designs using the standard configurations, modules, components, and parts. In other words, a first step in order taking and processing is to determine whether or not the desired product specifications can be met using any of the standard configurations, modules, components, and parts. If so, then the order for the standard product is entered into a materials handling and product manufacturing process in which the plant layout and assembly process is optimized for assembly and quick delivery of the standard product that will meet the desired product specifications. If not, then the desired product specifications must be satisfied by a custom design.

In step 107, management revises the process of custom design and manufacture of non-standard configurations to maximize use of the standard modules, components, and parts.

Figure 2:
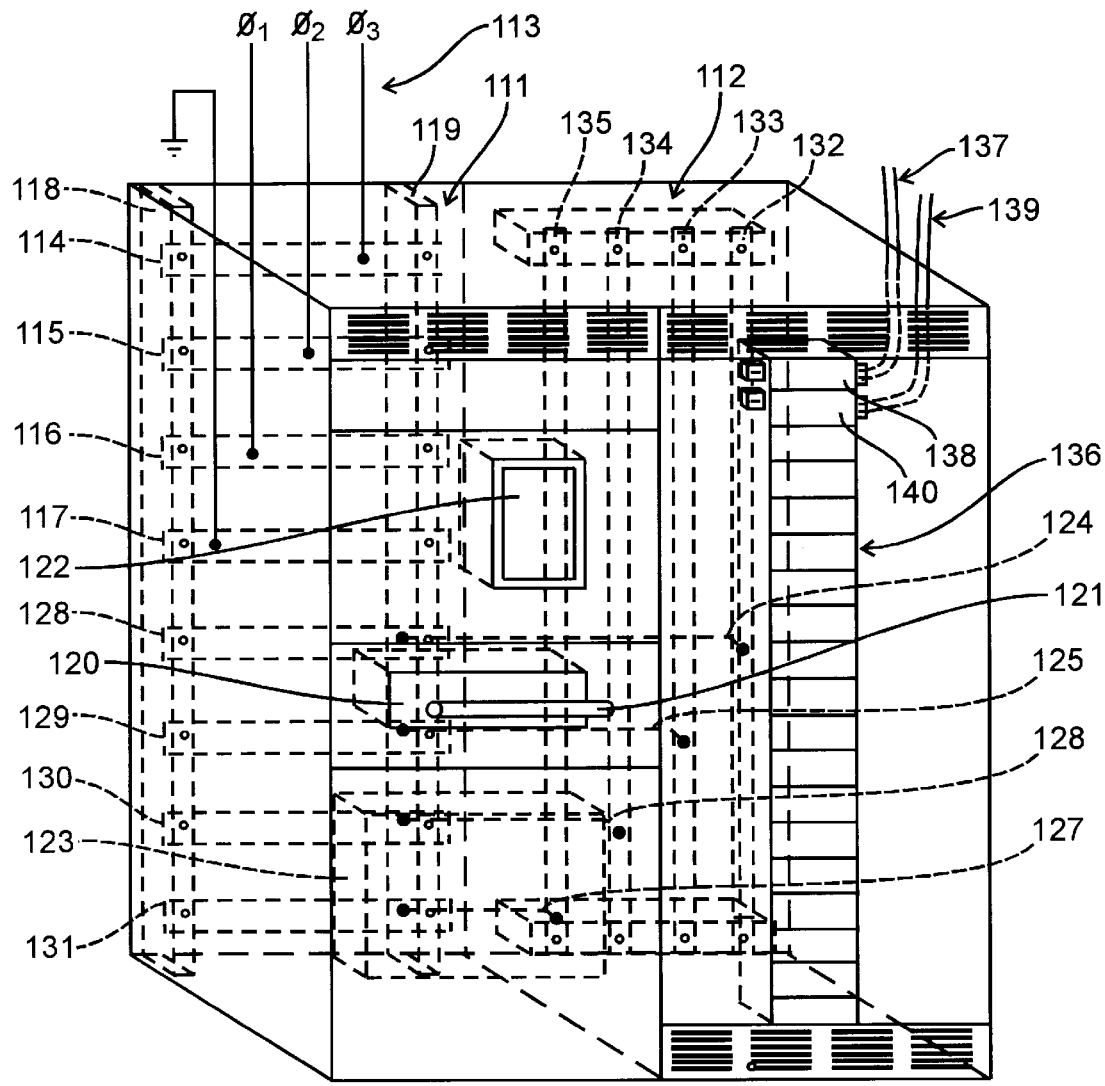
FIG. 2 is a schematic diagram of a specific example of a switchboard.

The re-engineering cycle of FIG. 1 has been found to be especially useful for the re-engineering of the order processing, design, and manufacture of switchboards. A schematic diagram of a specific example of a switchboard is shown in FIG. 2. The switchboard includes two switchboard sections generally designated 111 and 112. Each of the switchboard sections 111 and 112 includes a rectangular metal box having dimensions of 36" wide by 90" high by 24" deep.

The switchboard section 111 is a combination ½ height hot sequence utility and ½ height main fuse, with a top feed and lower right through bus and lugs. In particular, the switchboard section 111 receives three-phase ($\phi_1$, $\phi_2$, $\phi_3$) power from power lines 113 entering enclosure of the section 111 from the top. The power lines 113 are electrically connected inside the enclosure to respective horizontal busses 114, 115, 116, 117 that span vertical dielectric mounting bars 118, 119. The vertical dielectric mounting bars 118, 119 are secured to the rear of the enclosure of the switchboard section 111 and extend from the bottom to the top of the switchboard section 111. Three-phase current from the power lines 113 is conveyed by bus bar sections (not shown in FIG. 2; see FIG. 3 and the corresponding description below) to a mains switch 120 mounted near the front face of the switchboard section 111 and having an external actuator handle 121 in front of the enclosure of the switchboard section 111. Power flowing from the power lines 113 to the mains switch 120 is metered by a utility meter 122 having a front face mounted on the front of the switchboard section 111. When the switch 120 is in a closed state, three-phase current flows from the power lines 113 through the switch 120 to a set of main fuses (not shown) in a fuse module 123. The three-phase current flows through the fuses in the fuse module 123 to through-bus connections 124, 125, 126, and a neutral through-bus connection 127 from the switchboard section 111 to the switchboard section 112. The through-bus connections 124, 125, 126, 127 extend from respective horizontal busses 128, 129, 130, 131 in the switchboard section 111 to respective vertical busses 132, 133, 134, 135, in the switchboard section 112.

The switchboard section 112 is a full-height distribution circuit breaker section having an array of circuit breakers 136 mounted near the front of the section 112 and extending from about the top to about the bottom of the section 112. Each circuit breaker receives power from at least two of the vertical busses 132, 133, 134 conveying power, and supplies power to a respective distribution circuit. For clarity, only the distribution lines 137 from a first circuit breaker 138 and the distribution lines 139 from a second circuit breaker 140 are shown in FIG. 2.

Figure 3:
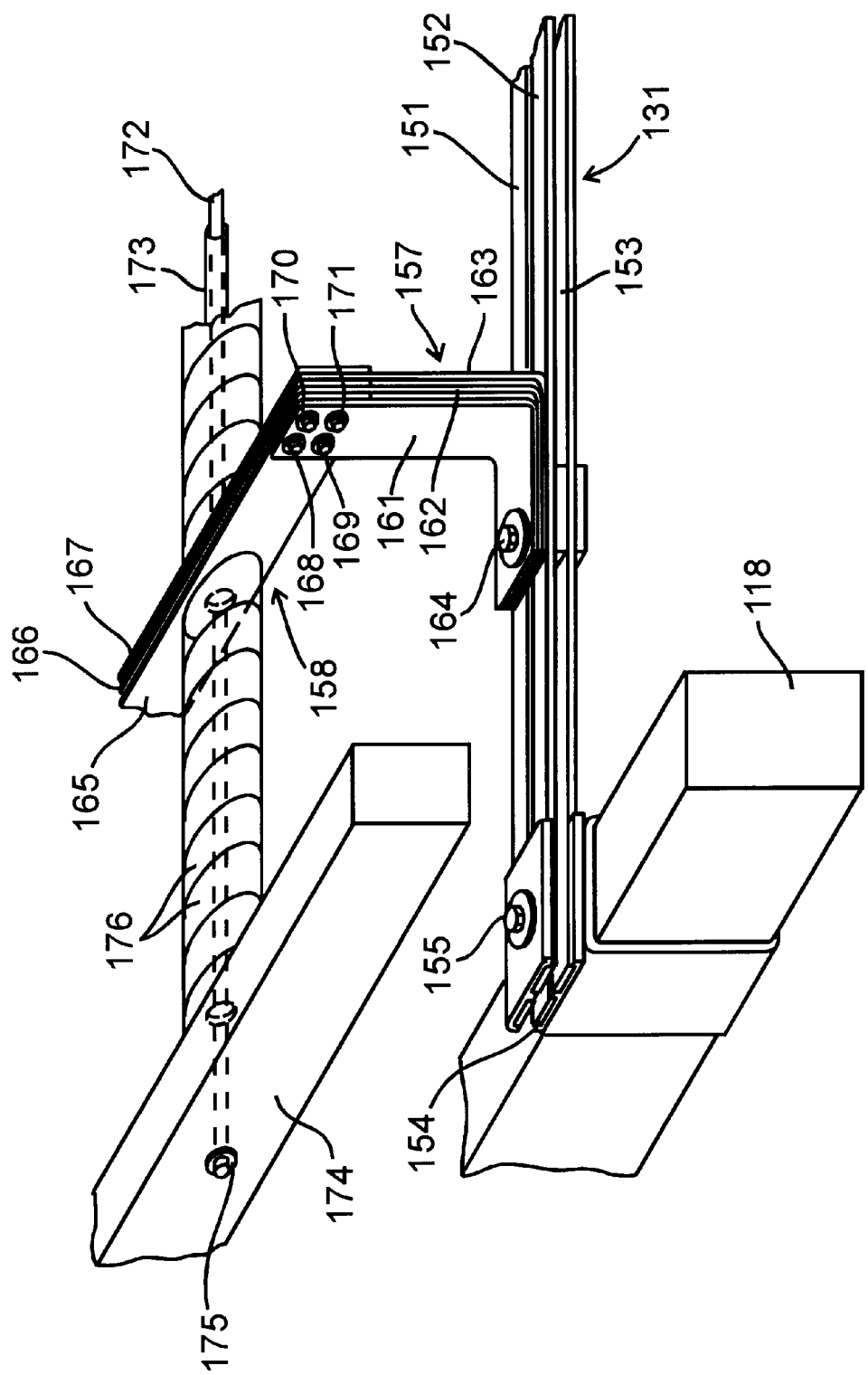
FIG. 3 is a detailed view of a lower horizontal bus 131 in a first section of the switchboard of FIG. 2.

Numerous parts have been omitted from FIG. 2 for clarity. These parts include lugs and interconnection busses which provide the circuit paths between the various power lines, busses, modules, and components shown in FIG. 2. These parts introduce a good deal of complexity in the design and manufacture of the switchboard. For example, FIG. 3 shows a detailed view of the lower horizontal bus 131 in the first switchboard section (111 of FIG. 1). The bus 131 includes four co-extensive parallel-spaced bus bars 151, 152, 153, and 154 made of copper or aluminum. As shown in FIG. 3, the left-most end portions of the bus bars 151, 152, 153, and 154 are clamped to the dielectric bar 118 by a bolt 155.

Electrical connections between the bus 131 and modules or components (such as the fuse module 123 in FIG. 2) are made by various parts that comprise interconnecting bus sections such as the bus section 157 and the bus section 158. The bus sections 157, 158 are each comprised of three co-extensive, parallel-spaced flat bars of copper or aluminum. The bus section 157 is comprised of angle-shaped bars 161, 162, 163 secured to the bus 131 by a bolt 164. The bus section 158 is comprised of elongated bars 165, 166, 167. The bus section 158 is joined to the bus section 157 by four bolts 168, 169, 170, 171.

In order to fix the relative position of the bus section 158 within the enclosure of the switchboard section (111 in FIG. 2) containing the bus section 158, the bus section 158 is mounted by dielectric spacers 176 on an a metal rod 172 covered by a tubular dielectric sleeve 173 and extending from a side rail 174. The side rail 174 is mounted parallel to the dielectric bar 118 within the enclosure of the switchboard section (111 in FIG. 2). The metal rod 172 has a threaded end portion secured to the side rail 174 by a nut 175.

It should be apparent that the construction shown in FIG. 3 permits the bus sections 157 and 158 to be mounted at various lateral positions along horizontal bus 131. For example, the bolt 164 can be loosened to permit the bus section 157 to slide laterally along the horizontal bus 131, and the lateral position of the bus section 158 can be selected by choosing the number of dielectric spacers 176 disposed between the side rail 174 and the bus section 158. In this fashion, parts similar to the parts in the bus sections 157 and 158 can be used to electrically connect electrical terminals and lugs of the various modules and components in the switchboard sections (111, 112 in FIG. 2) to the respective horizontal and vertical busses in the switchboard sections. Parts similar to the parts in the bus sections 157 and 158 can also be used for electrical connections between the various modules and components of the switchboard sections. The precise length and shape of the parts, however, will be dictated by the configuration and relative orientations of the modules and components of the switchboard sections. The number of flat bars included in each bus section should also vary depending on the desired ampacity; for example, four flat bars are used for 4000 Amp., three flat bars are used for 3000 Amp., and two flat bars are used for up to 2000 Amp. Therefore, a large number of different parts are needed for manufacturing switchboards of various configurations.

The present invention is the result of an exhaustive, multi-faceted and in-depth review at the Square D Company of the switchboard business. The review extended over a wide spectrum of business activities beginning with assessment of customer requirements and leading to delivery of a satisfactory product. The review confirmed that the existing process of producing and selling switchboards to meet customer-supplied specifications was efficient and could not be improved significantly. However, the review did not end with an analysis of the company's internal operations such as the role played by the order engineer, the computer-based tools, the component and product offerings, and the material resource management and assembly operations. Instead, the review was extended to include a detailed evaluation of the varied business needs of customers by various means including comprehensive interviews of customers. The customers included various local utilities that set certain specifications for the switchboards used in their power distribution networks.

The detailed evaluation revealed a discrepancy between the actual needs of the customers and the needs that were perceived by the customers and expressed in the customer specifications for switchboards being ordered. Tens of customers in strategic business segments and markets were interviewed in the first month of the interviews. The customers were asked how they were purchasing and installing their switchboard, and they were probed as to why they had submitted any customer specifications that were inconsistent with their actual needs. In some cases there was a discrepancy between the customer specifications and the customer's actual needs because the customer was simply re-submitting a prior specification from a previous order which, in turn, had not been optimized either. The customer thought that the prior specification would be adequate for the present needs, but the customer did not have a convenient basis for considering that a lower price could be obtained if the specification were revised to more accurately reflect the present needs.

The customer specifications were much more complex than the customer needs. Due to the complex customer specifications, the order engineer had a difficult task of designing a switchboard that would comply with the customer specifications. The difficulty could not be reduced simply by better communication between the customer and the order engineer, or by more complete knowledge of the product offerings of the switchboard producer.

As a result of the customer interviews, the internal operations of Square D Co. were analyzed in terms of the complexity introduced by designing and assembling switchboards in response to customer specifications. The complexity was quantified and expressed by a histogram or graph of the frequency of assembly hours for an ensemble of about three-thousand of the custom-engineered switchboards.

Figure 4:
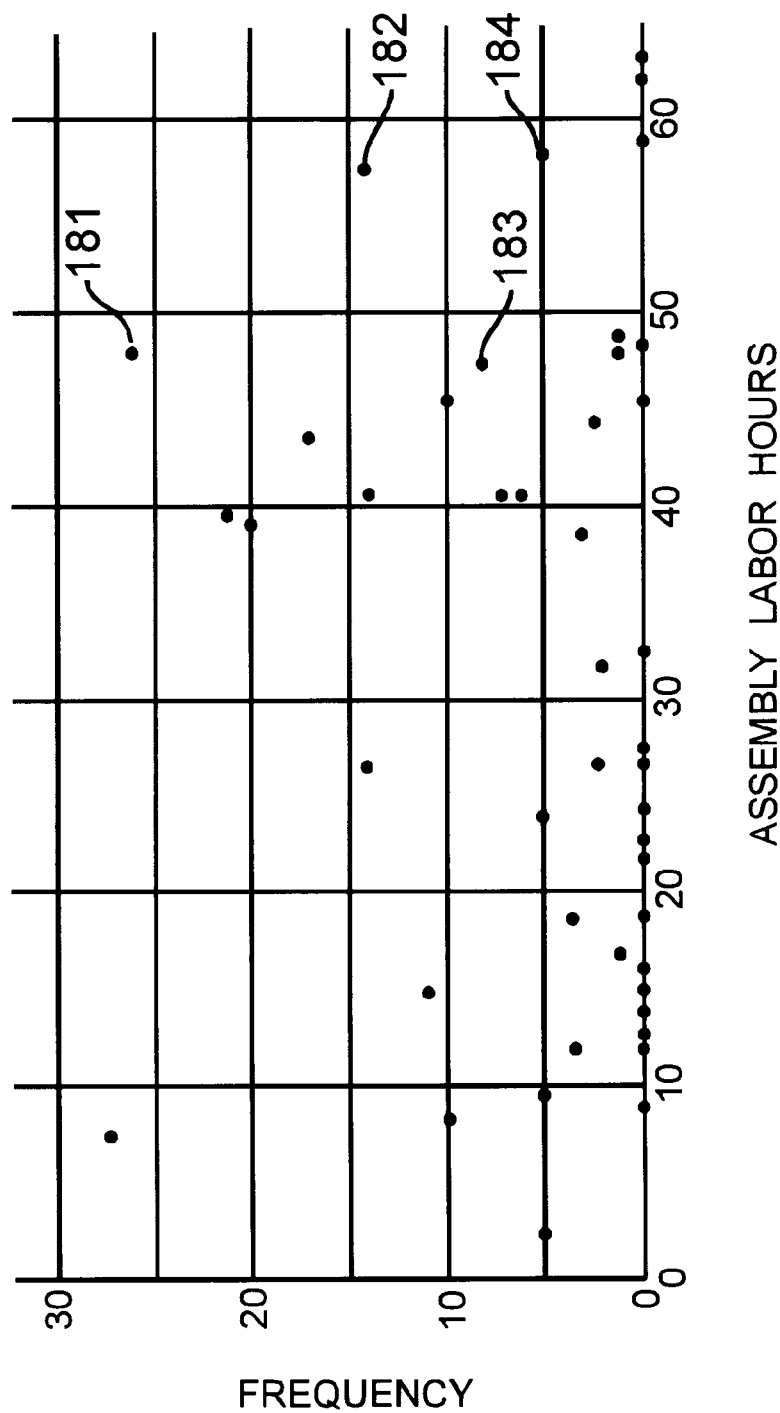
FIG. 4 is a histogram of the frequency and assembly hours for 44 possible switchboard configurations for sales of about 240 custom switchboards over a period of time.

Shown in FIG. 4, for example, is such a histogram over a representative period of time during which about 240 custom switchboards were sold. Each data point in FIG. 4 represents the frequency and assembly hours for one of 44 possible classes of switchboard configurations manufactured and sold by Square D Co. before implementation of the standard switchboard sections, modules, components, and parts as described below. The frequency associated with each data point is the number of occurrences of sales in the ensemble. For example, the data point 181 represents 26 sales over the sample period of Square D Co. I-LINE® switchboard sections having a busway connection, any custom bus substation connection, or any non-EU service utility. The data point 182 represents 14 sales of Square D Co. 3000/4000 Amp. SEF or 3000 Amp. SED switchboard sections having a busway connection, substation A connection, non-EU service utility, a custom bus, or any wiring. The data point 183 represents 8 sales of Square D Co. BP20 branch circuit-breaker switchboard sections having a busway connection, substation A connection, or non-EU service utility, any custom bus, or any wiring. The data point 184 represents 5 sales of Square D Co. switchboard sections having all special breakers or switches MP, DS, 4000 Amp. SED, and vendor purchased. A good number of the data points represent possible switchboard configurations that had no sales in the ensemble. A few other data points have a frequency of one or two, and therefore represent infrequent occurrences of sales during the sample period.

The histogram, called a Schedule Matrix, extended over a surprisingly wide range of complexity, as indicated by the wide range of assembly labor hours required to manufacture the switchboards. (Excluded from the assembly labor hours are the engineering hours associated with the custom design of the switchboards.) In contrast, the customer interviews suggested that relatively few customers needed the more complex and costly switchboard designs. The histogram further suggested that some customers were paying for complexity that they did not need, and were subsidizing the relatively few customers that needed the complexity. More importantly, the Schedule Matrix identified the switchboard configurations that were the least complex and the switchboard configurations that were the most complex, and identified the switchboard configurations that were the most frequent and the switchboard configurations that were the least frequent.

Due to the potential for increased margins revealed by the Schedule Matrix and the customer interviews, further investigation and analysis was directed to quantifying the actual customer needs and identifying specific switchboard configurations that could satisfy the most frequent customer needs. Customer needs were classified in terms of site specific needs, area specific needs that had to be complied with regardless of whether the customer would specify them, and general needs as revealed by the customer interviews.

Site specific needs are the needs determined by the specific building in which the switchboard is to be installed. Absent an error, the present site specific needs should be accurately specified by the architect of a building under construction. However, the site specific needs included in a customer specification may include a need to meet an expected future need. A knowledge of the switchboard product offering may help in the specification of a need to meet expected future needs at a reasonable cost. For example, if an existing switchboard does not have the space for accommodating components that could be added to increase capacity for a future need, then that future need might have to be satisfied by a possibly more expensive alternative of installing an additional switchboard in the future to accommodate the additional components.

Area specific needs include local codes and standards, and local utility requirements. The switchboard supplier should know the intended site of a switchboard, and avoid the assembly of a switchboard that cannot possibly comply with a local code or standard or local utility requirement at the intended site.

Considerable effort was devoted to negotiating with the local utilities for approval of new standard designs and variances of requirements that would otherwise require custom design. Negotiation was conducted with utilities in an attempt to further standardize requirements for utility compartment isolation, compartment window requirements, compartment brackets, bus bar type and spacing for connection to the compartment, utility compartment sealing means, potential tap connection and mounting requirements, insulating barriers, and approval of ground fault protection devices. For example, some local utility requirements prohibit any electrical power take-off connections from being made ahead of the mains disconnection device. This requirement is intended to address the safety concern of creating an electrical shock hazard when a human operator would otherwise believe that power has been disconnected by manually opening the mains disconnection device. However, this requirement interferes with a mains disconnection device having automatic ground fault protection. When a mains disconnection device has automatic ground fault protection, it is desirable to provide a pilot light powered from a take-off connection ahead of the mains disconnection device so as to indicate to the operator that the main protection device opened due to ground fault. Without this indication, an operator might reclose the main into a possible faulted condition before trying to determine the cause of the faulted condition and taking corrective action. A variance has been granted for this situation when all exposed, live parts ahead of the main disconnection device are barriered and warning labels are present.

General customer needs included the occasional need for immediate delivery, the customer demand or willingness to pay for short lead-time, and the ability to satisfy most customer needs with a limited number of basic switchboard configurations. Such general customer needs were quantified by analysis of customer records of about 1,000 past orders and requests for special service.

The need for immediate delivery occasionally resulted from an erroneous customer specification of a site-specific need, when it is found that a switchboard delivered to the building site cannot be installed because it will not satisfy the actual site-specific need. Because delay in installation may delay completion of construction or use of the building, the need for an immediate replacement switchboard may be very acute. The need for immediate delivery may also result from destruction or serious damage to a switchboard at the building site or during delivery of a switchboard to the building site.

Customers may be more or less willing to pay for short lead time depending on the amount of time between the placement of an order and the time that the switchboard should be installed according to a construction schedule. If a building contractor discovers that an order has not been placed or was erroneous shortly before the time that the switchboard is to be installed, then the contractor may be very willing to pay for a short lead-time in order to avoid a penalty for construction delays.

The ability to satisfy most customer needs with a limited number of basic switchboard configurations was a rather complex task. It involved identifying the more frequent and less complex switchboard configurations expressed by the Schedule Matrix, grouping the more frequent and less complex switchboard configurations in terms of standard configuration classes, and deciding how many of the standard configuration classes should be supported as standard product assemblies. If a customer's actual needs could not be satisfied with a switchboard assembled from a standard configuration class, then the customer's actual needs would be satisfied by custom design and assembly of a switchboard. However, the Schedule Matrix was not the sole source of information for standardizing the more frequent and less complex switchboard configurations, since the Schedule Matrix only expressed the customer needs as perceived by the customers and expressed in the customer specifications. Instead, the more frequent and less complex switchboard configurations were also standardized with an understanding of area-specific needs, and an understanding of how components can be physically assembled to make switchboards that will satisfy the customer's actual needs. Classes of switchboard sections of functional equivalence were identified. Switchboard sections within a class of functional equivalence were interchangeable but not identical. Most of the switchboard sections could be freely combined to form a switchboard. Each class of switchboard sections provided one of three major switchboard functions: utility metering, main devices, and branch or distribution breakers. It was estimated that the actual needs of at least 80% of the customers should be satisfied using 300 standard switchboard sections, and the 300 switchboard sections could be organized into nineteen classes. The remaining customers would get custom-designed switchboards. The 80% figure resulted from a heuristic process. Below about 75% there would be too much custom design, and above about 85% there would be too many classes and standard sections and associated investment in manufacturing capabilities.

The desired percentage figure in the general case would depend on business reasons, such as the customer demand for custom features, the cost of custom design and production, and the cost of supporting additional standard product designs in the standard design and production process. In any case, the percentage figure that will be obtained in practice can be adjusted upward or downward by including more or less groupings of customers, and their corresponding standard product designs, in the standard design and production process or in the custom design and production process.

The nineteen standard switchboard classes were the following:

1) full height empty section;

2) full height utility hot sequence (meter is always hot and main device follows);

3) full height utility cold sequence (meter follows main device);

4) full height empty section with through bus and lugs;

5) full height main circuit breakers;

6) full height main fuses;

7) full height distribution breakers 2,000 Amps.;

8) full height distribution breakers 3,000 Amps.;

9) full height distribution fuses;

10) combination half height main circuit breakers and half height main circuit breakers;

11) combination half height main fuses and half height main fuses;

12) combination half height main circuit breakers and half height distribution breakers;

13) combination half height main fuses and half height distribution breakers;

14) combination half height main circuit breakers and half height distribution fuses;

15) combination half height main fuses and half height distribution fuses;

16) combination half height utility (hot sequence) and half height main circuit breakers;

17) combination half height utility (hot sequence) and half height main fuses;

18) combination half height utility (cold sequence) and half height main circuit breakers;

19) combination half height utility (cold sequence) and half height main fuses.

The full and half-height utility, main, and distribution circuits in these nineteen standard switchboard configuration classes themselves are comprised of standard parts and have a limited range of attributes. Major components used in the standard switchboards, such as utility compartments, were themselves standardized, which involved reducing the number of such standard components and modifying the standard components to have a wider range of applicability. A standard switchboard, for example, will have a continuous current capacity of no more than 4000 Amps, a maximum voltage rating of 480 Vac, a short circuit current rating (SCCR) of no more than 200 kA, and an aluminum or copper bus. The metal box of a standard switchboard can be a NEMA type 1 enclosure or a NEMA type 3R non-walk-in enclosure. A standard switchboard can have fixed individually mounted mains with thermal magnetic (M or P) breakers, micrologic (M, P, or SE) breakers, or fusible (BP) protection; fixed individually mounted (M, P or BP) feeders; and group mounted mains or feeders with thermal magnetic (F, K, L, M, or N) breakers, micrologic (L, M, or N) breakers, or fusible (QMJ or QMB) protection. Where permitted by utility and local codes, a standard switchboard can have auxiliary switches (1A and 1B), a 120 Vac shunt trip, short time and ground fault (GF pit) protection, trip indicators or a local current ammeter, a power meter, a circuit monitor, a pull box, or an auxiliary section. It now appears that these nineteen standard switchboard configuration classes and the use of standard components can satisfy at least 80% of the customer orders.

Switchboards for automatic power transfer systems are examples of switchboards that cannot be designed from the standard switchboard configuration classes. For a highly critical power application, for example in a hospital, there is an on-site back-up generator. If the utility power supply fails, then the back-up generator starts automatically, the utility lines are switched out, and the back-up generator is switched into the building power distribution circuits. A microprocessor is programmed to monitor the power fed to the distribution circuits and the voltage of the utility lines and the back-up generator, and the microprocessor automatically decides when to switch over between the utility lines and the back-up generator. Such automatic transfer systems are highly complex and typically very site specific.

The selection of the set of standard switchboard configuration classes will in effect redefine the Schedule Matrix and the cost and lead-time for supplying a configuration that is required to satisfy a customer's actual needs. Although a basic objective was to reduce the cost and lead-time associated with any order that could be satisfied, there is also an advantage that the shape of the redefined Schedule Matrix will more closely match the histogram of the customer's actual need for complexity. In order to make pricing decisions, estimates of value and cost were made for everything provided to the customer, including the switchboard product and related components installed or likely to be installed in the switchboard, timeliness of delivery of the product, drawings and documentation, service, and spare parts. The pricing chosen for the various possible switchboard configurations was more fairly based on the actual customer demand for each possible switchboard configuration and the cost of supplying each possible switchboard configuration. This pricing scheme for the various possible switchboard configurations is an effective mechanism for customers to re-evaluate what their actual needs are on the basis of both the perceived value and the associated cost for such needs.

Figure 5:
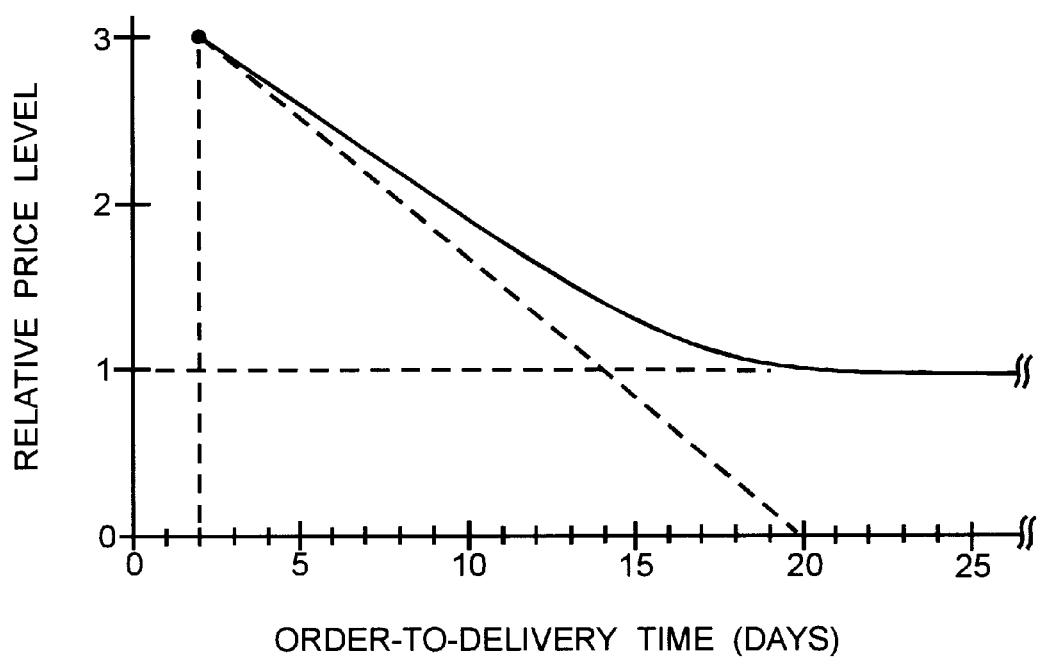
FIG. 5 is a sample graph of the relative price level versus the time in days from the time that an order is taken to the time that the switchboard is to be delivered.

FIG. 5, for example, shows a sample graph of the relative price level versus the time in days from the time that an order is taken to the time that the switchboard is to be delivered. The relative price level function corresponds to the premium that an average customer should be quoted for quick delivery time. The relative price level is set by two characteristic parameters. The first parameter is the value of the premium for a one-day delivery time. A one-day delivery time is the minimum guaranteed delivery time for a standard switchboard. A value of three is an approximation of what an average customer should be willing to pay without detriment to the customer relationship. The second parameter is the minimum delivery time for which there should be no premium. This parameter is set by the usual delivery time in the industry. A value of twenty days represents a delivery time that the competition would supply without a premium. In practice, most switchboard sales are negotiated based on the present circumstances of the customer, the supplier, and the competition, so that the relative price level function for quick delivery is only one of a number of factors considered by a sales engineer when formulating a price quotation for a switchboard. In general, each market may have a different relative price level function.

Once the new production and sales methodology has been rolled out to all sales regions and in use for about six months, statistics regarding on-time delivery will be used to establish a delivery guarantee similar to that now used by express package delivery services. If a custom switchboard is not delivered by the customer-specified "on-site date," then the customer will get a credit for each day after the "on-site" date until the switchboard is delivered. The delivery statistics will be used to set the amount of the credit to ensure a reasonable cost for the delivery guarantee.

Figure 6:
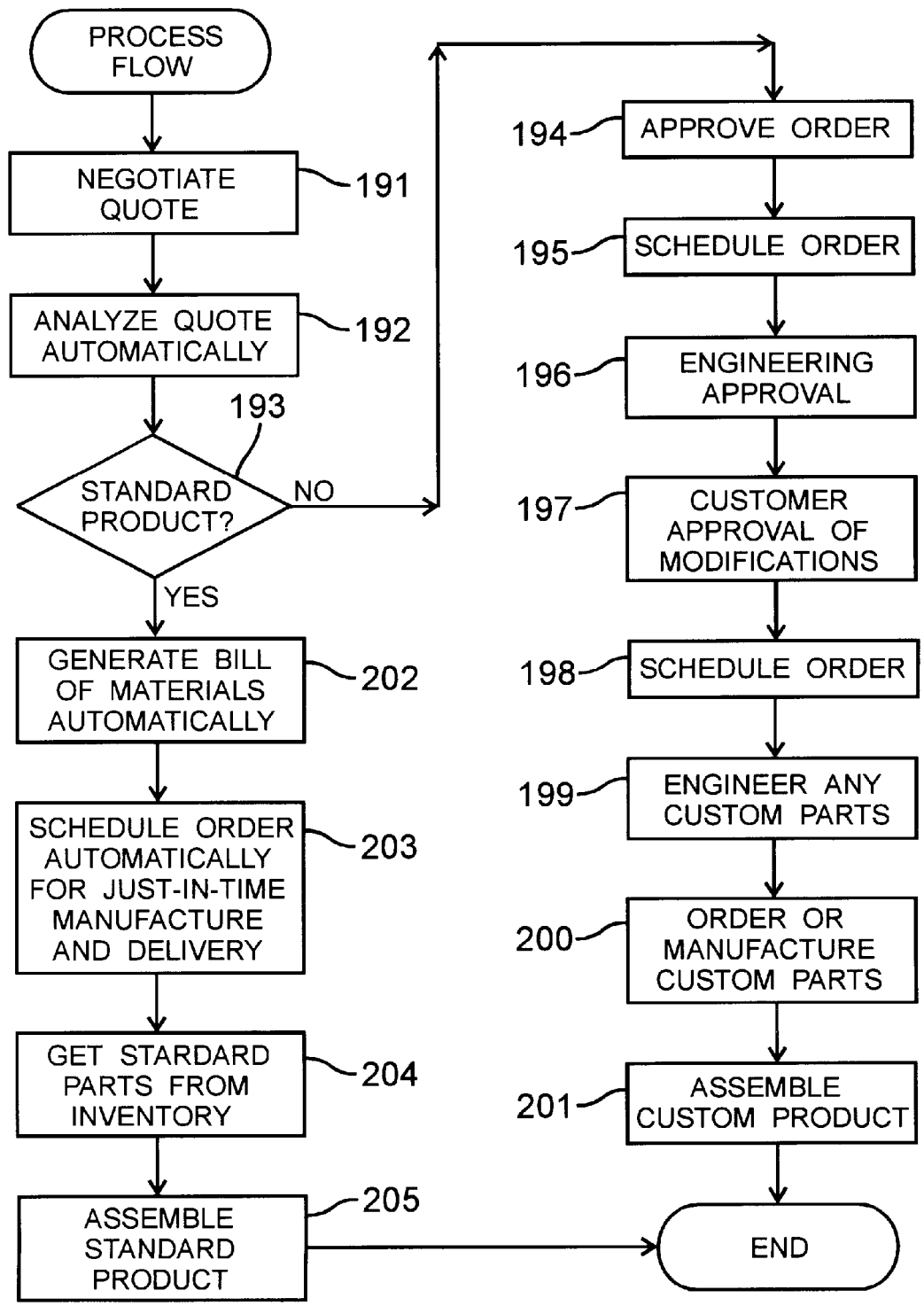
FIG. 6 is a flowchart of the design process flow for sales and manufacturing of standard and custom switchboards.

It was decided that manufacturing and inventory control for standard switchboards would be separated from manufacturing and inventory control for custom switchboards. The order processing, manufacturing, and inventory control for standard switchboards would be fully automated and given priority over custom switchboards. The plant layout and assembly process would be optimized for production of the standard switchboards. The resulting design process flow is shown in FIG. 6.

In the first step 191, a sales engineer works with a customer to negotiate a quote. The sales engineer can use conventional tools such as a product catalog and order forms, or the sale engineer can use computer-based tools such as a product selector. Then in step 192 the quote is analyzed automatically, using a computer-based tool.

If the analysis in step 192 indicates that the quote is not for a standard product, then the process flow branches from step 193 to step 194 to the start of a conventional order processing flow. In step 194, the order is checked, clarified, classified, and approved for further processing.

Then in step 195, the order is scheduled for engineering approval. In step 196, an order engineer determines whether or not a product in conformance with the order can be manufactured. The order engineer either approves the order as it is, or modifies the order for approval. In step 197, the customer approves any modifications to the order. In step 198, the order is scheduled for manufacture. In step 199, any custom parts are engineered. In step 200, the custom parts are ordered or manufactured. In step 201, the custom product is manufactured.

If in step 193 the automatic analysis of the order determines that the product is standard, then execution continues to step 202. In step 202, a bill of materials is generated automatically. In step 203, the order is scheduled automatically for just-in-time manufacture and delivery. In step 204 the required standard parts are obtained from inventory, and in step 205 the standard product is assembled from the standard parts.

Figure 7:
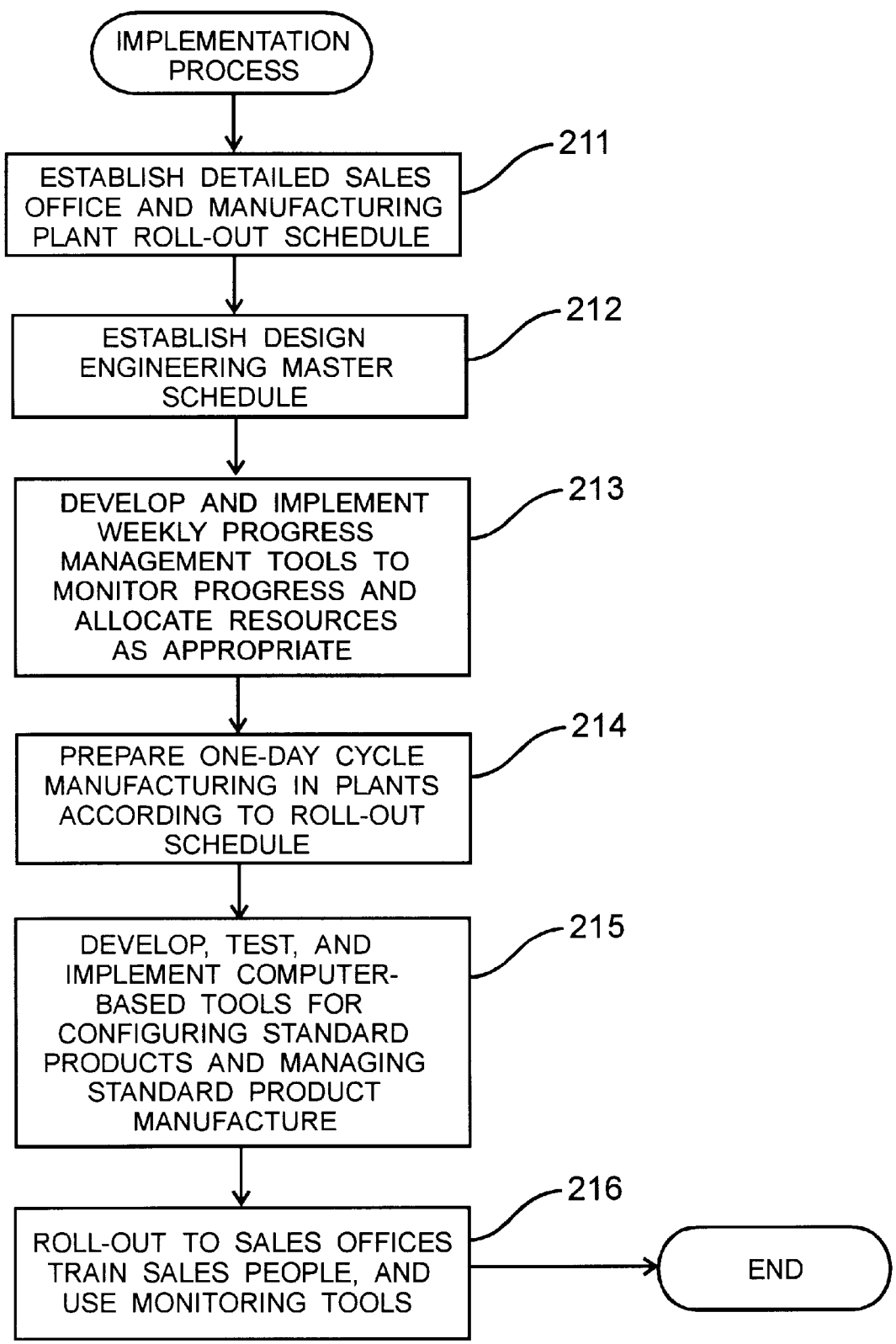
FIG. 7 is shown a flow chart of management tasks for implementing the new sales and manufacturing process flow of FIG. 6.

Referring now to FIG. 7, there is shown a flow chart of the management tasks that were performed at Square D Co. in order to implement the new sales and manufacturing process flow of FIG. 6. In the first step 211 of FIG. 7, management established a detailed sales office and manufacturing plant roll-out schedule for implementation of the new switchboard sales and production methodology. Since four manufacturing plants and about 150 sales offices were involved, management recognized that the sales offices and manufacturing plants should not be switched over all at once to the new methodology. Instead, the sales offices and manufacturing plants were grouped by geographic region related to utility and local codes, and the geographic regions were switched over one-by-one in a sequence, starting with the regions that would offer the most cost savings in the least amount of time. The roll-out at each region was subdivided into adaptation, installation, training, and implementation stages, and was spread out over the sales offices in each region.

In step 212, management established a design engineering master schedule that would plan the changes in the engineering design center procedures necessary to support the sales office and manufacturing plant roll-out schedule. The required engineering design activities were identified and grouped into project stages, each stage being two to three months in duration to facilitate day-to-day management of the engineering design centers.

In step 213, management developed and implemented weekly progress management tools to monitor progress and allocate resources as appropriate for implementing the roll-out schedule. Challenges appropriate for each region were identified and tools and procedures were adapted to meet those challenges. For example, for each region the standardized utility compartment of the switchboard had to be approved for compliance with the utility and local codes. Weekly progress management tools in the form of spread sheets were developed and implemented to monitor progress and allocate resources as appropriate.

An example of such a spread sheet is shown in FIG. 8, which indicates the switchboard project status as of Jun. 6, 1997. A right-most column for comments in this spreadsheet has been omitted because the spreadsheet would otherwise be too large to show in one figure. A comment associated with a row or sub-project in the spreadsheet may indicate the activity currently being done for the sub-project. For example, a comment associated with the sub-project "SW 164 Public Service B & G" would be: "2K UCT assys complete, 3K parts complete, 3K assys 95% complete, 4K layouts continuing". For the sub-project that have been 100% completed, the comment would say: "All records to Records Group."

Returning to FIG. 7, in step 214, management prepared for a one-day manufacturing cycle for the production of standard switchboards. For example, if the customer needed a standard switchboard in twenty-five days, then assembly of the switchboard would be begun in twenty-four days for a just-in-time delivery to the customer. Sufficient plant capacity was provided to serve all important customers. The plant capacity was managed for flexible output. The manufacturing processes for the standard switchboards were maintained completely separate from the manufacturing processes for the complex, custom-designed switchboards. Cataloging of the custom switchboard designs would be desirable and will be implemented soon. For leverage, engineering resources were all relocated to the manufacturing plants. As needed, the engineers were focused on customer issues for order engineering, on product issues for design engineering, or on manufacturing issues for manufacturing engineering.

Figure 9:
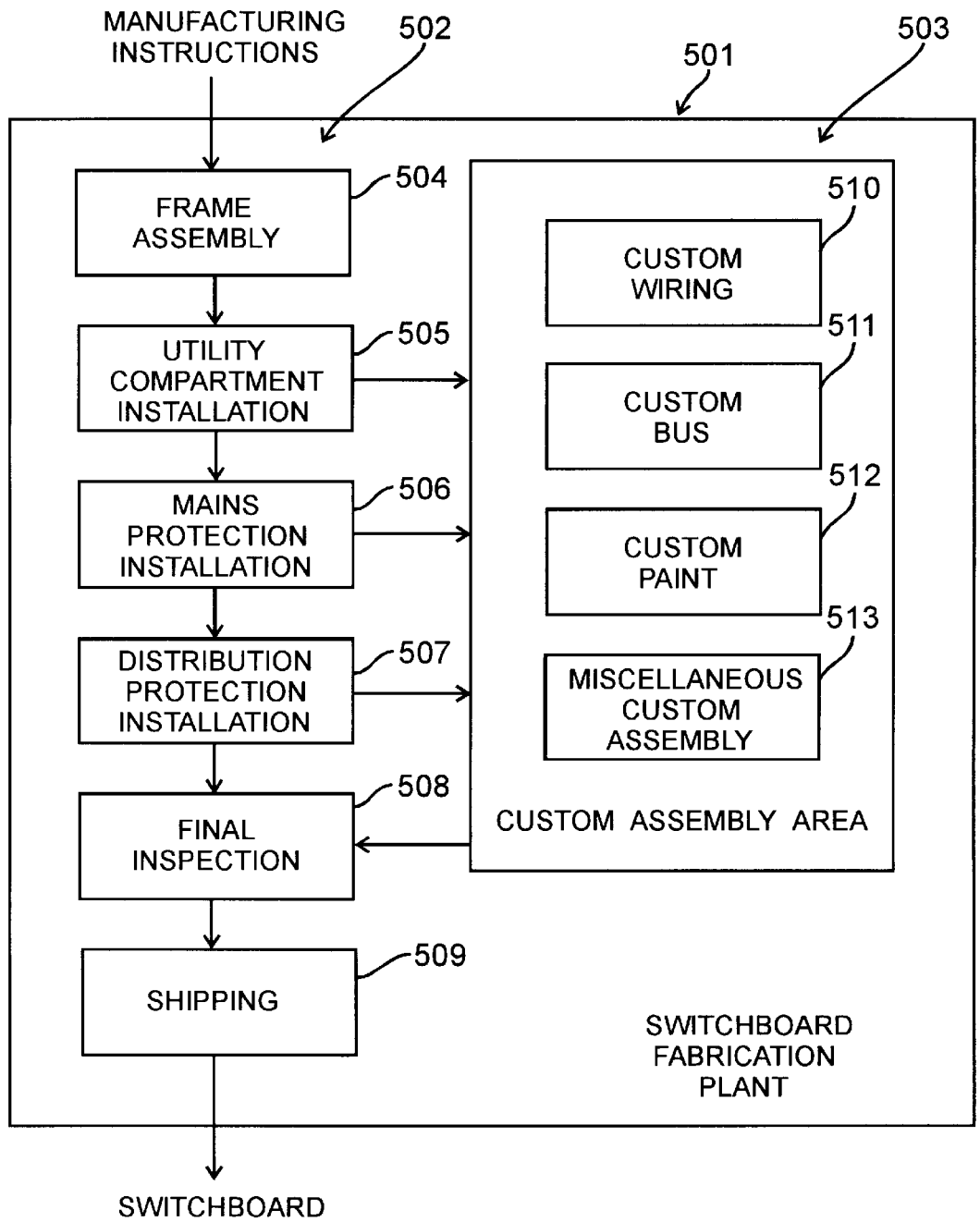
FIG. 9 is a schematic diagram of a layout for a switchboard fabrication plant optimized for assembly and quick delivery of standard switchboards and for assembly of custom switchboards using as many standard components as possible.

Referring to FIG. 9, there is shown a diagram of the plant layout optimized for assembly and quick delivery of the standard switchboards. The floor space of the switchboard fabrication plant 501 is divided almost equally into an assembly line 502 and a custom assembly area 503. Although only about 20% of the switchboards ever enter the custom assembly area 503, the custom assembly area has about the same floor space as the assembly line 502 because the switchboards move through the custom assembly area about four times slower than they move through the assembly line 502. For example, standard switchboards will pass through the assembly line 502 in about a few hours to no more than one day, but custom switchboards will pass through the custom assembly area 503 in a few hours to a few days and up to a week or more.

The assembly line 502 has six stations, including a frame assembly station 504, a utility compartment installation station 505, a mains protection installation station 506, a distribution protection installation station 507, a final inspection station 508, and a shipping station 509. In the frame assembly station 504, a switchboard frame is assembled for each switchboard in accordance with the switchboard manufacturing instructions. The frame includes enclosures for one or more switchboard sections to be included in the standard or custom switchboards. When assembly of the frame is finished, a set of wheels are snapped onto the back of the frame, the frame is laid on its back, and the frame, in a horizontal orientation, is rolled on down the assembly line A standard switchboard frame will be rolled along the assembly line past or through all of the intermediate installation stations 505, 506, and 507 until reaching the final inspection station 508, where the wheels are taken off. If a utility compartment needs to be installed in the switchboard, then the frame will stay in the utility compartment installation station 505 for a while, minutes to a couple of hours, until installation of the utility compartment is done. If mains protection components need to be installed in the switchboard, then the frame will stay in the mains protection station for minutes to a couple of hours, until installation of the mains protection components is done, If distribution or branch circuit protection components need to be installed in the switchboard, then the frame will stay in the distribution protection station for minutes to a couple of hours, until installation of the distribution or branch circuit protection components is done.

A custom switchboard will also be rolled along the assembly line 502 but may stay in one or more of the intermediate stations for a shorter period of time to install any standard components needed in the custom switchboard, and in the last intermediate station where the last of the standard components are installed, the custom switchboard will be diverted to the custom assembly area 503 to complete the assembly of the custom switchboard. Once custom assembly is completed, the custom switchboard passes from the custom assembly area 503 to the final inspection station 508 of the assembly line 502. For example, if there are no standard distribution or branch components needed in the custom switchboard but the custom switchboard needs standard utility components and standard mains protection components, then the frame for the custom switchboard will pass from the frame assembly station 504 to the utility compartment station 505 where the standard utility components are installed, and then from the utility compartment station 505 to the mains protection installation station 506 where the standard mains protection components are installed, and then from the mains protection station 506 to the custom assembly area 503, and then from the custom assembly area 503 to the final inspection station 508.

In the final inspection station 508, the standard or custom switchboard is tested by applying test voltages to the switchboard busses and measuring leakage currents, and also by testing any power monitoring or logging functions of the switchboard. The same test equipment is used for testing custom and standard switchboards, because the test equipment is relatively expensive and the testing for each switchboard can be done relatively quickly, in about ten to twenty minutes. Circuit breakers need not be tested for tripping upon short or overload, because the circuit breakers are tested individually just after assembly in a separate circuit breaker manufacturing plant, before being placed into inventory for assembly into the switchboards.

In the shipping station 509, the completed custom or standard switchboard is wrapped, labeled, and shipped to the customer-specified destination.

The custom assembly area 503 includes a custom wiring station 510 for installation of custom wiring, a custom bus station 511 for installation of custom busses, a custom paint station 512 for custom painting, and a miscellaneous custom assembly station 513 for installation of any other custom modules or components. The standard paint color, used for example on the switchboard frame and external enclosure panels, is grey, and in the custom paint station, any other color (such as green or yellow) is painted over the standard grey color.

Returning to FIG. 7, in step 215, computer-based tools were developed, tested, and implemented for configuring the standard switchboards and managing the standard product manufacturing (in accordance with the process flow steps 191, 192, 193, 202, and 203 of FIG. 6). These computer-based tools will be further described below.

Finally, in step 216, the roll-out schedule was implemented in the sales offices. A group of product specialists, trainers and production managers traveled among the various regions and among the sales offices in each region to install the new tools, train the sales force and order engineers, and manage the changes in the switchboard production process for assembly of the nineteen basic switchboard configurations. Their progress was monitored and reported to management by the spread-sheet tools. For example, an action plan was implemented at each field office. In general, each action plan had six basic activities, including a better contractor focus, distributor focus, strategic pricing, capability training, measurements, and employee communication and incentives.

The contractor focus was directed to identifying a group of the "highest potential" customers. For example, the top 200 customers by potential revenue in the region were identified, and out of the top 200, 100 customers were identified by considering different factors such as the number of engineers on the customer's staff and any indication of customer loyalty. Each Square D Co. sales engineer was assigned exclusive responsibility for ensuring total customer satisfaction of a group of about a dozen of these most attractive customers.

The distributor focus involved communicating the new sales and production methodology and its benefits to all distributors serviced by the field office. The distributor sales people who would be actually selling the standard switchboards were identified, and an education and training plan was prepared for the appropriate sales people.

The strategic pricing involved developing a specific relative price level vs. delivery function (e.g., the function discussed above with reference to FIG. 5) for the region serviced by the field office, and developing qualitative guidelines for negotiating bids based on this function. During the introduction of the new switchboard sales and production methodology, corporate management reviewed each bid to ensure that orders would not be lost if the guidelines were followed.

The capability training involved the training of sales engineers to use the new switchboard sales and production methodology for creating and extracting customer value. This training focused on value engineering and how to manage customer accounts for total customer satisfaction.

The measurements involved identifying field office specific measurements and measurements that would be reported only during the introduction phase, in order to supplement the measurement tools that would be applicable to once the new switchboard sales and production methodology were installed and fully implemented. After the introduction, management will continue to closely monitor the percentage of switchboard orders supplied by the standard switchboards, and the profitability of the standard and custom design switchboards.

The employee communication and incentives involved meetings of the corporate switchboard project representative with individual field office managers, and a switchboard project implementation board at each field office. Management announced that incentives and prizes would be awarded to sales engineers for the first shipment of a standard switchboard, the highest monthly volume, and the highest monthly price multiplier.

Once the standard switchboard classes were determined, a switchboard configuration computer program module was designed for the order entry system in order to determine whether a customer specification could be satisfied by standard switchboard sections, and if not, to warn the sales engineer of a penalty associated with the required custom assembly, and to indicate why the specification could not be met by a standard switchboard. (Once a wider range of the Square D Co. product line has been standardized, it is envisioned that the switchboard configuration computer program module will be further programmed to suggest modifications to the customer specification that would permit the specifications to be satisfied by standard switchboard sections.) If the customer specification could be satisfied by one of the standard switchboard configuration classes, then the switchboard configuration module generated a specific switchboard design to meet the customer specifications, including an assembly drawing and bill of materials (sometimes referred to as a BOM) for the specific switchboard design. The switchboard product configuration module can generate about 300 switchboard configurations from the nineteen standard configuration classes.

Figure 10:
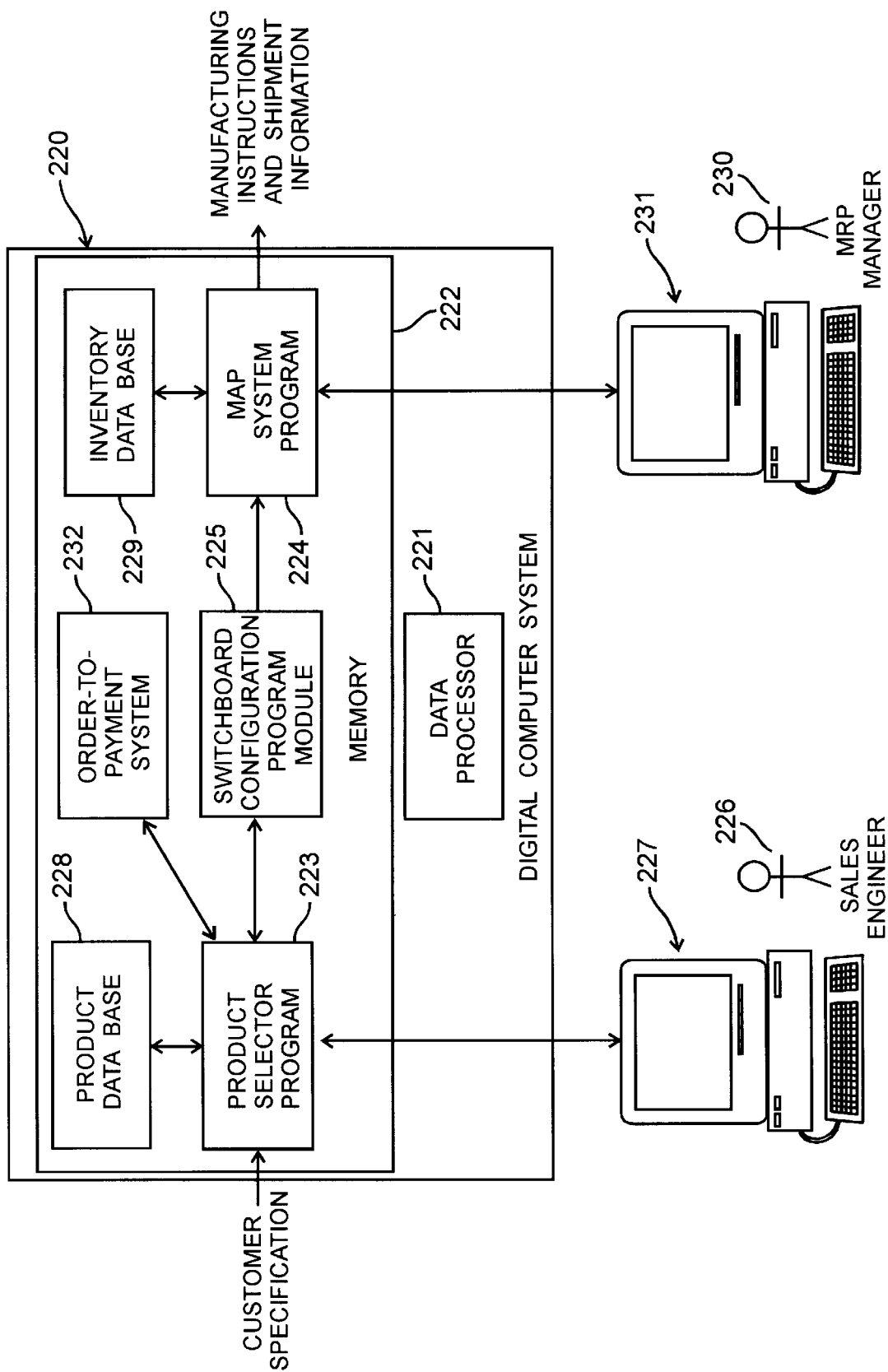
FIG. 10 is a block diagram of a digital computer system for automatically designing a standard switchboard in accordance with customer specifications.

Referring to FIG. 10, the switchboard configuration program module 225 is used in a digital computer system 220 including a data processor 221 and a memory 222. The switchboard configuration program module 225 can act as an intermediary between a product selector program 223 and a MRP system program 224.

The product selector program 223 is accessed by a sales engineer at a computer terminal 227 to obtain a quote or to place an order. The product selector program 223 accesses a product database 228, including questions and valid answers about products that can be quoted or ordered. Specified features or components can either be locked out of a quote or order, or included in a quote or order that is validated. If the specified features or components are valid in a standard switchboard, the product selector program invokes the switchboard configuration program module to design a standard switchboard including the specified features or components. This standard switchboard design is the basis for either a quote or a list of components and manufacturing instructions for an order. The list of components and manufacturing instructions is passed to the MRP system program 224.

The MRP system program manages an inventory data base 229 and schedules the ordering of parts and the timing of manufacturing operations. The status of the parts inventory and the schedule for manufacturing operations can be reviewed by a MRP manager 230 at a computer terminal 231. The digital computer system 220 also is programmed with an order-to-payment system 232 that manages and automates all order entry, billing, invoicing, and shipping information processing for all standard as well as custom switchboard orders. The digital computer system 220 provides seamless integration of the order-to-payment functions with the functions of the product selector 223, the switchboard configuration program module 225, and the MRP system program 224.

Figure 11:
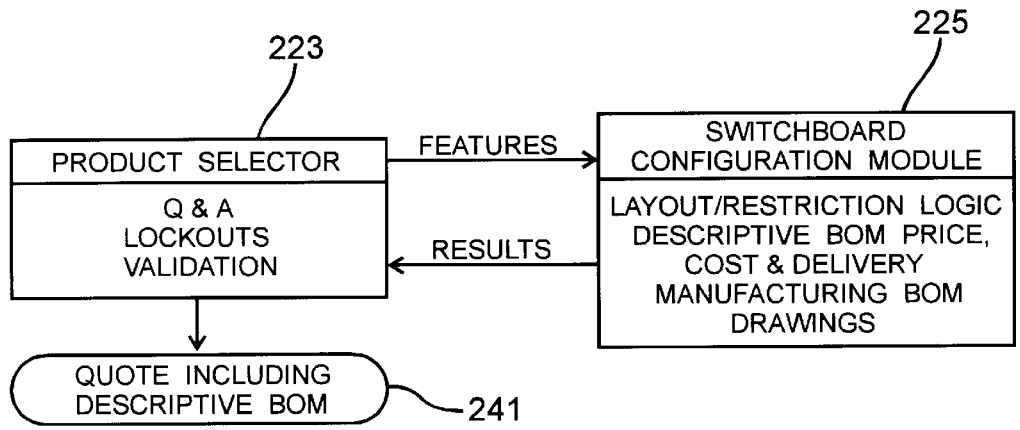
FIG. 11 is a flow diagram showing the use of a switchboard configuration module introduced in FIG. 10 for producing a quotation for a standard switchboard.

Referring to FIG. 11, the product selector 223 and the switchboard configuration module 225 are shown being used to generate a quote. The product selector 223 passes a list of standard features to the switchboard configuration module 225. The switchboard configuration module applies layout and restriction logic to design a standard switchboard by selecting and arranging a set of compatible modules, components and parts that provide the specified features. The selected modules and components are indicated in a descriptive BOM and in a manufacturing BOM. The manufacturing BOM, however, further includes parts used for electrical and mechanical connections between the modules and components. The switchboard configuration module determines the price, cost, and delivery time for the switchboard from the cost and availability of the required modules, components, and parts. The switchboard configuration module automatically generates a set of schematic drawings including various views of the switchboard, a wiring diagram, and a table including a row of information for each module or component in the switchboard.

The results produced by the switchboard configuration module 225 are passed back to the product selector and used to prepare a quote 241 for the manufacture and delivery of a switchboard including the items in the descriptive BOM. The descriptive BOM is included in the quote to a customer. Although the corresponding manufacturing BOM typically would not be included in the quote, the switchboard to be delivered for the quoted price would include the additional parts in the manufacturing BOM that are needed to interconnect the components and modules mentioned in the descriptive BOM.

Figure 12:
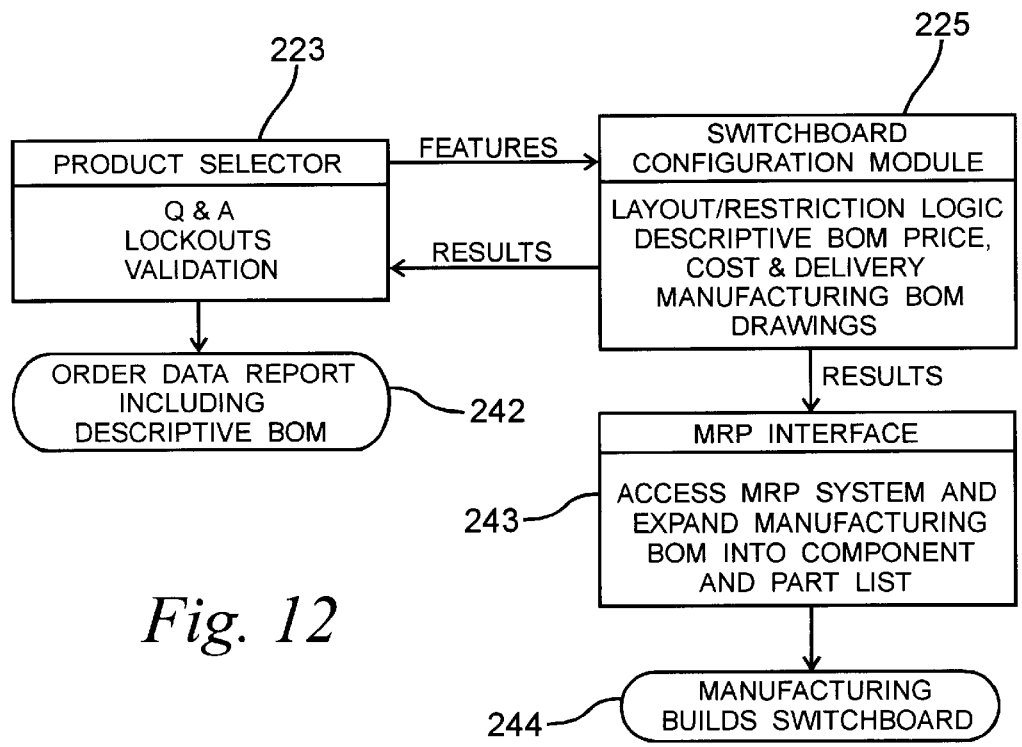
FIG. 12 is a flow diagram showing the use of the switchboard configuration module of FIG. 10 for producing an order including manufacturing instructions for a standard switchboard.

Referring to FIG. 12, the product selector 223 and the switchboard configuration module 225 are shown being used to generate an order. Initially, the product selector 223 and the switchboard configuration module 225 perform the same functions as they performed for generating a quote. The product selector produces an order data report 242 that is very similar to a quote. However, the switchboard configuration module performs an additional function of invoking an MRP interface program or subroutine 243 that accesses the MRP system and expands the manufacturing BOM into a component and parts list including all of the individual items that are inventoried and used up in the manufacture of the switchboard. The MRP system uses this component and part list to ensure that the items required for the assembly of the switchboard will be available at the scheduled time of assembly 244.

The switchboard product selector asks the sales engineer a predetermined series of questions about a switchboard to be specified during an interactive session. For example, the sales engineer is asked to specify ampacity, voltage rating, copper or aluminum bus, incoming feed direction, enclosure type, fuses or breakers for mains and distribution or branch circuits, and types of fuses or breakers. There is a valid set of answers to each question. If the sales engineer does not supply a valid answer to a question, or responds with no answer, the system will supply the set of valid answers for the question. The sales engineer can request further information about each valid answer.

The first question, "Type of Line-up?", can be answered "QED-S", which invokes the switchboard configuration module. The switchboard configuration module checks that the system ampacity is no more than 4000 Amps; if not, then the sales engineer is warned that a standard switchboard can have no more than 4000 Amps. The switchboard configuration module checks that the system voltage is no more than 480 Vac; if not, then the sales engineer is warned that a standard switchboard can handle no more than 480 Vac. In a similar fashion, the switchboard configuration module checks for the other limitations of a standard switchboard, including any optional features precluded by utility and local codes, and warns the order engineer if a standard switchboard cannot satisfy the requirements. There is also a consistency check of all of the answers, because not all combinations are possible or meaningful, as will be further described below. The switchboard product selector can also process information from a filled-in order form, which is essentially a list of the same questions and selected multiple-choice answers to the questions. For example, the questions and permissible answers for the standard switchboard product are shown in TABLE I at the end of this specification. The questions and answers are shown as they would appear on an order form, together with columns for performing price calculations.

Figure 13A:
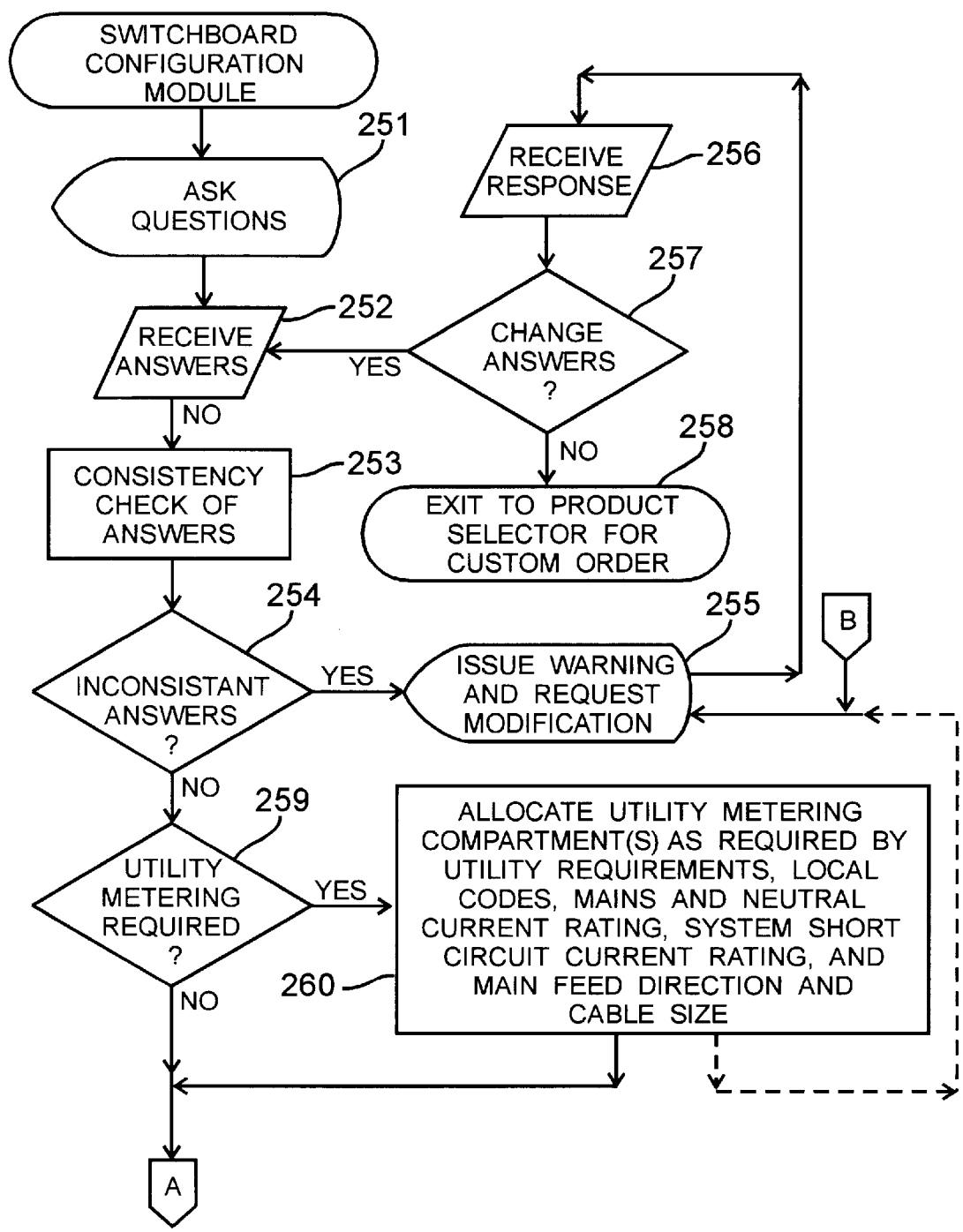
FIG. 13A is a first portion of a flowchart of the switchboard configuration module of FIG. 10.

Referring to FIG. 13A, there is shown a flowchart of the switchboard configuration module. The switchboard configuration module attempts to match the utility metering, mains protection, and current distribution requirements to the nineteen classes of standard switchboard configuration classes. The switchboard configuration module may automatically design from one to three or more standard switchboard sections during processing of a single order. If more than one standard switchboard section is included in a single switchboard, then the switchboard sections will be linked together by a through-bus connection so that power flows from a utility metering compartment to a mains protection compartment and from the mains protection compartment to a branch or distribution protection compartment.

In a first step 251, the switchboard configuration module asks the questions indicated in Appendix I about the desired switchboard specifications. In step 252, the switchboard configuration module receives the answers. In step 253, the switchboard configuration module performs a check for consistency among the answers. For example, specified components must be consistent with the specified system voltage, the specified utility company, and the local codes at a specified delivery site.

The main and neutral ampacity and short circuit current rating, and the ampacity and short circuit current rating of the main protection devices, must also be sufficient for the current to be supplied to the branch protection devices and to the branch or distribution circuits. The switchboard configuration module checks constraints on the total current drawn by the branch or distribution circuits, by adding up the current from each of the branch or distribution circuits, adjusting the total current using NEMA adjustment formulas that take into consideration the fact that multiple branch or distribution circuits are typically not all in use at the same time, and comparing the sum to the total current constraint. This method of calculating the permissible ampacity of the section or supply bus to a number of branch circuits is known as "diversity." In general, the permissible ampacity of the section or supply bus is given by the following table:

| Number of branch circuit overcurrent protection devices supplied | Percentage of the sum of the ratings |
| --- | --- |
| 1 | 100 |
| 2–3 | 80 |
| 4–6 | 70 |
| 7–12 | 60 |
| Over 12 | 50 |

These rules and specific exceptions are well known to persons skilled in the switchboard art and are industry standards published as UL Rule 891 "Dead-Front Switchboards" (Feb. 14, 1994) p. 47, and NEMA Application Standards Section 6.4.1 "Calculation of Section Bus Ampacity" (PB2-1980) p. 20.

If the answers received in step 252 are inconsistent, then execution branches from step 254 to step 255. In step 255 the switchboard configuration module issues a warning to the sales engineer, identifies the particular inconsistency discovered, and requests modification of the answers that are inconsistent. After receiving a response in step 256, execution branches from step 257 back to step 252 to receive any new answers. If there is no change in the inconsistent answers, then execution continues from step 257 to step 258 to exit to the product selector to possibly prepare a quote for a custom switchboard design that would meet the customer's actual needs.

Once a consistent set of answers are received, the switchboard configuration module matches the answers to a set of standard designs for switchboard sections. If the answers pertinent to utility requirements, mains protection, or branch distribution cannot be met by a standard design for a switchboard section, then a warning message is produced by indicating the inconsistent requirements and referencing a corresponding section of a help file as shown in TABLE II at the end of this specification. The set of standard designs for switchboard sections, and the specifications and constraints specific to each standard design, are explained further below with reference to FIGS. 22 to 60.

In step 259, the switchboard configuration module checks whether utility metering is required. If so, execution branches from step 259 to step 260. In step 260, utility metering compartment(s) are allocated as required by utility requirements, local codes, mains and neutral current rating, system short circuit current rating, and main feed direction and cable size. The local utility, for example, typically dictates that a "hot sequence" compartment should be allocated. If a full-height utility compartment for the utility supplying power to the intended building site is needed to handle the specified system ampacity and utility metering functions, then the switchboard configuration module allocates to the order one switchboard section having a full-height utility compartment. If a half height utility compartment for the utility at the intended building site can handle the specified system ampacity and utility metering functions, then the switchboard configuration module allocates a half height utility compartment to one half of one switchboard. If it is not possible to satisfy the utility metering requirements with a standard utility section, then execution branches via the dashed line path back to step 255. Otherwise, execution continues from step 260 to step 261 in FIG. 13B. Execution also continues from step 259 to step 261 in FIG. 13B if utility metering is not required.

Figure 13B:
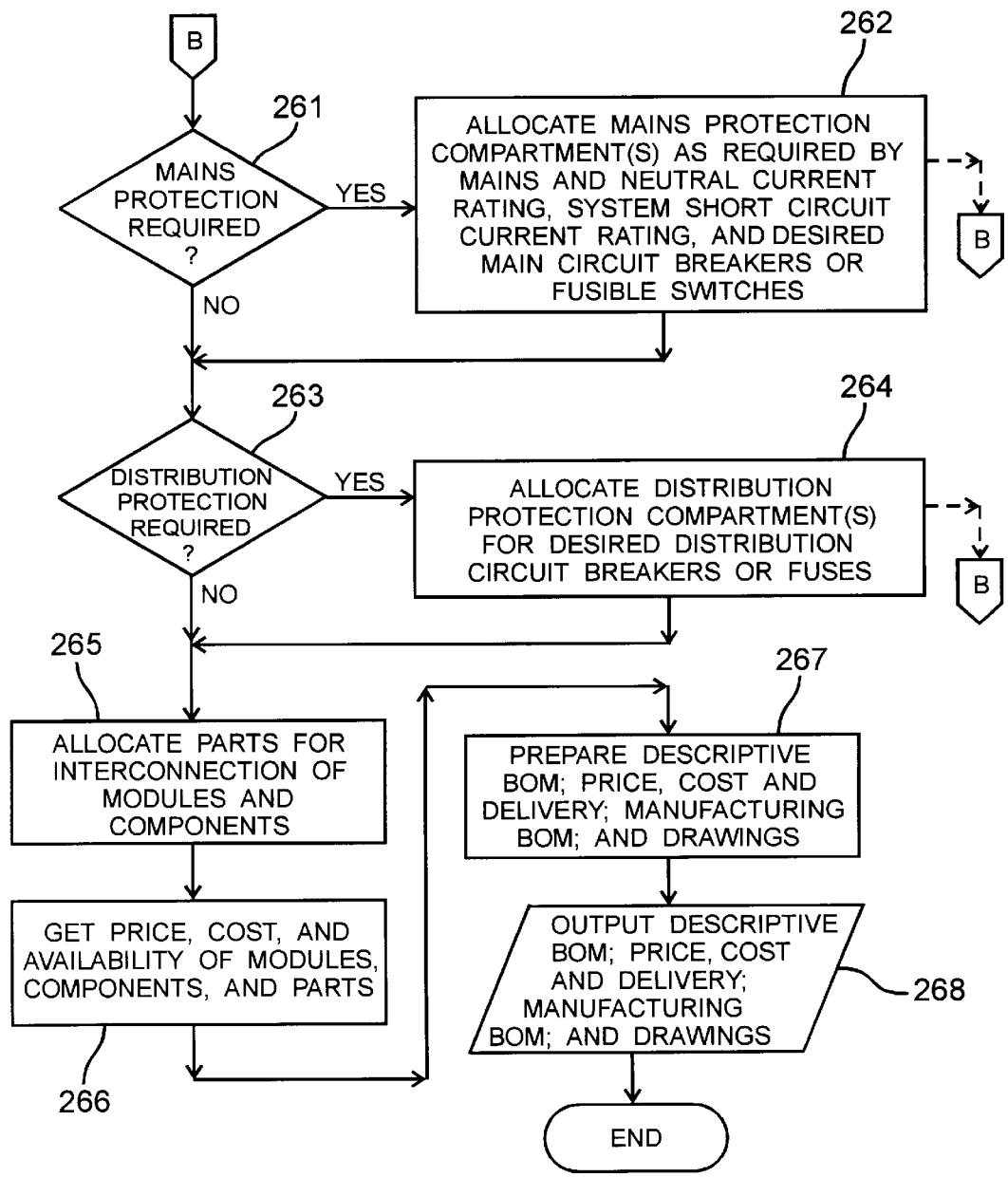
FIG. 13B is a second portion of the flowchart begun in FIG. 13A.
Figure 14:
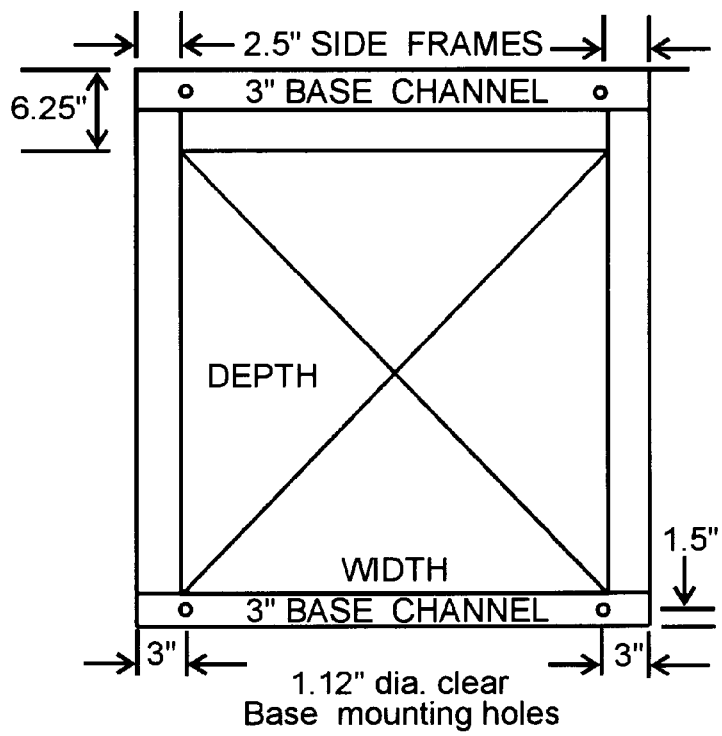
FIG. 14 is an elevation view of a mounting pad for a standard switchboard shown in FIGS. 16 to 19.
Figure 15:
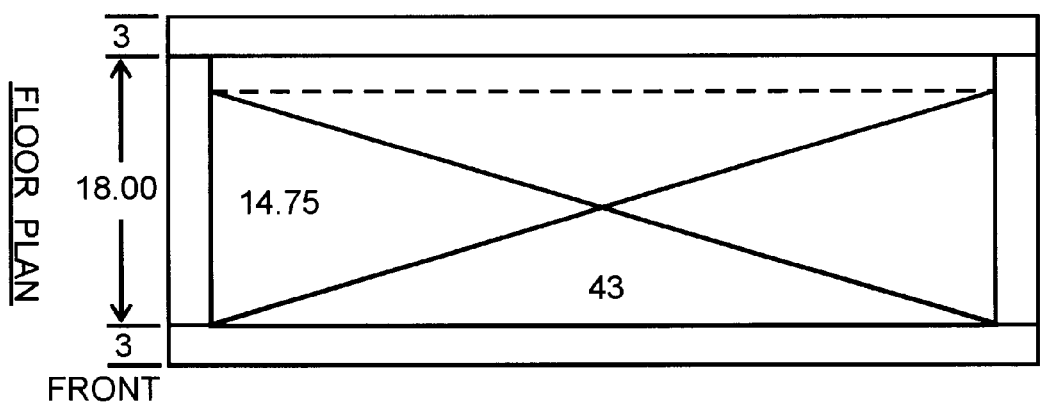
FIG. 15 is a floor plan for the standard switchboard shown in FIGS. 16 to 19.
Figure 16:
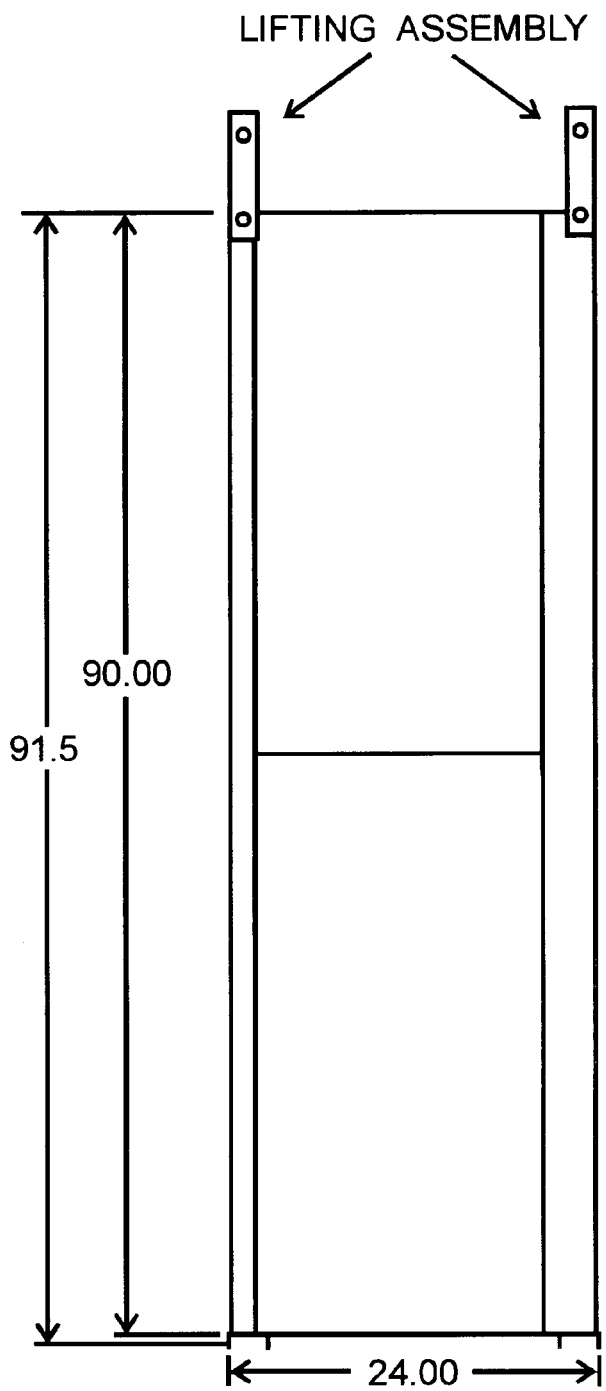
FIG. 16 is a left side view of the standard switchboard shown in FIGS. 16 to 19.

In step 261 of FIG. 13B, execution branches from step 261 to step 262 to allocate a switchboard section or half a switchboard section to mains protection devices, as required by the mains and neutral current rating, system short circuit current rating, and desired use of main circuit breakers or fusible switches. If only one half-height compartment was allocated to utility metering in a switchboard section, then the switchboard configuration module will attempt to allocate the other half of the switchboard section to any specified mains protection. Otherwise, the switchboard configuration module will attempt to allocate a standard full-height main circuit breaker or fuses if necessary, or if possible a half height main circuit breaker or fuses, in a switchboard section separate from any utility section. If it is not possible to satisfy the mains protection requirements with a standard switchboard section, then execution branches via the dashed line path and off-page connector "B" back to step 255 of FIG. 13A. Otherwise, execution continues from step 262 to step 263. Execution also continues to step 263 from step 261 if mains protection is not required.

In step 263, execution branches to step 264 to allocate a full-height or half-height branch or distribution protection compartment for the specified number of distribution circuit breakers or fuses. Depending on the number and type of the branch or distribution circuit breakers that need to be installed, the configuration module also checks a total height constraint by adding up the heights required for each of the circuit breakers and comparing the sum to the total height constraint, in order to determine whether the circuit breakers can be contained within a half-height compartment or full-height compartment. If a full-height branch or distribution protection compartment is needed, then a separate switchboard section will be allocated to contain the full-height branch or distribution protection compartment. If only a half-height branch or distribution protection compartment is needed, and if there is a free half of a switchboard allocated to a half-height mains protection compartment, then the half-height branch or distribution protection compartment will be placed in the free half of this switchboard; otherwise, one switchboard section will be allocated to contain the half-height branch or distribution protection compartment. If it is not possible to satisfy the branch or distribution circuit protection requirements with a standard switchboard section, then execution branches via the dashed line path and off-page connector "B" back to step 255 of FIG. 13A. Otherwise, execution continues to step 265. Execution also continues from step 263 to step 265 if distribution protection is not required.

In step 265, the switchboard configuration module allocates parts for the interconnection of the switchboard modules and components. Next, in step 266, the switchboard configuration module gets the current price, cost, and availability of the modules, components, and parts needed for manufacture and assembly of the switchboard. Then, in step 267, the switchboard configuration module prepares a descriptive BOM, computes a total price and cost for the switchboard, determines whether the switchboard can be delivered as needed by the customer, and prepares a set of drawings for the switchboard. Finally, in step 268, the switchboard configuration module outputs the descriptive BOM; the price, cost, and delivery information; the manufacturing BOM; and the drawings for the switchboard.

Figure 20:
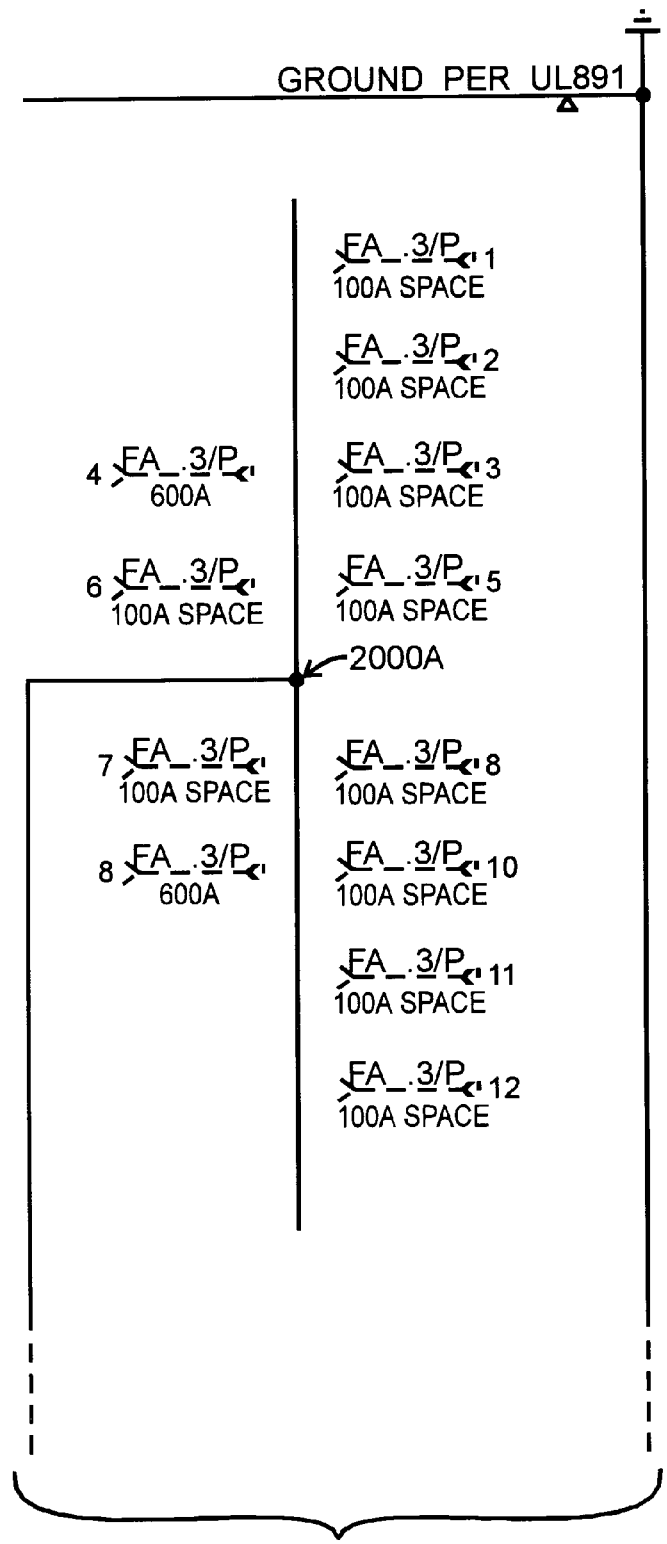
FIG. 20 is a top half of a wiring diagram for the standard switchboard shown in FIGS. 16 to 19.
Figure 21:
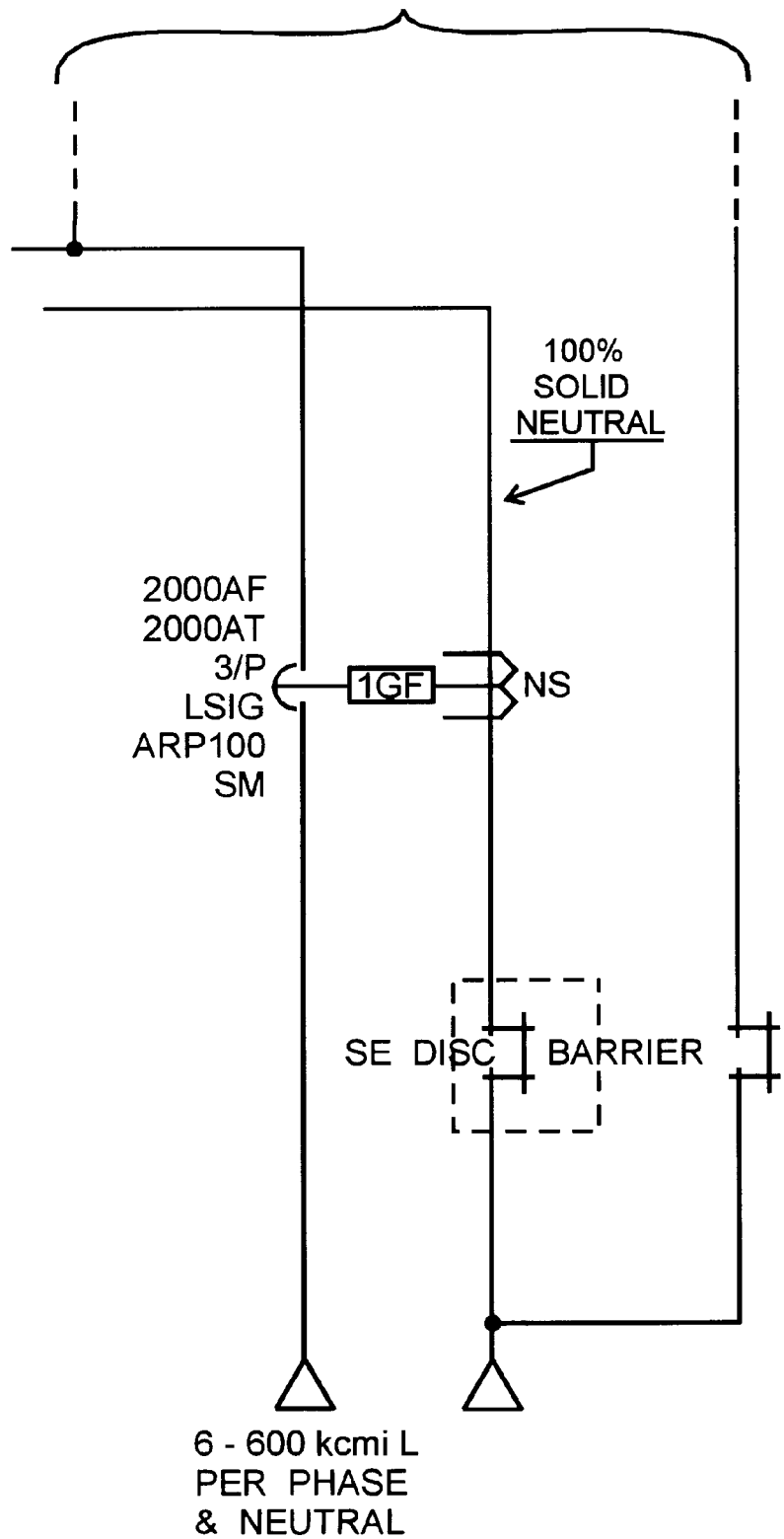
FIG. 21 is a bottom half of the wiring diagram begun in FIG. 20.

TABLE III shows a print-out generated by the switchboard configuration module for a specific example. The print-out includes a general description of the switchboard, a pricing detail, a price and cost summary, a quote BOM, an itemized price sheet, and the manufacturing BOM consisting of the list of parts needed for manufacturing and assembling the switchboard. In this example, the switchboard configuration module automatically generates the assembly drawings shown in FIGS. 14 to 19, the wiring diagram in FIGS. 20 and 21, the drawing legend shown in TABLE IV, and the table OF TABLE V including a row of information for each module or component in the switchboard.

Figure 17:
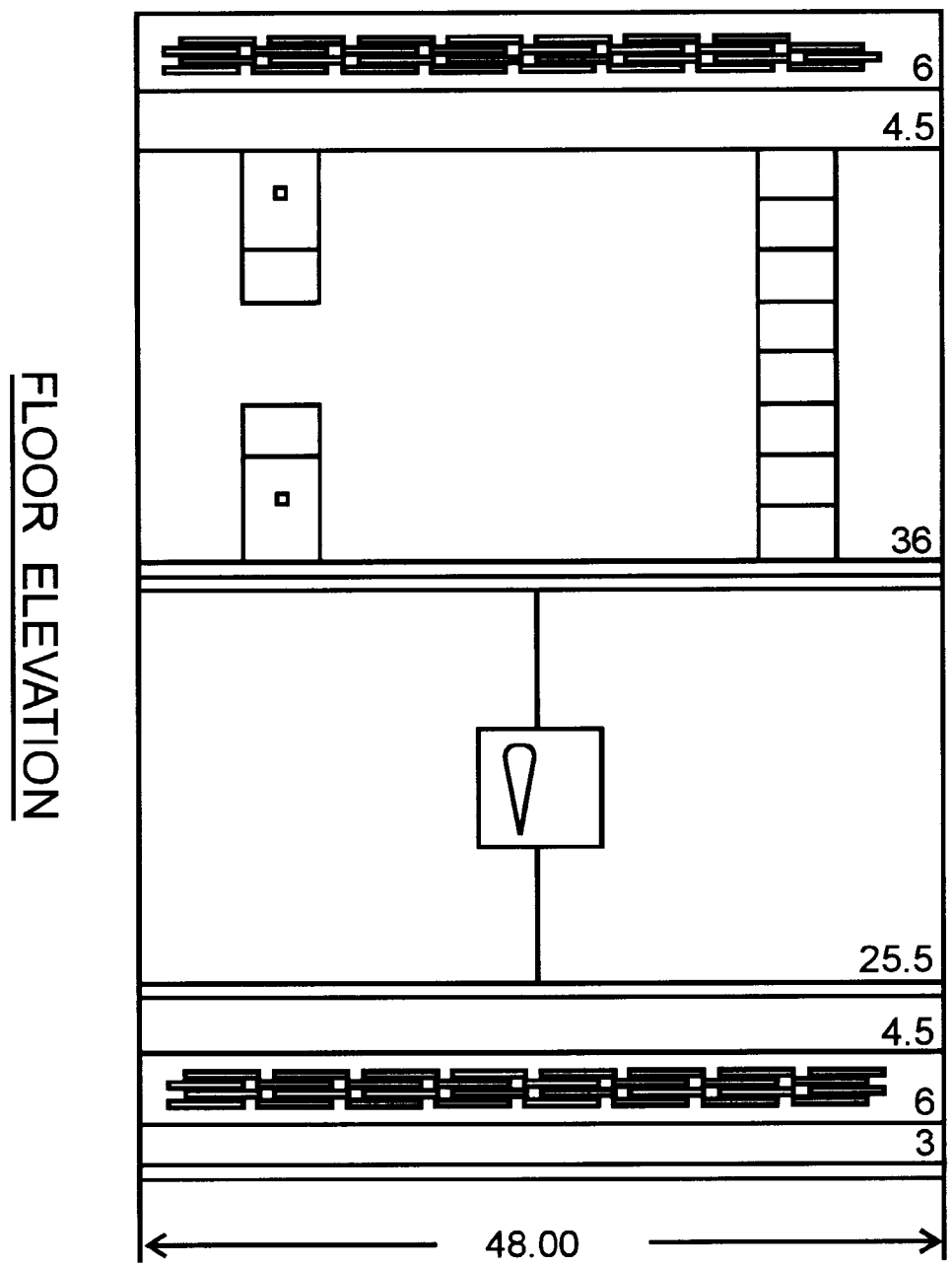
FIG. 17 is a front elevation of the standard switchboard shown in FIGS. 16 to 19.
Figure 18:
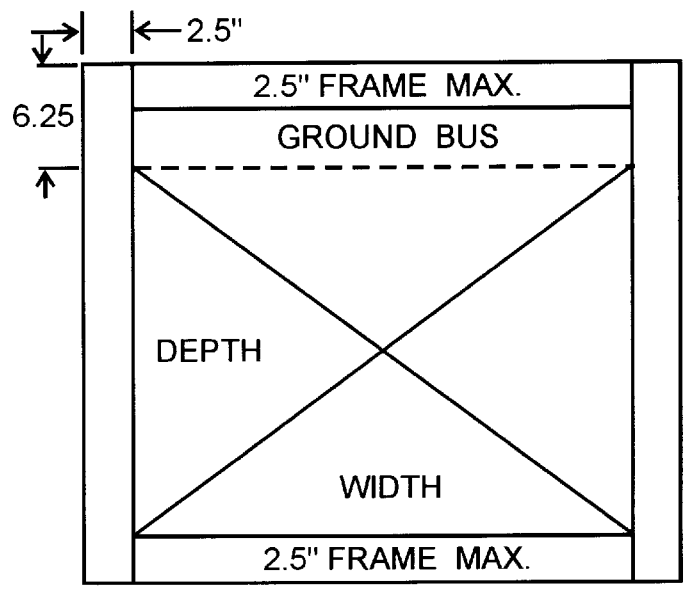
FIG. 18 is a top view showing available conduit area in the standard switchboard shown in FIGS. 16 to 19.
Figure 19:
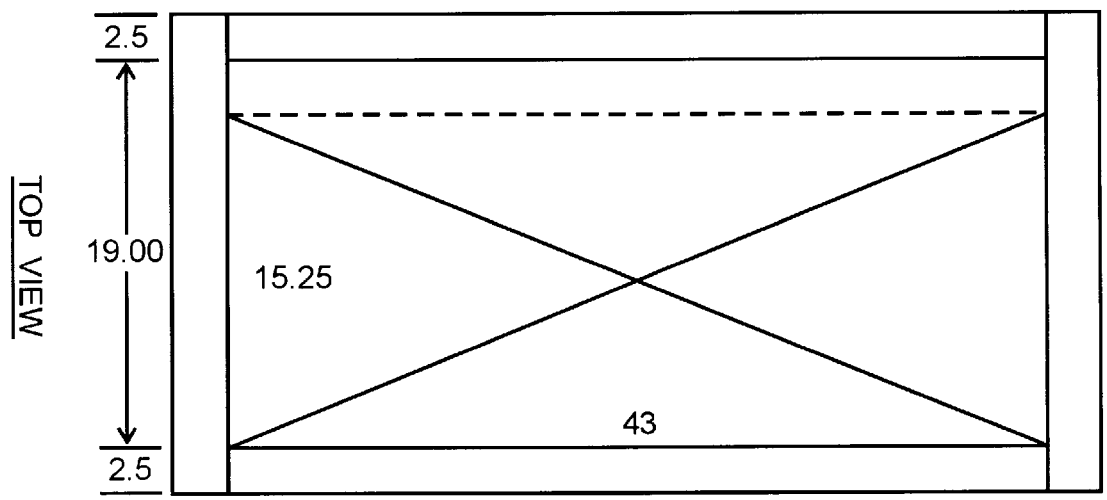
FIG. 19 is a top view of the standard switchboard shown in FIGS. 16 to 19.

The switchboard configuration module automatically generates the drawings by selecting a set of predefined drawing templates applicable to the general classes of switchboard sections and standard configurations in the general classes of switchboard sections. The numerals and descriptive legends in FIGS. 14 to 21 are automatically produced by the switchboard configuration module. For example, FIGS. 14 to 16 and 18 to 19 are generally applicable to a standard switchboard section having dimensions of about 90 inches high by 48 inches wide by 24 inches deep. The front elevation in FIG. 17 is a template for a particular standard design for a switchboard section. The numerals "6, 4.5, 36, 25.5, 4.5, 6, 3" indicate the height in inches of various front panel sections at the front of the switchboard section in FIG. 17.

Front elevations for the various possible standard designs for a switchboard section are shown consecutively in FIGS. 22 to 60.

Figure 22:
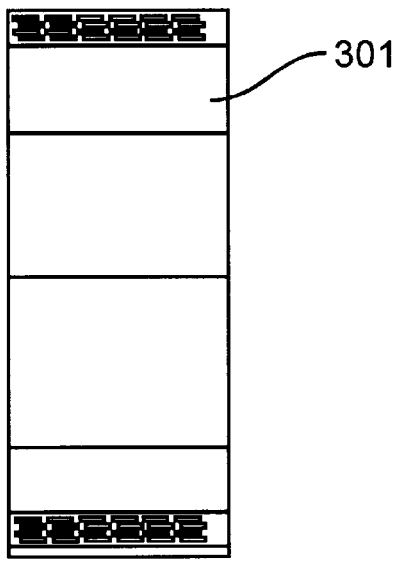
FIG. 22 is a front elevation of a full-height switchboard section having a full-height utility compartment and a top feed.

FIG. 22 shows a full-height utility compartment having a top feed (2000 Amp., 36" width by 24" depth; 3000 Amp., 36" width by 36" depth; 4000 Amp., 42" width by 48" depth). Power is fed to the full-height utility compartment by service lines (not shown) that enter the full-height utility compartment from the top and are terminated by lugs (not shown) behind an upper front panel section 301.

Figure 23:
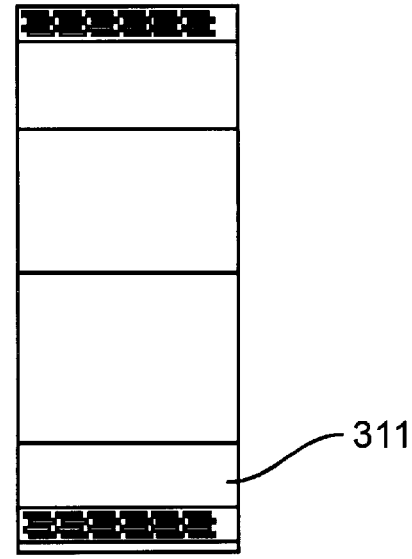
FIG. 23 is a front elevation of a full-height switchboard section having a full-height utility compartment and a bottom feed.

FIG. 23 shows a full-height utility compartment having a bottom feed (2000 Amp., 36" width by 24" depth; 3000 Amp., 36" width by 36" depth; 4000 Amp., 42" width by 48" depth). Power is fed to the full-height utility compartment by service lines (not shown) that enter the full-height utility compartment from the bottom and are terminated by lugs (not shown) behind a lower front panel section 311.

Figure 24:
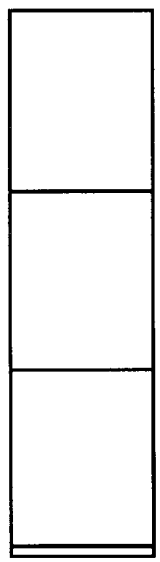
FIG. 24 is a front elevation of a full-height switchboard section having a full-height auxiliary compartment that does not include a power meter.

FIG. 24 shows a full-height auxiliary section, without a power meter (through-bus and no main lugs, through-bus and main lugs, or no through-bus and main lugs)(width 12", 24", 30", 36", 42", 48", or 54").

Figure 25:
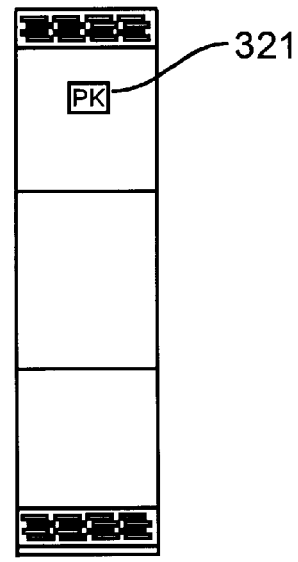
FIG. 25 is a front elevation of a full-height switchboard section having a full-height auxiliary compartment that includes a power meter.

FIG. 25 shows a full-height auxiliary section having a power meter 321 (through-bus and no main lugs, through-bus and main lugs, or no through-bus and main lugs)(width 12", 24", 30", 36", 42", 48", or 54"). (A box containing the abbreviation PM is to indicate the power meter 321 in FIG. 24, and a similar symbol is used in elevations of other switchboard section designs that have power meters on their front panels.)

Figure 26:
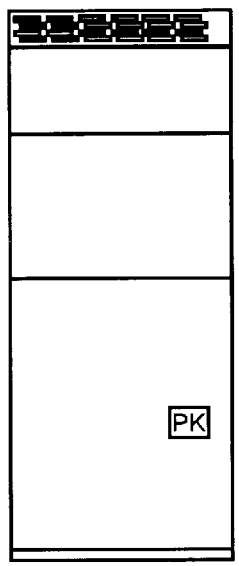
FIG. 26 is a front elevation of a full-height switchboard section having an upper utility compartment and a lower main protection compartment.

FIG. 26 shows a combo utility and main section having a top service line entry. This switchboard section has a 36" width and a 24" depth.

Figure 27:
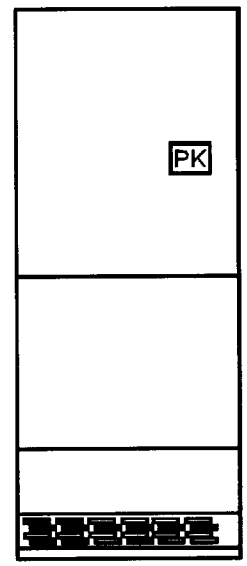
FIG. 27 is a front elevation of a full-height switchboard section having a lower utility compartment and an upper main protection compartment.

FIG. 27 shows a combo utility and main section having a bottom service entry. This switchboard section also has a 36" width and a 24" depth.

Figure 28:
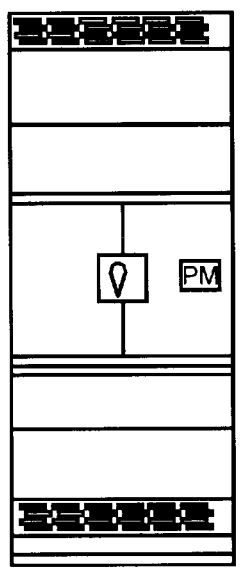
FIG. 28 is a front elevation of a full-height switchboard section having individually mounted type P-frame main circuit breakers.

FIG. 28 shows a full-height switchboard section having individually mounted circuit breakers in a single main breaker type P frame (line: lugs or through-bus; load: lugs or through-bus)(2000 Amp., 3-way, 30" width, 4-way, 36" width, 24" depth).

Figure 29:
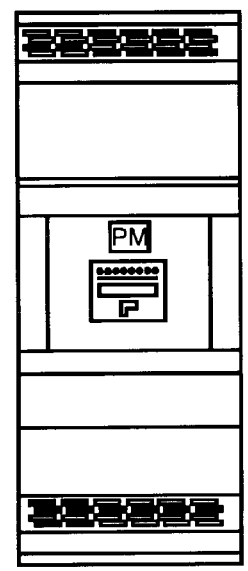
FIG. 29 is a front elevation of a full-height switchboard section having individually mounted type SE-frame main circuit breakers.
Figure 30:
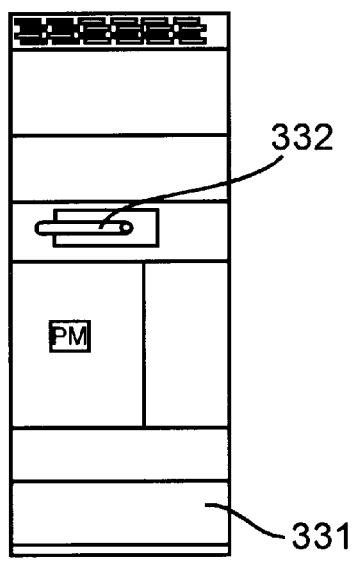
FIG. 30 is a front elevation of a full-height switchboard section having a bottom feed and an individually-mounted bolted pressure switch for main protection.

FIG. 29 shows a full-height switchboard section having individually mounted circuit breakers in a single main breaker type SE frame (line: lugs or through-bus; load: lugs or through-bus)(1600–3000 Amp., 42" width, 36" depth; 3001–4000 Amp. 42" width, 48" depth);

FIG. 30 shows a full-height switchboard section having an individually mounted bolted pressure switch and a bottom feed (line: lugs or through-bus; load: lugs or through-bus)(800–2000 Amp., 3-way, 30" width, 4-way, 36" width, 24" depth; 2500 Amp., 3-way, 36" width, 4-way, way, 42" width, 36" depth; 3000 Amp., 3-way, 36" width, 4-way, 42" width, 36" depth); 4000 Amp. not available for the bottom feed). The bottom feed conductors enter behind a lower front panel 331. The pressure switches can be manually actuated by a handle 332.

Figure 31:
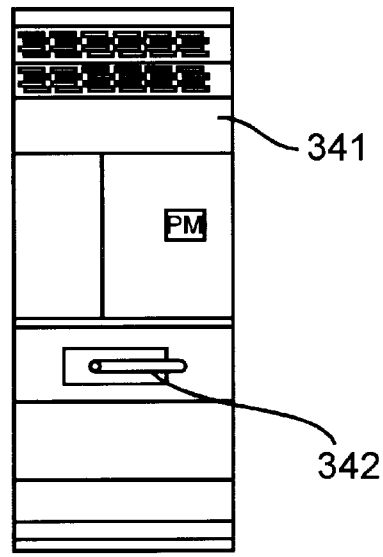
FIG. 31 is a front elevation of full-height switchboard section having a top feed and an individually-mounted bolted pressure switch for main protection.

FIG. 31 shows a full-height switchboard section having an individually mounted bolted pressure switch and a top feed (line: lugs or through-bus; load: lugs or through-bus) (800–2000 Amp., 3-way, 30" width, 4-way, 36" width, 24" depth; 2500 Amp., 3-way, 36" width, 4-way, 42" width, 36" depth; 3000 Amp., 3-way, 36" width, 4-way, 42" width, 36" depth); 4000 Amp. 3-way, 42" width, 4-way, 48", 48" depth). The top feed conductors enter behind an upper front panel 341. The pressure switches can be manually actuated by a handle 342.

Figure 32:
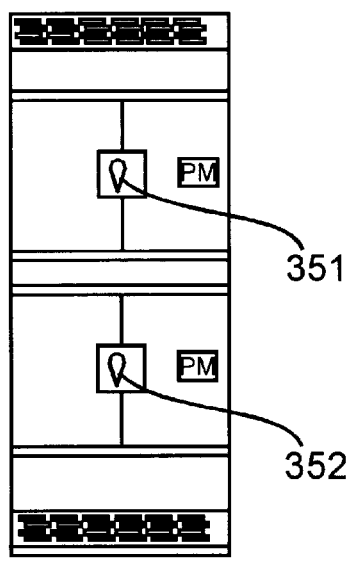
FIG. 32 is a front elevation of a full-height switchboard section having stacked multiple main circuit breakers.

FIG. 32 shows a full-height switchboard section of stacked multiple main breakers (line: through-bus (600–2000 Amp. at 24"; 3000 Amp. at 36" depth; 400 Amp. at 48" depth); load: lugs (600 kcmil max.) (possible combinations for top and bottom main breaker are 1200 Amp top and 2500 Amp. bottom; or top 2000 Amp. max. and bottom 2000 Amp. max.). The stacked multiple main breakers can be manually actuated by respective handles 351 and 352.

Figure 33:
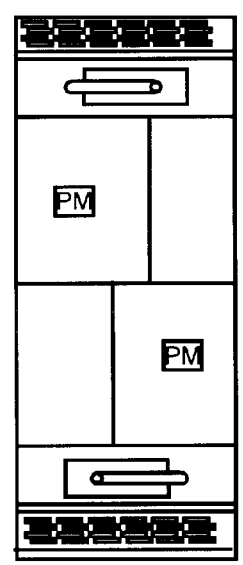
FIG. 33 is a front elevation of a full-height switchboard section having stacked multiple main fusible pressure switches.

FIG. 33 shows a full-height switchboard section of stacked multiple main fusible pressure switches (line: through-bus (600–2000 Amp. at 24" depth for type CB, 36" depth for type BP; 3000 Amp. at 36" depth; 400 Amp. at 48" depth); load: lugs (600 kcmil max.); possible combinations for top and bottom main breaker are 1600 Amp. max top and 2000 Amp. max. bottom).

Figure 34:
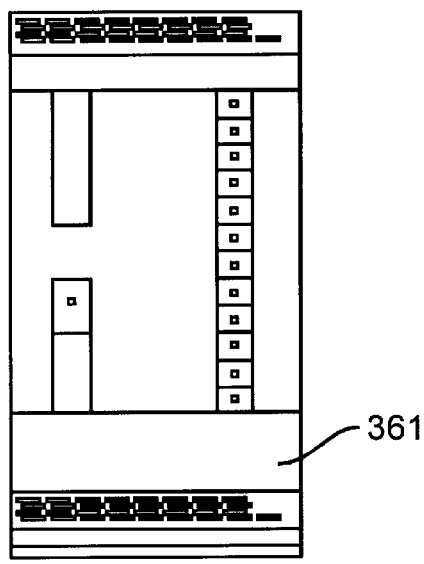
FIG. 34 is a front elevation of a full-height switchboard distribution section with I-LINE® circuit breakers from Square D and a bottom feed.

FIG. 34 shows a full-height switchboard distribution section with I-LINE® circuit breakers, or six circuit mains, bottom feed, with or without through-bus, 1200 Amp. max left circuit breakers, 250 Amp. max right circuit breakers, 48" width, 24" depth. A main lug entry for 2000 Amp. max is located behind a lower front panel section 361.

Figure 35:
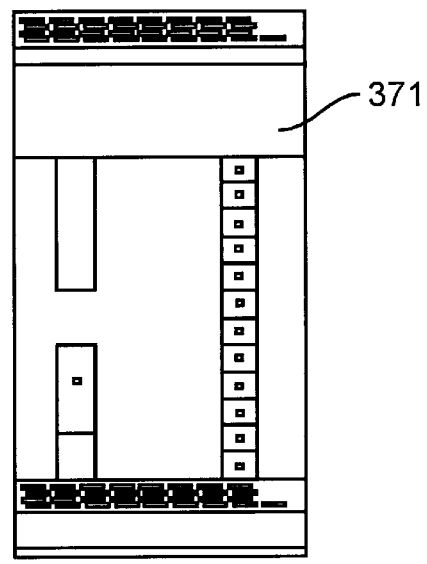
FIG. 35 is a front elevation of a full-height switchboard distribution section with I-LINE® circuit breakers from Square D and a top feed.

FIG. 35 shows a full-height switchboard section with I-LINE® circuit breaker distribution, or six circuit mains, top feed, with or without through-bus, 1200 Amp. max. left circuit breakers, 250 Amp. max. right circuit breakers, 48" width, 24" depth. A main lug entry for 2000 Amp. max is located behind an upper front panel section 371.

Figure 36:
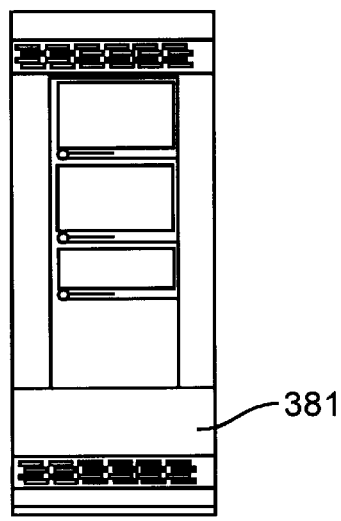
FIG. 36 is a front elevation of a full-height switchboard distribution section having main lug fusible distribution and a bottom feed.

FIG. 36 shows a full-height switchboard section for main lug and fusible distribution or six circuit mains (type QMB or QMJ), bottom feed, with or without through-bus; 400 Amp. max. fusible switch, 36" width; 1200 Amp. max. fusible switch, 42" width. A main lug entry for 2000 Amp. max is located behind a lower front panel section 381.

Figure 37:
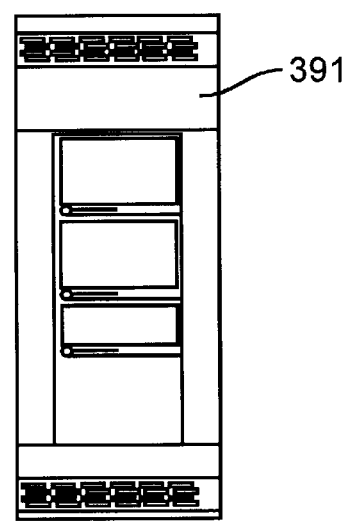
FIG. 37 is a front elevation of a full-height switchboard distribution section having main lug fusible distribution and a top feed.

FIG. 37 shows a full-height switchboard section for main lug and fusible distribution or six circuit mains (type QMB or QMJ), top feed, with or without through-bus, 2000 Amp. max (400 Amp. max fusible switch, 36" width; 1200 Amp. max fusible switch, 42" width). A main lug entry for 2000 Amp. max is located behind an upper front panel section 391.

Figure 38:
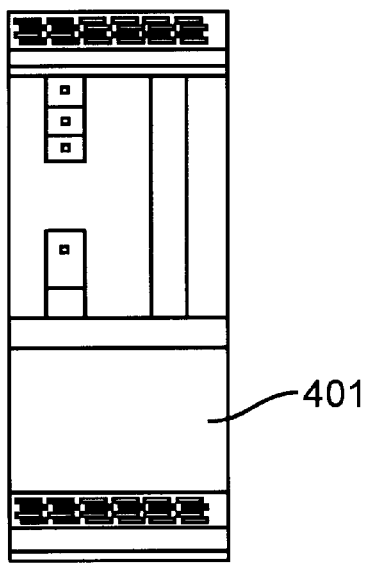
FIG. 38 is a front elevation of a full-height switchboard distribution section having a lower main lug compartment and an upper compartment for a double row of I-LINE® distribution circuit breakers.

FIG. 38 shows a full-height switchboard section for a main lug combo double row I-LINE® circuit breaker distribution or six circuit mains, bottom feed, with or without through-bus. The section depth is 24 inches. For a 48 inch width, the left circuit breakers are 800 Amp. max, and the right circuit breakers are 250 Amp. max. For a 42 inch width, the left circuit breakers are 600 Amp. max and the right circuit breakers are 250 Amp. max. For a 36 inch width, the left circuit breakers can have 250 Amp. max and the right circuit breakers are 100 Amp. max. Power is received in section by a bottom entry 2000 Amp. max main lug compartment 401.

Figure 39:
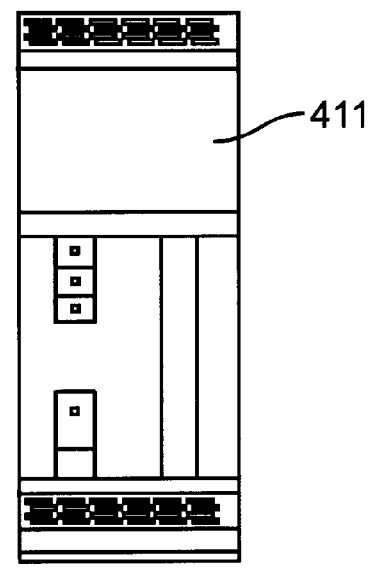
FIG. 39 is a front elevation of a full-height switchboard section having an upper main lug compartment and a lower compartment for a double row of I-LINE® distribution circuit breakers.

FIG. 39 shows a full-height switchboard section for a main lug combo double row I-LINE® circuit breaker distribution or six circuit mains, top feed, with or without through-bus. The section depth is 24 inches. For a 48 inch section width, the left circuit breakers are 800 Amp. max, and the right circuit breakers are 250 Amp. max. For a 42 inch width, the left circuit breakers are 600 Amp. max and the right circuit breakers are 250 Amp. max. For a 36 inch width, the left circuit breakers can have 250 Amp. max and the right circuit breakers are 100 Amp. max. Power is received in a top entry 2000 Amp. max main lug compartment 411.

Figure 40:
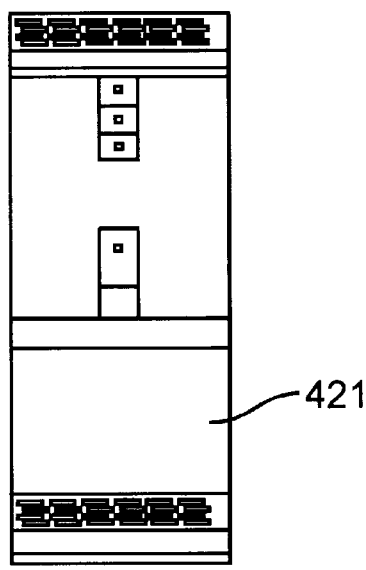
FIG. 40 is a front elevation of a full-height switchboard section having a lower main lug compartment and an upper compartment for a single row of I-LINE® distribution circuit breakers.

FIG. 40 shows a full-height switchboard section for a main lug I-LINE® single row combo distribution or six circuit mains with or without through-bus and a bottom feed. Main lugs for the bottom feed, 2000 Amp. max, are located in a lower compartment 421. The circuit breakers are 800 Amp. max. The section has a width of 36 inches and a depth of 24 inches.

Figure 41:
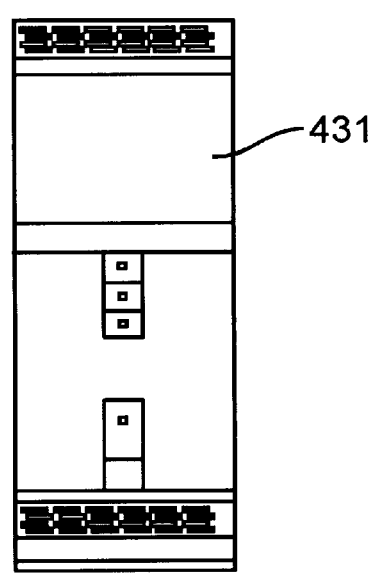
FIG. 41 is a front elevation of a full-height switchboard section having an upper main lug compartment and a lower compartment for a single row of I-LINE® distribution circuit breakers.

FIG. 41 shows a full-height switchboard section for a main lug I-LINE® single row combo distribution or six circuit mains with or without through-bus and a top feed. Main lugs for the bottom feed, 2000 Amp. max., are located in an upper compartment 431. The circuit breakers are 800 Amp. max. The section has a width of 36 inches and a depth of 24 inches.

FIG. 42 shows a full-height switchboard section including main lugs and type QMB or QMJ fusible distribution or six circuit mains and a bottom feed with or without a through-bus.

The section depth is 42 inches. A 400 Amp. max fusible switch is used for a switchboard section having a width of 36 inches, and an 800 Amp. max fusible switch is used for a switchboard section having a width of 42 inches. Main lugs for the bottom feed, 2000 Amp. max., are located in a lower compartment 441.

FIG. 43 shows a full-height switchboard section including main lugs and type QMB or QMJ fusible distribution or six circuit mains and a top feed with or without a through-bus. The section depth is 42 inches. A 400 Amp. max fusible switch is used for a switchboard section having a width of 36 inches, and an 800 Amp. max fusible switch is used for a switchboard section having a width of 42 inches. Main lugs for the top feed, 2000 Amp. max., are located in an upper compartment 451.

FIG. 44 shows a full-height combo switchboard section having a lower half-height main circuit breaker compartment 461 and an upper half-height distribution circuit breaker compartment 462. The distribution circuit breaker compartment 462 has two rows of I-LINE® distribution circuit breakers. The section depth is 48 inches. The distribution breakers are 250 Amp. max left breakers and 100 Amp. max right breakers for a 36 inch section width, 600 Amp. left circuit breakers and 250 Amp. max right circuit breakers for a 42 inch width, and an 800 Amp. max left circuit breakers and 250 Amp. max right circuit breakers for a 48 inch width. Service lines are connected by main lugs and the load may or may not be connected by a through-bus.

FIG. 45 shows a full-height combo switchboard section having an upper half-height main circuit breaker compartment 471 and a lower half-height distribution circuit breaker compartment 472. The distribution circuit breaker compartment 472 has two rows of I-LINE® distribution circuit breakers. The section depth is 48 inches. The distribution breakers are 250 Amp. max left breakers and 100 Amp. max right breakers for a 36 inch section width, 600 Amp. left circuit breakers and 250 Amp. max right circuit breakers for a 42 inch width, and an 800 Amp. max left circuit breakers and 250 Amp. max right circuit breakers for a 48 inch width. Service lines are connected main lugs and the load may or may not be connected by a through-bus.

Figure 46:
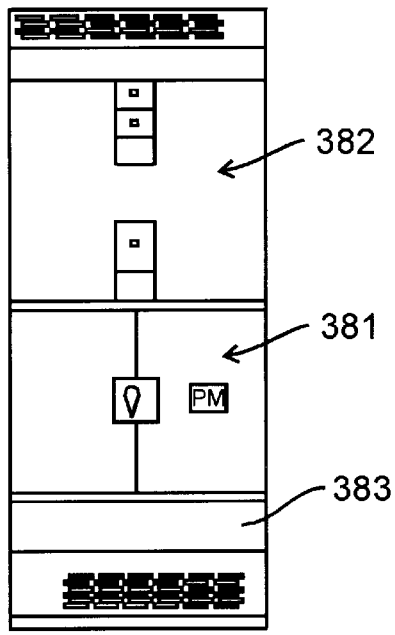
FIG. 46 is a front elevation of a full-height switchboard section having a lower main circuit breaker compartment and an upper compartment for a single row of I-LINE® distribution breakers.

FIG. 46 shows a full-height combo switchboard section with a bottom feed and including a half-height main breaker compartment 381 and a half-height distribution breaker compartment 382 for I-LINE® single row distribution breakers. The bottom feed including lugs or a bus way or through-bus received behind a lower front-panel section 383. The main breaker has a rating of 2000 Amp. 100% max. Distribution breakers are 800 Amp. max. The switchboard section has a 36 inch width and a 24 inch depth.

Figure 47:
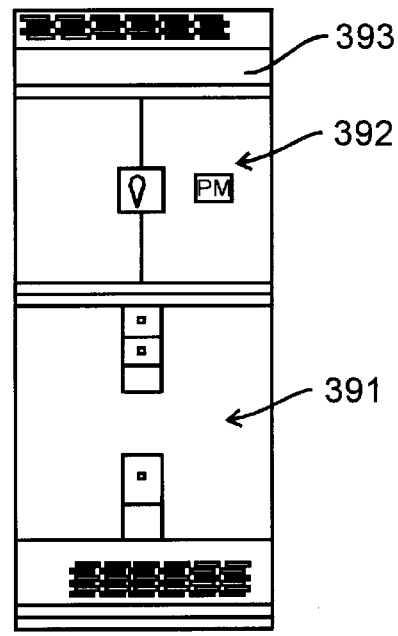
FIG. 47 is a front elevation of a full-height switchboard section having an upper main circuit breaker compartment and a lower compartment for a single row of I-LINE® distribution breakers.

FIG. 47 shows a full-height combo switchboard section with a top feed and including a half-height main breaker compartment 391 and a half-height distribution breaker compartment 392 for I-LINE® single row distribution breakers. The top feed including lugs or a bus way or through-bus received behind an upper front-panel section 393. The main breaker has a rating of 2000 Amp. 100% max. Distribution breakers are 800 Amp. max. The switchboard section has a 36 inch width and a 24 inch depth.

Figure 48:
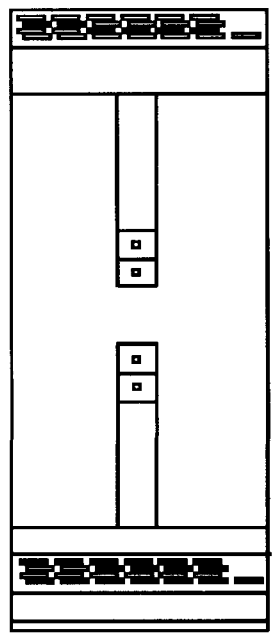
FIG. 48 is a front elevation of a full-height switchboard section having a full-height compartment including a single row of I-LINE® distribution breakers.

FIG. 48 shows a full-height switchboard section containing a single-row of distribution circuit breakers internally connected to a 2000 Amp. vertical bus. Service lines are connected by lugs with no through bus, a bus way with no through bus, a through bus or lugs on the through bus. The load is connected by breaker lugs. The breakers are 1200 Amp. max. The section has a 36 inch width and a 24 inch depth. The 1200 Amp. max breakers can be thermo-magnetic or electronic.

Figure 49:
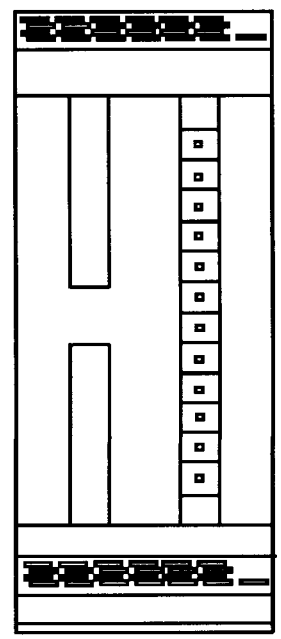
FIG. 49 is a front elevation of a full-height switchboard section having a full-height compartment including two rows of I-LINE® distribution breakers powered by a 2000 Amp. internal vertical bus.

FIG. 49 shows a full-height switchboard section including a double-row of I-LINE® breakers. Power to the circuit breakers is conveyed by an internal 2000 Amp. vertical bus. A 34 inch width switchboard section can have 250 Amp. max left breakers and 100 Amp. max right breakers. A 42 inch width section can have 600 Amp. max left breakers and 250 Amp. max right breakers. A 48 inch width section can have 1200 Amp. max left breakers and 250 Amp. max right breakers.

Figure 50:
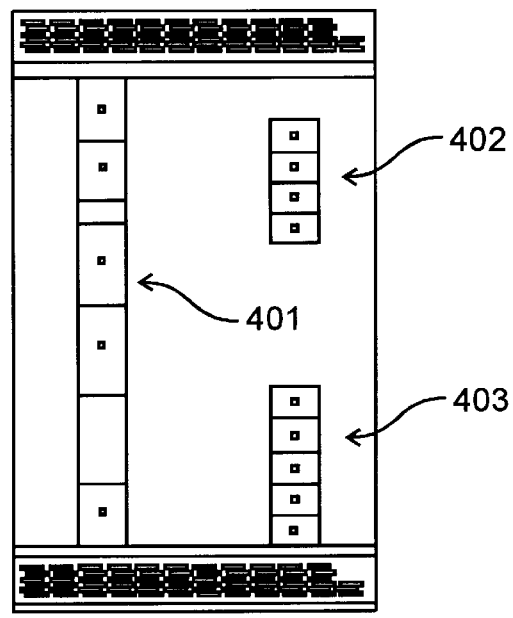
FIG. 50 is a front elevation of a full-height switchboard section having a full-height compartment including two rows of I-LINE® distribution breakers powered by a 3000 Amp. or 4000 Amp. internal vertical bus.

FIG. 50 shows a full-height switchboard section for up to two rows of circuit breakers fed by a 3000 or 4000 Amp. internal vertical bus. Breakers in a left row 401 are 1200 Amp. max breakers, and breakers in an upper portion 402 and a lower portion 403 of a right row are 250 Amp. max breakers. The width of the switchboard section is 54 inches. For a 3000 Amp. internal bus, the section has a 36 inch depth. For a 4000 Amp. internal vertical bus, the switchboard section has a depth of 48 inches.

Figure 51:
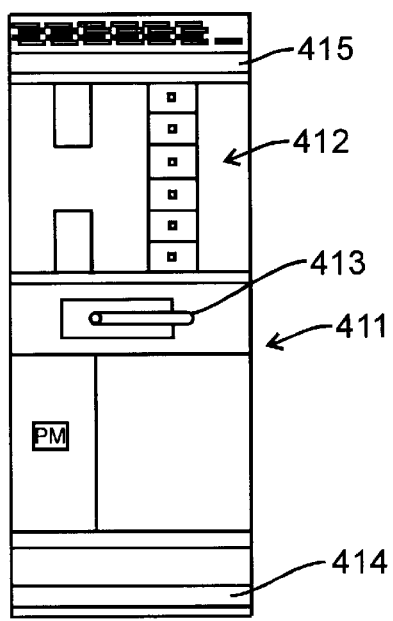
FIG. 51 is a front elevation of a full-height switchboard section having a lower fusible main switch compartment and an upper compartment for two rows of I-LINE® distribution breakers.

FIG. 51 shows a full-height combo section including a lower fusible main switch compartment 411 and an upper distribution circuit breaker compartment 412. The fusible main switch 413 is 2000 Amp. max. Service lines are received behind a bottom front panel section 414 and the loads are connected behind an upper front panel section 415. The service connections are by lugs or bus way or through-bus and the load may or may not be a through-bus. The depth of the section is 24 inches. For a 36 inch section width, the left distribution circuit breakers are 250 Amp. max and the right distribution circuit breakers are 100 Amp. max. For a 42 inch section width, the left distribution circuit breakers are 600 Amp. max and the right distribution circuit breakers are 250 Amp. max. For a 48 inch section width, the left distribution circuit breakers are 800 Amp. max and the right distribution circuit breakers are 250 Amp. max.

Figure 52:
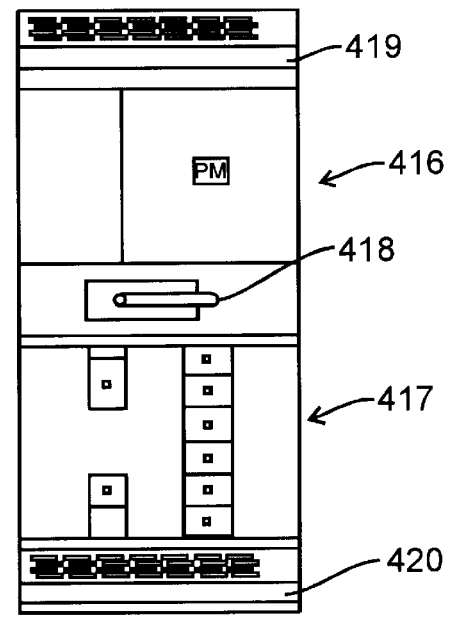
FIG. 52 is a front elevation of a full-height switchboard section having an upper fusible main switch compartment and a lower compartment for two rows of I-LINE® distribution breakers.

FIG. 52 shows a full-height combo section including an upper fusible main switch compartment 416 and a lower distribution circuit breaker compartment 417. The fusible main switch 418 is 2000 Amp. max. Service lines are received behind an upper front panel section 419 and the loads are connected behind a lower front panel section 420. The service lines are connected by lugs or bus way or through-bus and the load may or may not be a through-bus. The depth of the section is 24 inches. For a 36 inch section width, the left distribution circuit breakers are 250 Amp. max and the right distribution circuit breakers are 100 Amp. max. For a 42 inch section width, the left distribution circuit breakers are 600 Amp. max and the right distribution circuit breakers are 250 Amp. max. For a 48 inch section width, the left distribution circuit breakers are 800 Amp. max and the right distribution circuit breakers are 250 Amp. max.

Figure 53:
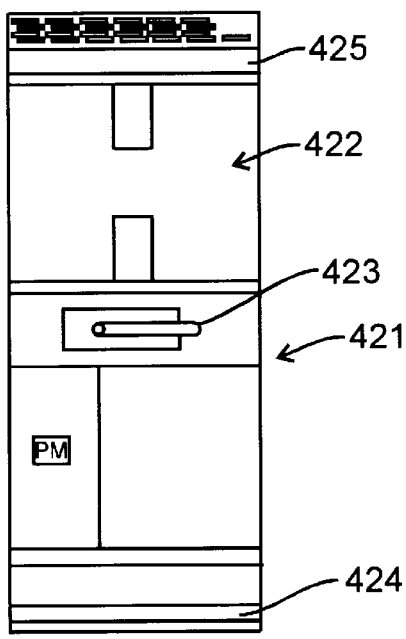
FIG. 53 is a front elevation of a full-height switchboard section having a lower fusible main switch compartment and an upper compartment for a single row of I-LINE® distribution breakers.

FIG. 53 shows a full-height combo switchboard section including a lower fusible main compartment 421 and an upper single-row distribution circuit breaker compartment 422. A main fusible switch 423 has a 2000 Amp. max rating. The distribution breakers are rated at 800 Amp. max. The switchboard section has a 36 inch width and a 24 inch depth. Service lines are received by lugs on main or through-bus behind a lower front panel section 424 and the lugs may or may not be provided to a through-bus. The loads extend from behind an upper front panel section 425.

Figure 54:
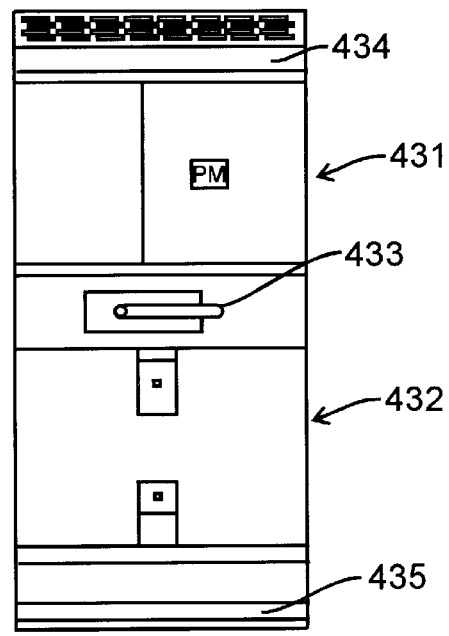
FIG. 54 is a front elevation of a full-height switchboard section having an upper fusible main switch compartment and a lower compartment for a single row of I-LINE® distribution breakers.

FIG. 54 shows a full-height combo switchboard section including an upper fusible main compartment 431 and a lower single-row distribution circuit breaker compartment 432. A main fusible switch 433 has a 2000 Amp. max rating. The distribution breakers are rated at 800 Amp. max. The switchboard section has a 36 inch width and a 24 inch depth. Service lines are received by lugs on main or through-bus behind an upper front panel section 434 and the lugs may or may not be provided to a through-bus. The loads extend from behind a lower front panel section 435.

Figure 55:
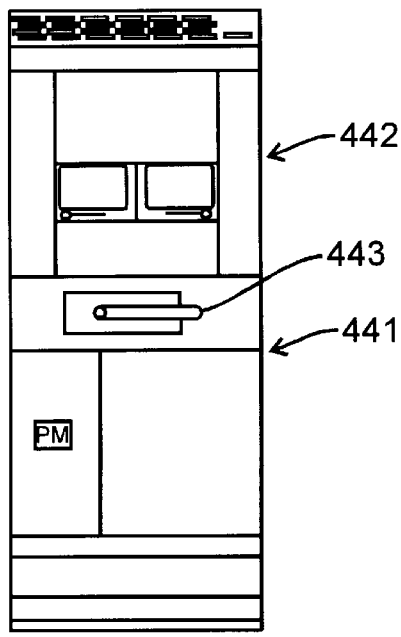
FIG. 55 is a front elevation of a full-height switchboard section having a lower compartment for a 2000 Amp. max. fusible main switch and an upper compartment for distribution fuses.

FIG. 55 shows a full-height combo switchboard section including a lower fusible main compartment 441 and an upper fusible distribution compartment 442. A fusible main switch 443 is rated at 2000 Amp. max. The section depth is 24 inches. The distribution fuses 442 are 400 Amp. max type QMB or QMJ in a 36 inch section width, or an 800 Amp. max type QMB or QMJ in a 42 inch section width. Service lines are connected by lugs or a through-bus and the load may or may not be supplied through a through-bus.

Figure 56:
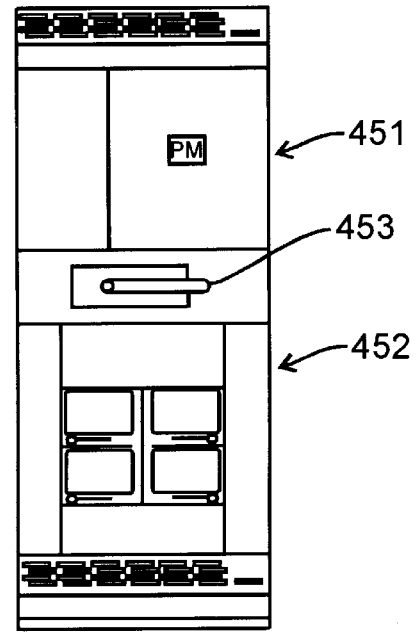
FIG. 56 is a front elevation of a full-height switchboard section having an upper compartment for a 2000 Amp. max fusible main switch and a lower compartment for distribution fuses.

FIG. 56 shows a full-height combo switchboard section including an upper fusible main compartment 451 and a lower fusible distribution compartment 452. A fusible main switch 453 is rated at 2000 Amp. max. The section depth is 24 inches. The distribution fuses in the lower compartment 452 are 400 Amp. max type QMB or QMJ in a 36 inch section width, or an 800 Amp. max type QMB or QMJ in a 42 inch section width. Service lines are connected by lugs or a through-bus and the load may or may not be supplied through a through-bus.

Figure 57:
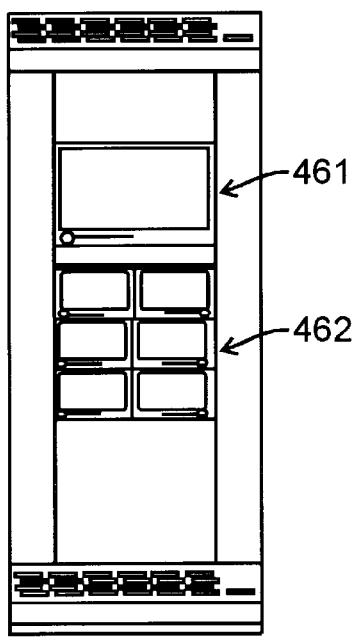
FIG. 57 is a front elevation of a full-height switchboard section having a lower compartment for an 800 Amp. max. fusible main switch and an upper compartment for distribution fuses.

FIG. 57 shows a full-height switchboard section for fusible distribution including an upper line feed to an 800 Amp. max type QMB fusible main switch 461 and a lower compartment 462 including type QMB fusible switches for distribution to lower load lines. The section depth is 24 inches. The distribution switches 462 are 400 Amp. max type QMB for a 36 inch width section, or an 800 Amp. max type QMB for a 42 inch width section. Service lines are connected by lugs or a through-bus and the load is or is not supplied by a through-bus.

Figure 58:
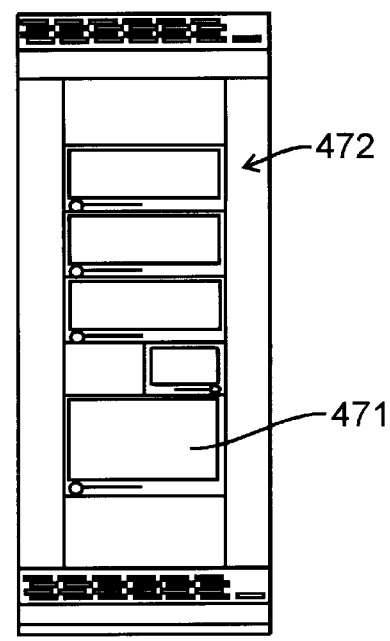
FIG. 58 is a front elevation of a full-height switchboard section having an upper compartment for an 800 Amp. max. fusible main switch and a lower compartment for distribution fuses.

FIG. 58 shows a full-height switchboard section for fusible distribution including a lower line feed to an 800 Amp. max type QMB fusible main switch 471 and an upper compartment 472 including type QMB fusible switches for distribution to upper load lines. The section depth is 24 inches. The distribution switches in the upper compartment 472 are 400 Amp. max type QMB for a 36 inch width section, or an 800 Amp. max type QMB for a 42 inch width section. Service lines are connected by lugs or a through-bus and the load is or is not supplied by a through-bus.

Figure 59:
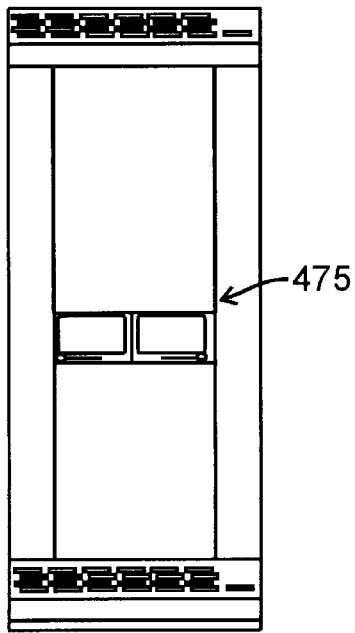
FIG. 59 is a front elevation of a full-height switchboard section having a full-height compartment for fusible distribution from an internal 2000 Amp. vertical bus.

FIG. 59 is a full-height section for fusible distribution. The fusible distribution switches 475 are fed by an internal 2000 Amp. vertical bus. The switches 475 are 400 Amp. max type QMB or QMJ for a 36 inch section width, and 1200 Amp. max QMB or QMJ for a 42 inch section. There can be one 1200 Amp. max per section or three 800 max per section.

Figure 60:
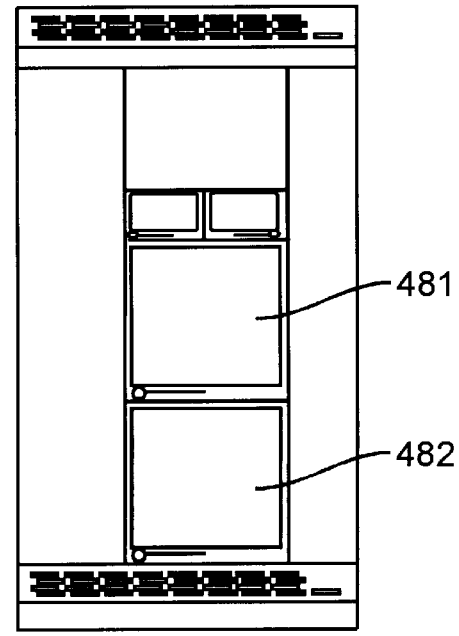
FIG. 60 is a front elevation of a full-height switchboard section having a full-height compartment for fusible distribution from an internal 3000 Amp. vertical bus.

FIG. 60 shows a full-height switchboard section for fusible distribution from an internal 3000 Amp. vertical bus. There can be a maximum of two 1200 Amp. max QMB or QMJ fusible switches 481 and 482. Service lines can be connected by lugs or bus way, or a through-bus or lugs on a through-bus, or a bus way to a through-bus.

The new switchboard sales and production methodology has cut the cycle time at Square D Co. for a typical switchboard from about eight weeks to one day. The customer can usually get a switchboard in one day, if needed. There has been a reduction of about 95% in errors in the ordering process, and a corresponding increase in customer satisfaction. The profit margin for switchboards has been substantially increased.

The new switchboard sales and production methodology has a few aspects that run counter to conventional wisdom for sales and production management. The conventional wisdom was to individually optimize separate processes. However, for switchboards, processes in the sales and production methodology were misaligned in the pipeline of value creation. Better alignment of those processes, including sales, pricing, engineering design, sourcing of materials, and manufacturing, has been found to be more important than the individual optimization of the processes. Therefore, the traditional functional optimization measures have been replaced with the more important financial and non-financial measures to drive process alignment. In particular, focus has shifted from the traditional measures of component cost and plant utilization to profit margin, error rate, cycle and lead time, and customer satisfaction. For example, a switchboard automatically configured from one of the nineteen standard configuration classes is more likely to include a higher degree of functional complexity than a custom designed switchboard, and the customer may not need this higher degree of functional complexity. Yet in the overall process, it is better to automatically configure a switchboard from one of the nineteen standard configuration classes when it is possible to do so.

TABLE I

QUESTIONS AND ANSWERS FOR STANDARD SWITCHBOARD CONFIGURATION PROCESS

QED-S  STANDARD PRODUCT OFFERING
The QED-S Power-Style Switchboard
Program is designed to meet your
customers shipping requirements by
reducing cycle times
The QED-S program consists of:
☐ 4000 amperes maximum
☐ UL Type 1 or Type 3R
☐ Heat Rise or Current Density Bus
☐ Front and Rear Alignment
☐ Incoming Lugs: Mechanical or Compression
☐ Suitable For Use on Service Entrance
Project Name:_____
Switchboard Designation:_____
Distributor_____
Distributor PO#:_____ Acct. #:_____
Contractor:_____
Arch/Engr:_____
Priced By:_____
Customer_____
Street:_____
City:_____
State/ZIP:_____
Attention:_____
Mark:_____
SPD:____ Q2C:____
Main &
Neutral Al or CU   CU
☐ 600     ☐ 2500
☐ 300     ☐ 3000
☐ 1000    ☐ 4000
☐ 1200
☐ 1500
☐ 1600
☐ 2000
System

☐ 208Y/120 3P4W
☐ 240/120 3P4W
☐ 480Y/277 3P4W

TABLE I-continued

☐ 480 3P3W
  ☐ Grounded Wye
  ☐ Grounded Delta
Bus Bar Material
Heat Rise (Std.)

☐ Standard Al/Cu
☐ Copper Only
Current Density

☐ 1000 A/in$^2$ Cu
☐ 700 A/in$^2$ Al
☐ 750 A/in$^2$ Al
Short Circuit
Current Rating ☐ 18k
☐ 25k
☐ 30k
☐ 42k
☐ 50k
☐ 65k
☐ 100k
☐ 125k
☐ 150k
☐ 200k
Incoming Feed
Direction ☐ Bottom Left
☐ Bottom Right
☐ Top Left
☐ Top Right
Accessibility ☐ Front Only
Front and:
☐ Left
☐ Right
☐ Rear
Enclosure Type ☐ NEMA Type 1
☐ NEMA Type 3R
  Non-Walk-In
Through Bus ☐ Yes
☐ No:
  Single Section
  Lugs Load-Side
☐ Suitable for Use As Service Equipment
☐ Series Rated
Incoming Cable Size: No. Per Phase    Wire Size ☐ On-site Date:_____
Utility Company
Name:_____
Local Codes:
☐ Chicago
☐ New York

INDIVIDUALLY MOUNTED MAINS, BRANCHES AND QMB

| | | | \multicolumn{4}{c}{Incoming Sections} | | | | | | |
|---|---|---|---|---|---|---|---|---|---|---|---|---|
| | 12" High | 12" High | \multicolumn{4}{c}{Main Lugs} | \multicolumn{2}{c}{Utility Compartment} | | Auxilliary | | | |
| System Amps | Pull Box | Pull Box w/barrier | Al 3 W | Al 4 W | Cu 3 W | Cu 4 W | 3 W | 4 W | Double Door | (Empty) 24" W | Section >24" W | Unit List | Total List |
| 800 | $740 | $1080 | $1940 | $2265 | $2615 | $3050 | $1245 | $1775 | $275 | $1930 | $2305 | | |
| 1200 | ↓ | ↓ | 2645 | 2975 | 3575 | 4020 | 1700 | 2475 | ↓ | ↓ | ↓ | | |
| 1600 | ↓ | ↓ | 3285 | 3735 | 4445 | 5045 | 2495 | 3645 | ↓ | ↓ | ↓ | | |
| 2000 | ↓ | ↓ | 3945 | 4475 | 5330 | 6035 | 2495 | 4365 | ↓ | ↓ | ↓ | | |
| 2500 | ↓ | ↓ | 5255 | 5955 | 6180 | 7005 | 2930 | 4990 | ↓ | ↓ | ↓ | | |

TABLE I-continued

| | | | | | | | | | | | | |
|---|---|---|---|---|---|---|---|---|---|---|---|---|
| 3000 | ↓ | ↓ | 6360 | 7070 | 7485 | 8310 | 3300 | 5330 | ↓ | ↓ | ↓ | |
| 4000 | ↓ | ↓ | — | — | 9475 | 10670 | 3745 | 7194 | ↓ | ↓ | ↓ | |

Incoming Sections SubTotal:

| Maximum | | Short Circuit | | List | Accessories/Options: | | | | | | | |
|---|---|---|---|---|---|---|---|---|---|---|---|---|
| C/B | Percent | Current Rating | | Price | Alarm | Aux | Shunt | Trips: | | | Unit | Total |
| Frames | Rated | 480 V | 240 V | 3 Pole | Switch | 1A1B | Trip (120 Vac) | GFP/PTT | Short | TI/LCA | Qty | List | List |

Thermal Magnet Fixed Mounted C/B:

| | | | | | | | | | | | |
|---|---|---|---|---|---|---|---|---|---|---|---|
| MA1000 | 80% | 30k | 42k | $8820 | Not | $220 | $565 | — | — | — | |
| MH1000 | ↓ | 65k | 65k | 1020 | Available | ↓ | ↓ | — | — | — | |
| PA1600 | ↓ | 50k | ↓ | 14626 | ↓ | ↓ | ↓ | — | — | — | |
| PA2000 | ↓ | ↓ | ↓ | 16280 | ↓ | ↓ | ↓ | — | — | — | |
| PH1600 | ↓ | 100k | 125k | 15440 | ↓ | ↓ | ↓ | — | — | — | |
| PH2000 | ↓ | ↓ | ↓ | 20115 | ↓ | ↓ | ↓ | — | — | — | |
| PC2000 | ↓ | ↓ | ↓ | 20765 | ↓ | ↓ | ↓ | — | — | — | |
| PC2500 | ↓ | ↓ | ↓ | 24560 | ↓ | ↓ | ↓ | — | — | — | |

Solid State Fixed Mounted C/B:

| | | | | | | | | | | | |
|---|---|---|---|---|---|---|---|---|---|---|---|
| MX0800 | 80 | 65k | 65k | 9380 | Not | $220 | $565 | $1660 | Std. | $920 | |
| ME0800 | 100 | ↓ | ↓ | 11050 | Available | ↓ | ↓ | 2755 | 2335 | Std. | |
| PX1200 | 80 | 100k | 125k | 14090 | ↓ | ↓ | ↓ | 1660 | STD. | 920 | |
| PX1600 | ↓ | ↓ | ↓ | 15445 | ↓ | ↓ | ↓ | 1660 | ↓ | ↓ | |
| PX2000 | ↓ | ↓ | ↓ | 19390 | ↓ | ↓ | ↓ | 1660 | ↓ | ↓ | |
| PX2500 | ↓ | ↓ | ↓ | 25215 | ↓ | ↓ | ↓ | 1660 | ↓ | ↓ | |
| PE1200 | 100 | ↓ | ↓ | 19210 | ↓ | ↓ | ↓ | 2755 | 2335 | STD. | |
| PE1600 | ↓ | ↓ | ↓ | 22395 | ↓ | ↓ | ↓ | 2755 | ↓ | ↓ | |
| PE2000 | ↓ | ↓ | ↓ | 23460 | ↓ | ↓ | ↓ | 2755 | ↓ | ↓ | |
| PE2500 | 80 | ↓ | ↓ | 38325 | ↓ | ↓ | ↓ | 2755 | ↓ | ↓ | |

Stored Energy Fixed Mounted CIB:

| | | | | | | | | | | | |
|---|---|---|---|---|---|---|---|---|---|---|---|
| SEF1600 | 100 | 100k | 150k | 28140 | $1500 | | $850 | $2755 | $2335 | STD. | |
| SEF2000 | ↓ | ↓ | ↓ | 35185 | ↓ | | ↓ | ↓ | ↓ | ↓ | |
| SEF2500 | ↓ | ↓ | ↓ | 42955 | ↓ | | ↓ | ↓ | ↓ | ↓ | |
| SEF3000 | ↓ | ↓ | ↓ | 48055 | ↓ | | ↓ | ↓ | ↓ | ↓ | |
| SEF4000 | ↓ | ↓ | ↓ | 70782 | ↓ | | ↓ | ↓ | ↓ | ↓ | |

BOLT-LOC BP Fixed Mounted F/S:

| Frame | % | 480 V | 240 V | 3 Pole | Bottom | BMFD | PFR/CAP | GFP | Fuses | 1A1B | Qty | Unit List | Total List |
|---|---|---|---|---|---|---|---|---|---|---|---|---|---|
| BP0800 | 100 | 200k | 200k | $11400 | $1440 | $780 | $5325 | $9145 | $2715 | $515 | | | |
| BP1200 | ↓ | ↓ | ↓ | 13030 | ↓ | ↓ | ↓ | ↓ | ↓ | ↓ | | | |
| BP1600 | ↓ | ↓ | ↓ | 14105 | ↓ | ↓ | ↓ | ↓ | ↓ | ↓ | | | |
| BP2000 | ↓ | ↓ | ↓ | 18020 | ↓ | ↓ | ↓ | 10375 | ↓ | ↓ | | | |
| BP2500 | ↓ | ↓ | ↓ | 20940 | ↓ | ↓ | ↓ | 11505 | ↓ | ↓ | | | |
| BP3000 | ↓ | ↓ | ↓ | 34670 | ↓ | ↓ | ↓ | ↓ | ↓ | ↓ | | | |
| BP4000 | ↓ | ↓ | ↓ | 45610 | NA | ↓ | ↓ | 12910 | ↓ | ↓ | | | |

Main and Distribution Sub-Total:

QMB Fixed Mounted Single Main F/S:

| Frame | SCCR 480 V | QMB Clips | 3-Pole | 2-Pole | Fuses Installed 3-Pole | 2-Pole | Height 25.5" | Total List |
|---|---|---|---|---|---|---|---|---|
| 400 | 200k | J,R | $4655 | $3955 | — | — | | $ |
| 600 | 100k | J,R | 5245 | 4455 | — | — | | |
| 800 | 200k | L | 9945 | 8455 | $2715 | $1810 | | |

QMB Main Switch Sub-Total

GROUP MOUNTED I-LINE CIRCUIT BREAKERS

| I-LINE C/B Frame & Max Amp. | SCCR 480 V | 240 V | Height 3 P | 2 P | List Prices: 3 P | 2 P | Options: 2 or 3 Pole Space | Aux. S.W. 1A&1B | Shunt Trip (120 V) | Trips Short | GFP/PTT | TI/LCA | QTY. | Total Mfg HT. | Unit List Price | Total List Price |
|---|---|---|---|---|---|---|---|---|---|---|---|---|---|---|---|---|
| FA060 | 18k | 25k | 4.5" | 4.5" | 510 | 365 | $50 | $220 | $305 | — | $2535 | — | | | | |
| FA100 | ↓ | ↓ | ↓ | ↓ | 530 | 445 | ↓ | ↓ | ↓ | — | ↓ | — | | | | |
| FH060 | 25k | 65k | ↓ | ↓ | 740 | 625 | ↓ | ↓ | ↓ | — | ↓ | — | | | | |
| FH100 | ↓ | ↓ | ↓ | ↓ | 775 | 715 | ↓ | ↓ | ↓ | — | ↓ | — | | | | |
| FC060 | 65k | 100k | ↓ | ↓ | 955 | 765 | ↓ | ↓ | ↓ | — | ↓ | — | | | | |

TABLE I-continued

| | | | | | | | | | | | | |
|---|---|---|---|---|---|---|---|---|---|---|---|---|
| FC100 | | | ↓ | ↓ | 1175 | 940 | ↓ | ↓ | ↓ | — | ↓ | — |
| FI100 | 200k | 200k | ↓ | ↓ | 2175 | 1775 | ↓ | ↓ | ↓ | — | ↓ | — |
| KA225 | 25k | 42k | | | 1440 | 1130 | ↓ | ↓ | ↓ | — | ↓ | — |
| KA250 | | | ↓ | ↓ | 2390 | 1970 | ↓ | ↓ | ↓ | — | ↓ | — |
| KH225 | 35k | 65k | ↓ | ↓ | 3135 | 2630 | ↓ | ↓ | ↓ | — | ↓ | — |
| KH250 | | | ↓ | ↓ | 3985 | 3215 | ↓ | ↓ | ↓ | — | ↓ | — |
| KC225 | 65k | 100k | ↓ | ↓ | 3470 | 2775 | ↓ | ↓ | ↓ | — | ↓ | — |
| KC250 | | | ↓ | ↓ | 4250 | 3400 | ↓ | ↓ | ↓ | — | ↓ | — |
| KI225 | 200k | 200k | ↓ | ↓ | 4065 | 3175 | ↓ | ↓ | ↓ | — | ↓ | — |
| KI250 | | | ↓ | ↓ | 4730 | 3705 | ↓ | ↓ | ↓ | — | ↓ | — |
| LA400 | 30k | 42k | 6" | 6" | 2505 | 2035 | ↓ | ↓ | ↓ | — | — | — |
| LH400 | 35k | 65k | | | 4195 | 3430 | ↓ | ↓ | ↓ | — | — | — |
| LC400 | 65k | 100k | 7.5" | 7.5" | 5080 | 4320 | 220 | ↓ | ↓ | — | — | — |
| LC600 | | | ↓ | ↓ | 5215 | 4460 | ↓ | ↓ | ↓ | — | — | — |
| LI400 | 200k | 200k | ↓ | ↓ | 5815 | 4940 | ↓ | ↓ | ↓ | — | — | — |
| LI600 | | | ↓ | ↓ | 7920 | 7125 | ↓ | ↓ | ↓ | — | — | — |
| MA600 | 30k | 42k | 9" | 9" | 4155 | 3225 | 290 | ↓ | 565 | — | — | — |
| MA800 | | | ↓ | ↓ | 5205 | 4175 | ↓ | ↓ | ↓ | — | — | — |
| MH600 | 65k | 65k | ↓ | ↓ | 5580 | 4350 | ↓ | ↓ | ↓ | — | — | — |
| MH800 | | | ↓ | ↓ | 6785 | 5165 | ↓ | ↓ | ↓ | — | — | — |
| NA1200 | 50k | 100k | 15" | 15" | 10180 | 9150 | 345 | ↓ | ↓ | — | — | — |
| NC1200 | 100k | 125k | | | 12505 | 11240 | ↓ | ↓ | ↓ | — | — | — |
| LX250 | 65k | 100k | 7.5" | 7.5" | 5050 | 3790 | 220 | ↓ | 305 | STD. | $1660 | 920 |
| LX400 | ↓ | ↓ | ↓ | ↓ | 5425 | 4625 | ↓ | ↓ | ↓ | ↓ | ↓ | ↓ |
| LX600 | ↓ | ↓ | ↓ | ↓ | 7785 | 6030 | ↓ | ↓ | ↓ | ↓ | ↓ | ↓ |
| LX1250 | 200k | 200k | ↓ | ↓ | 8280 | 6835 | ↓ | ↓ | ↓ | ↓ | ↓ | ↓ |
| LX1400 | ↓ | ↓ | ↓ | ↓ | 10465 | 9105 | ↓ | ↓ | ↓ | ↓ | ↓ | ↓ |
| LX1600 | ↓ | ↓ | ↓ | ↓ | 15570 | 13810 | ↓ | ↓ | ↓ | ↓ | ↓ | ↓ |
| LE250 | 65k | 100k | ↓ | ↓ | 7575 | 5375 | ↓ | ↓ | ↓ | 2335 | 2755 | STD |
| LE400 | ↓ | ↓ | ↓ | ↓ | 8105 | 6750 | ↓ | ↓ | ↓ | ↓ | ↓ | ↓ |
| LE600 | ↓ | ↓ | ↓ | ↓ | 9170 | 7415 | ↓ | ↓ | ↓ | ↓ | ↓ | ↓ |
| MX250 | 65k | 65k | 9" | 9" | 6270 | 5005 | 290 | ↓ | 565 | STD. | 1660 | 920 |
| MX400 | ↓ | ↓ | ↓ | ↓ | 7675 | 5425 | ↓ | ↓ | ↓ | ↓ | ↓ | ↓ |
| MX800 | ↓ | ↓ | ↓ | ↓ | 8780 | 7025 | ↓ | ↓ | ↓ | ↓ | ↓ | ↓ |
| ME250 | ↓ | ↓ | ↓ | ↓ | 7835 | 6575 | ↓ | ↓ | ↓ | 2335 | 2755 | Std. |
| ME400 | ↓ | ↓ | ↓ | ↓ | 8340 | 6985 | ↓ | ↓ | ↓ | ↓ | ↓ | ↓ |
| ME800 | ↓ | ↓ | ↓ | ↓ | 10345 | 8590 | ↓ | ↓ | ↓ | ↓ | ↓ | ↓ |
| NX1200 | 100k | 125k | 15" | 15" | 12660 | 10135 | 345 | ↓ | ↓ | Std. | 1660 | 920 |
| NE1200 | 100k | 125k | 15" | 15" | 17790 | 15255 | 345 | ↓ | ↓ | 2335 | 2755 | Std. |
| | | | | | | | | | | | I-LINE | Sub-Total |

| Qty. | Frame | Amp. | P | ACC. | | Qty. | Frame | Amp. | P | ACC. |
|---|---|---|---|---|---|---|---|---|---|---|

INCOMING SECTIONS, CUSTOMER METERING, SECTIONS CHARGES

QMB/J Group Mounted Branch F/S:

| Switch | QMB Ht. | QMJ Ht. | SCCR 480 V | QMB Clips | QMJ Clips | Switches 480 V | Switches 240 V | Space 3 Pole | Auxiliary 1A1B | Qty. | Total Height | Total List |
|---|---|---|---|---|---|---|---|---|---|---|---|---|
| 30-30 | 4.5" Twin | | 200k | J,R | J | $1645 | 1145 | $180 | $250 | | | $ |
| 30-blank | 4.5" Twin | | ↓ | ↓ | ↓ | 1235 | 860 | 180 | ↓ | | | |
| 60-60 | 6" Twin | | ↓ | ↓ | ↓ | 1645 | 1145 | 300 | ↓ | | | |
| 60-blank | 6" Twin | | ↓ | ↓ | ↓ | 1235 | 860 | 300 | ↓ | | | |
| 100-100 | 7.5" Twin | 6" Twin | ↓ | ↓ | ↓ | 2400 | 1455 | 300 | ↓ | | | |
| 100-blank | 7.5" Twin | 6" Twin | ↓ | ↓ | ↓ | 1690 | 1095 | 300 | ↓ | | | |
| 200-200 | N/A | 7.5" Twin | ↓ | ↓ | ↓ | 4111 | 4111 | 300 | ↓ | | | |
| 200-blank | N/A | 7.5" Twin | ↓ | ↓ | ↓ | 2055 | 2055 | 300 | ↓ | | | |
| 200 | 9" Single | N/A | ↓ | ↓ | ↓ | 2055 | 1665 | 360 | ↓ | | | |
| 400 | 15" Single | 9" Single | ↓ | ↓ | ↓ | 3965 | 2480 | 600 | — | | | |
| 600 | 15" Single | | 100k | ↓ | ↓ | 4555 | 3490 | 600 | — | | | |
| 800 | 15" Single | | 200k | L | ↓ | 7300 | 5445 | 600 | — | | | |
| 1200 | 24" Single | | 100k | | | 9080 | 9080 | 960 | — | | | |
| | | | | | | | | | | | QMB | Sub-Total |

Main Customer Metering (Device(s) or Switchboard):

| | 480Y/277 | Current Transformers (each) 3 W = 2CT's 4 W = 3CT's | | | | | | Potential Transformers | | |
|---|---|---|---|---|---|---|---|---|---|---|
| | VPM | 800 | 1600 | 2500 | 4000 | QTY | X Price | 3 W | 4 W | Total |
| PM600 | $7260 | — | $750 | $1450 | $1620 | $1710 | | — | — | |
| PM620 | 8712 | — | ↓ | ↓ | ↓ | ↓ | | — | — | |
| CM2150 | 9625 | $1200 | ↓ | ↓ | ↓ | ↓ | | $2790 | $4185 | |
| CM2250 | 11385 | ↓ | ↓ | ↓ | ↓ | ↓ | | ↓ | ↓ | |

TABLE I-continued

| | | | | | | | | | | | |
|---|---|---|---|---|---|---|---|---|---|---|---|
| CM2350 | 12870 | ↓ | ↓ | ↓ | ↓ | ↓ | | | | ↓ | ↓ |
| CM2450 | 13979 | ↓ | ↓ | ↓ | ↓ | ↓ | | | | | |

Customer Metering Sub-Total

Group Mounted Devices — Section Charge

| I-LINE<br>2000 A 63" high full height<br>2000 A 54" high Main Lugs | System Amps | AL. | 700 & 750 A/ In² AL | CU. | 1000 A/ IN² CU | NEMA Type 3R Adder (P1) | Total Qty.___ X Charge |
|---|---|---|---|---|---|---|---|
| 2000 A 36" high with P-frame, one per line-up | 800 | $3,720 | $4,930 | $5,020 | $5,020 | $2,375 | |
| 2000 A 27" high with BOLT-LOC, one per line-up | 1200 | 4,320 | ↓ | 5830 | 7500 | | |
| 3000 A 72" high full heigbt | 1600 | 4,930 | — | 6665 | ↓ | | |
| QMB | 2000 | 5,450 | — | 7500 | ↓ | | |
| 30" Interior available, One per Line-up, 800 A maximum switch | 2500 | — | — | 8750 | 12910 | | |
| 72" Interior available 2000 A or 3000 A, 1200 A maximum switch | 3000 | — | — | 10635 | ↓ | | |
| Additional Features | 4000 | — | — | 12910 | ↓ | | |

Nameplates $75 each Qty.___ Sub-Total     $           Section Charge Sub-Total
Incoming Compression lugs (No Charge)     Yes
Bottom Closure Plate(s) $320 each Qty.___     Sub-Total
Special Barriers Steel $995, Insulating $1990, Qty___

PRICE SUMMARY

ULSE $665 (page 1)
Incoming sections Sub-total (page 2)
Main and Distribution Sub-Total (page 2)
QMB Main Switch Sub-Total (page 2)
I-LINE Sub-Total (page 3)
QMB Sub-Total (page 4)
Customer Metering Sub-Total (page 4)
Section Charge Sub-Total (page 4)
Nameplates Sub-Total (page 4)
Bottom Closure Plates Sub-Total (page 4)
Special Barriers
3000 A I-LINE Charge     $6555 × Qty___
                    Grand Total:
                    xPE1-

TABLE II

ATTRIBUTES OF THE STANDARD SWITCHBOARD PRODUCT
(called QED-S)

QED-S

All standard parts
<=4000A QED-2 Standard Designs
<=4000A MLO and Main Device line-ups
480 Vac maximum
Aluminum or Copper Bus
Up to 200kA SCCR
Series ratings where available
Suitable for use as service equipment
NEMA Type 1 Enclosure
NEMA Type 3R Enclosure non-walk-in
Fixed Individually Mounted Mains:
-Thermal Magnetic M, P
-Micrologic M, P, SE
-Fusible BP
Fix Individually Mounted Feeders M, P and BP
Group Mounted Mains or Feeders:
-Thermal Magnetic F, K, L, M, N
-Micrologic L, M, N
-Fusible QMJ or QMB
Options (where available):
-Auxiliary SW 1A and 1B
-Shunt Trip 120Vac
-Short time
-Ground fault/GF pit
-Trip Indicators/Local current ammeter
-Power Meter
-Circuit Monitor
-Pull Box
-Auxiliary Section
Configurations (see QED-S Switchboard Line-Ups)

TABLE II-continued

ATTRIBUTES OF THE STANDARD SWITCHBOARD PRODUCT
(called QED-S)

QBD-S Switchboard Line-ups Available In Q2C PS

QED-S Single Mains
QED-S Six Circuit Mains
QED-S Combination Sections
QED-S Types of Line-ups
QED-S Single Mains

| | |
|---|---|
| Available as Single Main: | N/A as Single Mains: |
| <4000A | >4000A N/A |
| Service Entrance and Non-Service Entrance | QMJ single mains N/A |
| M, P, SE, BP | QMB <400A or >800A N/A |
| | QBD-3 N/A |
| | QED-4 N/A |
| | DS, MP, and BS |
| Cable Feed: Top - Left, Right or Center | Busway, Transformer and Thru-bus feed to |
| Cable Feed: Bottom - Left, Right or Center | existing Switchboard N/A |
| UCT available ahead of individually | Cold Sequence UCT N/A (pending) |
| mounted mains (BP, P and SEF). | UCT/Main with Load Lugs N/A |
| | UCT ahead of group mounted I-LINE or |
| QMB | main devices. (pending) |
| BP 4000A Top Feed only | 4000A BP Bottom Feed N/A. Requires |
| | auxiliary section ahead for bottom entry. |
| | 3000A Bottom Feed N/A with Circuit |
| | Monitor. |
| Bussed Aux. ahead of individually mounted | Bussed Aux. N/A ahead of group mounted |
| and group mounted mains. | QMB or I-Line Single Mains. |
| Combination sections are available in the | Combination sections (individually mounted |
| first section (single main & short distribution) | device and short distribution in same |
| section) | not available as distribution. |
| or second section. | |
| Mains: | |
| | |
| QED-2 IMD C/B 80A-4000A | |
| (M, P, SEF) | |
| QED-2 IMD F/S 601-4000A | |
| (BP) | |
| I-LINE C/B 300A-1200A | |
| (L, M, N - Back Fed) | |
| QMB F/S 300A-800A | |
| QED-S Six Circuit Mains | |
| | |
| Available as Six Circuit Mains (SCM): | N/A as Six Circuit Mains: |
| <3000A Device Amps | >3000A Devices N/A |
| Service Entrance Only | Thru-bus feed N/A |
| System Amps <4000A Cable Feed | Busway and Transformer |
| | Combination sections are N/A in SCM |
| Mains available P, BP, I-LINE, QMB | DS, MP, BS, SEF, SED, M (IMD) |
| 1 Hot Sequence UCT available ahead of SCM | Cold Sequence UCT N/A |
| | A UCT ahead of each main N/A |
| Bussed Aux. ahead of SCM | Empty Aux. ahead may result in two aux. |
| | sections because a bussed Main Lug |
| | Compartment is required to feed some |
| SCM's | Distribution (any type) not available fed |
| | by SCM (cabled) |
| | City of Chicago local code N/A if SCM |
| Line-Up. | |
| Mains: | |
| | |
| QED-2 IMD C/B 300A-2500A (P) | Six Circuit Mains feeding short interiors |
| QED-2 IMD F/S 601-3000A (BP,) | in same section N/A. |
| I-LINE C/B 15-1200A.(F, K, L, M, N) | |
| QMB F/S 10A-1200A | BP Six Circuit Mains N/A with <=2500A |
| QMJ F/S 100A-600A | Commonwealth UCT. |
| QED-S Combination Sections | |
| | |
| Available in Combination Sections: | N/A in Combination Sections: |
| (short I-LINE or QMB) <2000A | >2000A N/A |
| Service Entrance & Non-Service Entrance | Busway, Transformer and Thru-Bus |
| | connections N/A |
| Single main feeding group mounted | Individually mounted device as a |
| distribution | |
| distribution | w/combination section N/A |

TABLE II-continued

ATTRIBUTES OF THE STANDARD SWITCHBOARD PRODUCT
(called QED-S)

Circuit Breaker (M, P) in combination w/36" high I-LINE sections

SE, MP & DS N/A in combination sections
BP > 1600 Top Loc. N/A in combination sections
BP > 2000 Bot Loc. N/A in combination sections
P > 2000 80% Top Loc N/A in combination sections
P > 1600 100% Top Loc N/A in combo sections BP switches in combination with 27" high I-LINE or 30" high QMB Circuit breaker (M, P) N/A in combination with 30" H QMB or 19.5" meter-compartment(Circuit Monitor) N/A QED-S Types of Line-ups
Single Mains:

Single Main without Distribution.
Single Main with one type of Distribution (i.e. I-LINE, QMB/J, BP and IMD C/B's).
Single Main with more that one type of Distribution.
Single Main without Distribution Individually Mounted (IMD) Single Mains are available without Distribution.
For Lug In Lug Out SM, Do NOT choose Thru-Bus = YES on the Switchboard Requirements Screen. The program will assume you want to feed Distribution!
Single Main with one Type of Distribution.

Individually Mounted (IMD) Single Mains are available with all types of Distribution (I-LINE, QMB«MJ, <2500 IMD circuit breakers, <3000A IMD fusible switches). IMD Single Mains can be cable feed. IMD Single Main Circuit Breakers (2000A maximum) can be combined in the same section with I-LINE Distribution short (36" high) interiors. IMD Single Main Circuit Breakers can NOT be combined in the same section with QMB«MJ Distribution short (30" high) interiors. IMD Single Main BP Fusible Switches (2000A maximum) can be combined in the same section with I-LINE short (27" high) interiors or QMB«MJ short (30" high) interiors.
Group Mounted Single mains are cable feed only.
Group Mounted I-LINE Single Mains are available with I-LINE Distribution ONLY.
Group Mounted I-LINE Single Mains can be mounted in any I-LINE interior (>36" high).
Group Mounted QMB Single Mains are available with QMB or QMJ Distribution ONLY.
Group Mounted QMB Single Mains have 46.5" of QMB«MJ Distribution mounting.
Main Lugs Feeding Six Circuit Mains:

Six Circuit Mains are available in QED-S without Distribution
Main Lug Feeding Distribution:

Main Lug feeding one type of Distribution (i.e. I-LINE, QMB/J, BP and IMD C/B's).
Main Lug feeding more than one type of Distribution.

Utility Metering (Hot Sequence Only!)
Commonwealth Edison UCT only. All other UCT's are currently N/A in QED-S.
UCT Ahead of Single Main (with Distribution). Load lugs (no distribution) N/A in QED-S.
UCT Ahead of Six Circuit Mains (Distribution off a Six Circuit Main N/A).
Fusible Switchboard Dimensions Bolt-Loc Type BP switches mount in 45" high mounting space for
Top or Bottom Located and 90" high for Middle Located.
Thru-bus is required when any individually mounted device is connected as
a Six Circuit Main or Branch Feeder.
The Depth and Width are determined by the BP ampacity and accessories:

| BP AMPS | Min Width | Min Depth | 4W | GFP | Cap Trip | Phase Failure | AM | AM VM | BM FD | PT's | Top Mtg | Mid Mtg | Bot Mtg |
|---|---|---|---|---|---|---|---|---|---|---|---|---|---|
| Height | | | | | | | | | | 45" | 90" | 45" | |
| BP 1600 | 24 | 30 | N | N | N | N | N | N | N | N | Y | Y | Y |
| BP 1600 | 24 | 36 | Y | Y | N | N | Y | Y | Y | N | Y | N | N |
| BP 1600 | 24 | 36 | Y | Y | N | N | Y | Y | Y | Y | N | Y | Y |
| BP 1600 | 24 | 36 | Y | Y | Y | Y | Y | Y | Y | Y | N | Y | N |
| BP 1600 | 24 | 42 | Y | Y | Y | Y | Y | Y | Y | N | Y | N | N |
| BP 1600 | 24 | 42 | Y | Y | Y | Y | Y | Y | Y | Y | N | Y | Y |
| BP 1600 | 24 | 48 | Y | Y | Y | Y | Y | Y | Y | N | Y | N | N |
| BP 1600 | 24 | 48 | Y | Y | Y | Y | Y | Y | Y | Y | N | Y | Y |
| BP 2000 | 24 | 30 | N | N | N | N | N | N | N | N | N | Y | Y |
| BP 2000 | 24 | 36 | Y | Y | Y | Y | Y | Y | Y | Y | N | Y | N |
| BP 2000 | 24 | 36 | Y | Y | N | N | Y | Y | Y | Y | N | Y | Y |
| BP 2000 | 24 | 42 | Y | Y | Y | Y | Y | Y | Y | Y | N | Y | Y |
| BP 2000 | 24 | 48 | Y | Y | Y | Y | Y | Y | Y | Y | N | Y | Y |

TABLE II-continued

ATTRIBUTES OF THE STANDARD SWITCHBOARD PRODUCT
(called QED-S)

| BP 2500 | 24 | 36 | N | N | N | Y | Y | Y | Y | Y | N | Y | N |
|---------|----|----|---|---|---|---|---|---|---|---|---|---|---|
| BP 2500 | 24 | 36 | N | N | N | N | Y | Y | N | Y | N | N | Y |
| BP 2500 | 24 | 42 | Y | Y | Y | Y | Y | Y | Y | Y | N | Y | Y |
| BP 2500 | 24 | 48 | Y | Y | Y | Y | Y | Y | Y | Y | N | Y | Y |
| BP 3000 | 36 | 36 | N | N | N | Y | Y | Y | Y | Y | N | Y | N |
| BP 3000 | 36 | 36 | N | N | N | N | Y | Y | N | Y | N | N | Y |
| BP 3000 | 36 | 42 | Y | Y | Y | Y | Y | Y | Y | Y | N | Y | Y |
| BP 3000 | 36 | 48 | Y | Y | Y | Y | Y | Y | Y | Y | N | Y | Y |
| BP 4000 | 48 | 42 | N | N | N | Y | Y | Y | Y | Y | N | Y | N |
| BP 4000 | 48 | 42 | N | N | N | N | Y | Y | N | Y | N | N | Y |
| BP 4000 | 48 | 48 | Y | Y | Y | Y | Y | Y | Y | Y | N | Y | Y |

2500A and 3000A NEMA Type 3R Switches must be in 42" or 48" wide sections.
BP Switches can mount in the same section with:
Utility CT Compartments (max. 45" high UCT mounting space),
Other BP switches (max. 2000A bottom & max. 1200A top),
30" high QMB/QMJ interiors,
36" high I-LINE interiors.
When a BP is through bus connected on the line and load sides
(when a UCT or bused auxilairy section is ahead of a single main BP)
the section width is 36" wide min. with <=2000A BP, 42" wide min. for 2001–3000A BP
and 48" wide min. for a 4000A BP.

GLOSSARY

| | |
|---|---|
| BP | Bolt-Lot Type BP Pressure contact single-throw 100% load rated break switch per U.L. 977. |
| C/B | Circuit Breaker |
| Compression Lugs | Lugs that are crimped to hold cables. |
| CMM | Commercial Multi-Metering |
| F/S | Fusible Switch |
| I-LINE® | Group mounted plug-on molded case circuit breaker 10-amps through 1200 amps, F frame through N frame; and group mounted Bolt-on molded case circuit breakers 10 amps through 400 amps, F frame through L freame. |
| IMD | "Individually Mounted Device" is mounted separately from other devices and do not share through connections to three-bus with any other devices. One or two IMD can be mounted in one section. |
| Main Lugs | (MLO) are lugs used to terminate incoming cables. Main lugs are used to connect six circuit |
| QMB | Quick-Make, Quick-Break fusible switches are group mounted devices, 10 amps through 1200 amps. |
| QMJ | Quick-Make, Quick Break fusible switches that are reduced in height to allow use with Class J fuses. QMJ switches are available 10 amps through 600 amps and mounted in QMB interriors. |
| SCCR | Short Circuit Current Rating |
| Single Main | A device that will disconnect all load conductors from the service conductors. |
| Six Circuit Mains | A group of devices that will disconnect all load conductors from the service conductors. |
| Thermal Magnetic | A circuit breaker that combines thermal and magnetic trip actions to provide over-current and short circuit protection. |
| UCT | Utility Current Transformer Compartment |
| UL | Underwriter's Laboratory |
| Stored Energy C/B | A circuit breaker which will open or close the device from a trip signal or push button |
| Solid State C/B | A circuit breaker that uses current transformers solid-state circuitry and a flux transfer shunt trip to provide overload and short circuit protection. |

TABLE III

SAMPLE ORDER PROCESSING FOR A STANDARD SWITCHBOARD

```
FEATURES:=============================================================
01CA13XXXX00001demmdi03   Mine.BOM.Sub              999USAEELIBBY DALE'S TEST
                          Mine.Sub                  Nashville TN1
                          0005 4.0                  11000110001
02NASHVILLE                         PRNTA   PRNTB   d:†pfe\pfe exe /p
0301           1        01    1        0                   0501
20004 11018 201       0                             0      Q1
L
0350           1        50    1        0                   0550N0N
49                   2 2
2                    24D
```

TABLE III-continued

SAMPLE ORDER PROCESSING FOR A STANDARD SWITCHBOARD

```
0331       1      31    1        0           0531 0SM 0206003P
TM    MA    N          Y
DR20
4W                    Y    02    00012
0331       2      31    1        0           0531 0SM
1001003PSOTM    FA    N        Y
DR20
4W                    Y    10    00012
0310       1      10    1        0           0510
CB120003P 2PX2000    SMLSIG8
F0                    00   4W       W              Y    N
04Mark It
05Detail It
QUOTE RESULTS:======================================
QUOTE TO CASH JOB NUMBER IS      CA13XXXX
01S
03954100954100          1        EA    B    0000033945.00 00000000.0000
00000000.0000 00000000.0000     00000000.0000
0400000000.0000    00000000.0000    00000000.0000
0509411     9411 SQUARE D STANDARD QED SWITCHBOARD    N   N   N N N    N
06POWER STYLE QED SWITCHBOARD
06 DESIGNED AND TESTED IN ACCORDANCE WITH:
06 UL 891/NATIONAL ELECTRIC CODE/NEMA PB-2
06
06 2000A 480Y/277 VAC 3PH 4W    60HZ
06
06 SUITABLE FOR USE AS SERVICE ENTRANCE EQUIPMENT
06 SHORT CRCT CURRENT RTNG:18 KA RMS SYM.
06 ACCESSIBILITY: FRONT AND LEFT SIDE
06 INCOMING: BOTTOM RIGHT/CABLE FED
06 BUSSING:PLATED AL BUS/UL891 HEAT RISE
06 SINGLE SECTION WITHOUT THRU-BUS
06
06 MAIN OVERCURRENT PROTECTION
06
06 SM:
06   FIXED MOUNTED MICROLOGIC 80% C/B
06   2000A/3P PX2000    EQUIPPED WITH:
06   LONG, SHORT, INSTANTANEOUS, GFP
06   LOCAL CURRENT AMMETER
06   TRIP INDICATOR
06   CONTROL POWER FOR GF
06   PUSH-TO-TEST
06   SUPPLIED IN SWITCHBOARD
06
06   SM    DISTRIBUTION
06   ----------------
06   2 -    600/3P   I-LINE MOUNTED TYPE MA C/B'S
06                  THERMAL MAGNETIC TYPE
06                  EACH EQUIPPED WITH:
06   10 -   100/3PSO I-LINE MOUNTED TYPE FA C/B'S
06          THERMAL MAGNETIC TYPE
06          EACH EQUIPPED WITH:
06
06 SPECIAL FEATURES
06 ----------------
06 STANDARD - ANSI 49
06 ALUMINUM COMPRESSION LUGS ON:
06 SINGLE MAIN DEVICE
06 ------------------
06 TYPE 1    DIMENSIONS
06
06     4'    0"W    24.0"D
06     1 @ 48"W
$$TUUNIT SCHEDULE
UNIT SCHEDULE FILE NOT PRESENT
$$TDDETAIL PRICING
    1    48"W SECTION NO THROUGH BUS      A                         2500.00
    1    I-LINE DOUBLE 48"W 2000A AL.36"H  B                            0.00
    1    PXF 2000 AMP 3 POLE GROUND TRIP   A                        20630.00
    1    LOCAL CURRENT AMMETER,TRIP IND.   A                          920.00
    1    STD. AL. COMPRESSION LUGS         A                            0.00
    1    ULSE LABEL COMBO.IND.MTG.DEVICE   A                          665.00
   10    FA 3P SPACE ONLY 480V             A              50.00       500.00
```

TABLE III-continued

SAMPLE ORDER PROCESSING FOR A STANDARD SWITCHBOARD

| | | | | | | |
|---|---|---|---|---|---|---|
| 2 | MA 600A 3P 600V | | A | | 4155.00 | 8310.00 |
| 1 | PUSH TO TEST GFP QED2 IMD P | | A | | | 420.00 |
| | | | B | SECTION 1 TOTAL | | 33945.00 |
| | | DELIVERY CODE | B | ITEM TOTAL | | 33945.00 |

LINE CODE 9411
ORDER RESULTS : ==     ======================

PRICE/COST SUMMARY

Q2C NUMBER:     CA13XXXX                DATE:   JUN 25 1997
JOB NAME:       LIBBY DALE'S TEST       SALES OFFICE #999
JOB LOCATION:   Nashville TN            DELIVERY CODE: B

TOTALS FOR THIS QUOTE ITEM ARE:

| | PRICE | COST | STANDARD COSTS | |
|---|---|---|---|---|
| SPECIAL ITEMS | 0.00 | 0.00 | MATERIAL | 1,932.72 |
| STD COMPONENTS | 33,945.00 | 2,501.95 | LABOR | 382.30 |
| | | | BURDEN | 126.31 |
| | 33,945.00 | 2,501.95 | VAR BURDEN | 60.62 |

SPECIAL ITEMS INCLUDED IN THIS QUOTE:
  QTY  DESCRIPTION              DC   PRICE EACH   COST EACH
       NONE
ITEM DESCRIPTION FOR THIS QUOTE:
ITEM   DESCRIPTION                          CATEGORY #
       SQUARE D STANDARD QED SWITCHBOARD    09411

Q2C NUMBER: CA13XXXX      ITEM:                    PAGE : 1
                              QUOTE BOM

| ITEM | DESIGNATION | DESCRIPTION |
|---|---|---|
| | | SQUARE D POWER STYLE SWITCHBOARD |
| | | DESIGNED AND TESTED IN ACCORDANCE WITH: |
| | | UL 891/NATIONAL ELECTRIC CODE/NEMA PB-2 |
| | | 2000A 480Y/277 VAC 3PH 4W 60HZ |
| | | SUITABLE FOR USE AS SERVICE ENTRANCE EQUIPMENT |
| | | SHORT CRCT CURRENT RTNG:18 KA RMS SYM. |
| | | ACCESSIBILITY: FRONT AND LEFT SIDE |
| | | INCOMING: BOTTOM RIGHT/CABLE FED |
| | | BUSSING:PLATED AL BUS/UL891 HEAT RISE |
| | | SINGLE SECTION WITHOUT THRU-BUS |
| | | MAIN OVERCURRENT PROTECTION |
| | | SM: |
| | |   FIXED MOUNTED MICROLOGIC 80% C/B |
| | |   2000A/3P PX2000 EQUIPPED WITH: |
| | |   LONG, SHORT, INSTANTANEOUS, GFP |
| | |   LOCAL CURRENT AMMETER |
| | |   TRIP INDICATOR |
| | |   CONTROL POWER FOR GF |
| | |   PUSH-TO-TEST |
| | |   SUPPLIED IN SWITCHBOARD |
| | | SM DISTRIBUTION |
| | | 2 -    600/3P    I-LINE MOUNTED TYPE MA C/B'S |
| | |                  THERMAL MAGNETIC TYPE |
| | |                  EACH EQUIPPED WITH: |
| | | 10 -   100/3PS0  I-LINE MOUNTED TYPE FA C/B'S |
| | |                  THERMAL MAGNETIC TYPE |
| | |                  EACH EQUIPPED WITH: |
| | | SPECIAL FEATURES |
| | | STANDARD - ANSI 49 |
| | | ALUMINUM COMPRESSION LUGS ON: |
| | | SINGLE MAIN DEVICE |
| | | TYPE 1 DIMENSIONS |
| | |   4'  0"W   24.0"D |
| | |   1 @ 48"W |

Q2C NUMBER: CA13XXXX      ITEM:                    PAGE : 2
                          ITEMIZED PRICE SHEET
                          (For Internal Use Only)

| QTY | DESCRIPTION | DELIVERY | LIST EACH | LIST TOTAL |
|---|---|---|---|---|
| 1 | 48"W SECTION NO THROUGH BUS | A | | 2500.00 |
| 1 | I-LINE DOUBLE 48"W 2000A AL.36"H | B | | 0.00 |
| 1 | PXF 2000 AMP 3 POLE GROUND TRIP | A | | 20630.00 |
| 1 | LOCAL CURRENT AMMETER,TRIP IND. | A | | 920.00 |
| 1 | STD. AL. COMPRESSION LUGS | A | | 0.00 |

TABLE III-continued

SAMPLE ORDER PROCESSING FOR A STANDARD SWITCHBOARD

|   |   |   |   |   |   |
|---|---|---|---|---|---|
| 1 | ULSE LABEL COMBO.IND.MTG.DEVICE | | A | | 665.00 |
| 10 | FA 3P SPACE ONLY 480V | | A | 50.00 | 500.00 |
| 2 | MA 600A 3P 600V | | A | 4155.00 | 8310.00 |
| 1 | PUSH TO TEST GFP QED2 IMD P | | A | | 420.00 |
| | | | B | SECTION 1 TOTAL | 33945.00 |
| | | DELIVERY CODE | B | ITEM TOTAL | 33945.00 |

```
LINE CODE 9411
Q2C NUMBER: CA13XXXX     ITEM:            PAGE : 3
PSEUDO/BAY     PART NO.          PLANT
                                 43-45-46
BAY #1

A
SPCLA2                           P C/B/I-LINE LINE CONN. AL.1600A
                     .00  40.54   5.73     5.08      1.90 B ICBMTG
          1   80251-686-52       CM CM CM   P C/B/I-LINE LINE CONN. AL.1600A
PXF362000G                       PXF 2000 AMP 3 POLE GROUND TRIP
                  20630.00 731.33  5.73    5.08      1.90 A ICBMTG
          1   PXF362000G         CM CM CM PXF 2000 AMP 3 POLE GROUND TRIP
SPIMTG48                         P CB MOUNTING ASSEMBLY 48"W
                     .00   6.78   5.73     5.08      1.90 A ICBMTG
          1   80251-610-53       CM CM CM P CB MOUNTING ASSEMBLY 48"W
SPILLA2                          1600A 100% P LINE/LOAD LUG AL.
                     .00  68.09  12.90     2.03      0.76 A ICBTBC
          1   80251-604-52       CS CS CS
          1   80251-606-50       CS CS CS
          1   80251-633          CS CS CS
SSQ1B48                          NEMA 1 BACK C0VER 48"W
                     .00  29.63   8.60     0.81      0.92 A CUSN1
          1   80231-519-65       CU CU CU NEMA 1 BACK COVER 48"W
SSQ1S24                          NEMA 1 SIDE PLATE 24"DEEP
                     .00  11.88   8.60     0.81      0.92 A CUSN1
          2   80231-513-50       CU CU CU NEMA 1 SIDE PLATE 24"DEEP
SSQ1S24                          NEMA 1 SIDE PLATE 24"DEEP
                      00  11.88   8.60     0.81      0.92 A CUSN1
          2   80231-513-50       CU CU CU NEMA 1 SIDE PLATE 24"DEEP
SGCD4836W                        I-LINE 48"DOUBLE 36"H COVER WIDE
                     .00  11.52   8.60     0.81      0.92 A CUDIL
          1   80235-552-63       CU CU CU
          1   TEXT               CU CU CU REF80235-616 FOR COVER LAYOUT
SPCCA48B                         P CB/I-LINE COVER 48"W BOT
                     .00  10.43  17.20     0.81      0.92 B CUIMD
          1   80251-694-55       CU CU CU P CB/I-LINE COVER 48"W BOT
SPIFC48                          P FRONT COVER 48"W
                     .00  16.70  17.20     0.81      0.92 A CUIMD
          1   80251-622-53       CU CU CU P FRONT COVER 48"W
SULSEPA36                        PA-PE ULSE BARRIER >=36"W
                     .00   9.76   4.30     4.04      4.62 A CUULSE
          1   80251-642-50       FC FC CU PA-PE ULSE BARRIER >=36"W
SSQ1LA                           TYPE 1 LIFTING ASSEMBLY
                     .00   2.97   0.00     0.00      0.00 A
          1   80231-501-50       FR FR FR TYPE 1 LIFTING ASSEMBLY
SSQ1F4824                        QED2 NEMA 1 48"W 24"D FRAME
                     .00  59.29   5.60     2.99      1.22 A SN1
          1   80231-500-55       FR FR FR
          1   80231-514-55       FR FR FR
S5QB4824                         QED2 BASE CHANNELS 48"W 24"D
                     .00  10.38   0.00     0.00      0.00 A
          2   80231-517-06       FR FR FR
          2   80231-512-50       FR FR FR
SDIAL800                         CB NEUTRAL     LUG 401 TO 800 AMPS
                     .00   4.86  16.79     3.99      1.63 A DICL
          3   80031-002-09       ID ID IS CB NEUTRAL    LUG 401 T0 800 AMPS
SDIAL800                         CB NEUTRAL     LUG 401 T0 800 AMPS
                     .00   4.86  16.79     3.99      1.63 A DICL
          3   80031-002-09       ID ID IS  CB NEUTRAL     LUG 401 TO 800 AMPS
SDIAL100                         CB NEUTRAL   LUG 30 TO 100 AMPS
                     .00   3.39  16.79     3.99      1.63 A DICL
          1   80235-612-50       ID ID IS  CB NEUTRAL     LUG 30 TO 100 AMPS
SDIAL100                         CB NEUTRAL   LUG 30 TO 100 AMPS
                     .00   3.39  16.79     3.99      1.63 A DICL
          1   80235-612-50       ID ID IS  CB NEUTRAL     LUG 30 TO 100 AMPS
FA34SO                           FA 3P SPACE ONLY 480V
                   50.00   0.53   4.20     3.99      1.63 A DICB
          1   40517-407-01       ID ID IS
          1   21427-20161        ID ID IS
```

TABLE III-continued

SAMPLE ORDER PROCESSING FOR A STANDARD SWITCHBOARD

| | | | |
|---|---|---|---|
| MA36600 | | MA 600A 3P 600V | |
| | | 4155.00 185.72 4.20 3.99 1.63 A DICB | |
| | 1 MA36600 | ID ID IS MA 600A 3P 600V | |
| FA34SO | | FA 3P SPACE ONLY 480V | |
| | | 50.00 0.53 4.20 3.99 1.63 A DICB | |
| | 1 40517-407-01 | ID ID IS | |
| | 1 21427-20161 | ID ID IS | |
| FA34SO | | FA 3P SPACE ONLY 480V | |
| | | 50.00 0.53 4.20 3.99 1.63 A DICB | |
| | 1 40517-407-01 | ID ID IS | |
| | 1 21427-20161 | ID ID IS | |
| FA34SO | | FA 3P SPACE ONLY 480V | |
| | | 50.00 0.53 4.20 3.99 1.63 A DICB | |
| | 1 40517-407-01 | ID ID IS | |
| | 1 21427-20161 | ID ID IS | |
| FA34SO | | FA 3P SPACE ONLY 480V | |
| | | 50.00 0.53 4.20 3.99 1.63 A DICB | |
| | 1 40517-407-01 | ID ID IS | |
| | 1 21427-20161 | ID ID IS | |
| FA34SO | | FA 3P SPACE ONLY 480V | |
| | | 50.00 0.53 4.20 3.99 1.63 A DICB | |
| | 1 40517-407-01 | ID ID IS | |
| | 1 21427-20161 | ID ID IS | |
| FA34SO | | FA 3P SPACE ONLY 480V | |
| | | 50.00 0.53 4.20 3.99 1.63 A DICB | |
| | 1 40517-407-01 | ID ID IS | |
| | 1 21427-20161 | ID ID IS | |
| FA34SO | | FA 3P SPACE ONLY 480V | |
| | | 50.00 0.53 4.20 3.99 1.63 A DICB | |
| | 1 40517-407-01 | ID ID IS | |
| | 1 21427-20161 | ID ID IS | |
| FA34SO | | FA 3P SPACE ONLY 480V | |
| | | 50.00 0.53 4.20 3.99 1.63 A DICB | |
| | 1 40517-407-01 | ID ID IS | |
| | 1 21427-20161 | ID ID IS | |
| MA36600 | | MA 600A 3P 600V | |
| | | 4155.00 185.72 4.20 3.99 1.63 A DICB | |
| | 1 MA36600 | ID ID IS MA 600A 3P 600V | |
| SGNGGD4836 | | I-LINE 48"DR 36" GUTTER GUARD | |
| | | .00 2.68 0.00 0.00 0.00 A | |
| | 2 80235-812-51 | IM IM IM I-LINE 48"DR 36" GUTTER GUARD | |
| SGID48A2036 | | I-LINE DOUBLE 48"W 2000A AL.36"H | |
| | | 0.00 194.03 15.39 2.99 1.22 B D136 | |
| | 1 80235-611-65 | IS IS IS | |
| | 1 80235-553-52 | IM IM IM | |
| | 2 80231-515-52 | IM IM IM | |
| SSISULLABEL | | UL LABEL SINGLE SECTION | |
| | | .00 0.00 0.00 0.00 0.00 A CULABEL | |
| | 1 80258-117-77 | LA LA LA UL LABEL SINGLE SECTION | |
| SILSULLABEL | | UL LABEL I-LINE SECTIONS | |
| | | .00 1.42 0.00 0.00 0.00 A CULABEL | |
| | 1 80258-117-55 | LA LA LA UL LABEL I-LINE SECTIONS | |
| SULSE | | ULSE BARRIER REQUIRED | |
| | | .00 0.00 4.30 4.04 4.62 A CUULSE | |
| | 1 TEXT | LA LA LA ULSE BARRIER REQUIRED | |
| SIMDCPCGULSE | | ULSE LABEL COMBO.IND.MTG.DEVICE | |
| | | 665.00 6.18 0.00 0.00 0.00 A CULABEL | |
| | 1 80258-135-51 | LA LA LA | |
| | 1 80258-117-62 | LA LA LA | |
| PE20CT2 | | PE/X NEUTRAL CT 2000 AMP | |
| | | .00 40.96 46.80 3.94 1.64 A WCBGFI | |
| | 1 PE20CT2 | MW MW MW PE/X NEUTRAL CT 2000 AMP | |
| SCBLCATIPX | | LOCAL CURRENT AMMETER,TRIP IND. | |
| | | 920.00 34.60 18.72 3.94 1.64 A WCBACC | |
| | 1 ALAMP | MW MW MW LOCAL CURRENT AMMETER, TRIP IND. | |
| PTTQ2P4 | | PUSH TO TEST GFP QED2 IMD P | |
| | | 420.00 19.69 5.73 5.08 1.90 A ISEMTG | |
| | 1 80251-786-58 | MW MW MW PUSH TO TEST GFP QED2 IMD P | |
| SGFPTT4 | | GFP PUSH TO TEST INSTALLED | |
| | | .00 .00 18.72 3.94 1.64 A WCBACC | |
| | 1 TEXT | MW MW MW GFP PUSH TO TEST INSTALLED | |

TABLE III-continued

SAMPLE ORDER PROCESSING FOR A STANDARD SWITCHBOARD

```
SPCNA48YCD                        P C/B /I-LINE NEUTRAL/GFI 48"W
                           .00 207.94  17.77    1.44    0.78 B ICBNBC
              1 80251-695-61     NC NC NC
              1 80247-855-51     NC NC NC
              1 80235-620-53     NC NC NC
SPCNA48YCD                        P C/B /I-LINE NEUTRAL/GFI 48"W
                           .00 207.94  17.77    1.44    0.78 B ICBNBC
              1 80251-695-61     NC NC NC
              1 80247-855-51     NC NC NC
              1 80235-620-53     NC NC NC
SGBEI2000A24                      GROUND BUS EXTENSION AL 24D
                           .00   7.24   0.00    0.00    0.00 A
              1 80235-791-60     TM TM TM GROUND BUS EXTENSION AL 24D
SGB20A48                          GROUND BUS 2000A ALUMINUM 48"W
                           .00   3.56   5.60    2.00    0.82 A BHCB20
              1 80247-574-56     TS TS TS
              1 80247-574-50     TS TS TS
SGBLUG                            GROUND LUG ASSEMBLY ULSE SINGLE SEC
                           .00   0.00   0.00    0.00    0.00 A
              1 80247-754-50     TS TS TS GROUND LUG ASSEMBLY ULSE SINGLE SEC
SSASC48                           48"W SECTION NO THROUGH BUS
                        2500.00   0.00   0.00    0.00    0.00 A
S5GMD48                           I-LINE DOUBLE 48"W MTG ASSEMBLY
                           .00   0.00   4.20    2.00    0.82 A DIMTG
SCBSCL                            STD. AL. COMPRESSION LUGS
                          0.00   0.00  18.72    3.94    1.64 A WCBACC
              1 TEXT             ZZ ZZ ZZ STD. AL. COMPRESSION LUGS
BAY PRICE      BAY MAT. COST    BAY LAB. COST     BAY BURD. COST
 33945.          2187.             484.              70.
TOTAL PRICE    TOTAL MATERIAL   TOTAL LABOR       TOTAL BURDEN
 33945.          2187.             484.              70.
LINE CODE
PELT CODE B
```

TABLE IV

DRAWING NOTES

GENERAL NOTES

| | |
|---|---|
| INCOMING FEED: | CABLED, BOTTOM RIGHT |
| SYSTEM VOLTAGE: | 480Y/277 3-PH 4-W |
| AVAILABLE FAULT CURRENT: | 18,000 A RMS SYM |
| SYSTEM AMPERAGE: | 2000 AMPS |
| BUS MATERIAL: | ALUMINUM &/OR COPPER |
| ACCESSIBILITY: | FRONT AND LEFT SIDE |
| HANDLING: | ROLLERS AND LIFTING |
| ENCLOSURE: | TYPE 1 FREE STANDING |
| COLOR: | ANSI 49 |
| UL LABEL: | DEADFRONT AND SUITABLE FOR USE AS SERVICE ENTRANCE WHEN NOT MORE THAN SIX MAIN DISCONNECTING MEANS ARE PROVIDED |
| ALUMINUM COMPRESSION LUGS ON: | SINGLE MAIN DEVICE |
| SWBD MK: | MARK IT |
| SINGLE SECTION WITHOUT THRU-BUS | |

TABLE V

TABLE OF MODULES AND COMPONENTS INCLUDED IN THE SWITCHBOARD ORDER
POWER STYLE QED SWITCHBOARD

| SECT. NO. | CKT. NO. | DESIGNATION | N/P | AMPS/P | TYPE/ FRAME | FUSE/ TRIP | LUG QTY. | LUG SIZE | ACCESSORY/SIRING DIAGRAM NUMBER |
|---|---|---|---|---|---|---|---|---|---|
| 1 | SM | | No | 2000/3 | PX2000 | LSIG | 6 | 3/0-750 | W GT/80310-401, F 0 |
| 1 | 1 | | No | 100/3 | FA50 | | 1 | #12-1/0 | |
| 1 | 2 | | No | 100/3 | FA50 | | 1 | #12-1/0 | |
| 1 | 3 | | No | 100/3 | FA50 | | 1 | #12-1/0 | |
| 1 | 4 | | No | 600/3 | MA | | 3 | 3/0-500 | |
| 1 | 5 | | No | 100/3 | FA50 | | 1 | #12-1/0 | |
| 1 | 6 | | No | 100/3 | FA50 | | 1 | #12-1/0 | |
| 1 | 7 | | No | 100/3 | FA50 | | 1 | #12-1/0 | |
| 1 | 8 | | No | 100/3 | FA50 | | 1 | #12-1/0 | |

TABLE V-continued

TABLE OF MODULES AND COMPONENTS INCLUDED IN THE SWITCHBOARD ORDER
POWER STYLE QED SWITCHBOARD

| SECT. NO. | CKT. NO. | DESIGNATION | N/P | AMPS/P | TYPE/ FRAME | FUSE/ TRIP | LUG QTY. | LUG SIZE | ACCESSORY/SIRING DIAGRAM NUMBER |
|---|---|---|---|---|---|---|---|---|---|
| 1 | 9 |  | No | 600/3 | MA |  | 3 | 3/0-500 |  |
| 1 | 10 |  | No | 100/3 | FA50 |  | 1 | #12-1/0 |  |
| 1 | 11 |  | No | 100/3 | FA50 |  | 1 | #12-1/0 |  |
| 1 | 12 |  | No | 100/3 | FA50 |  | 1 | #12-1/0 |  |

What is claimed is:

1. A method of manufacturing switchboards comprising the steps of:
   a) interviewing individual customers to identify and understand actual needs of the individual customers beyond what the customers indicate in switchboard specifications;
   b) from the actual needs of the individual customers beyond what the customers indicate in switchboard specifications, revising switchboard specifications to more closely correspond to actual needs of groupings of customers;
   c) identifying a subset of switchboard configurations that in various combinations satisfy a majority of the actual needs of the groupings of customers;
   d) standardizing and streamlining a process of ordering and manufacturing standard designs from the subset of switchboard configurations; and
   e) manufacturing a switchboard that is ordered using the resulting standardized and streamlined process of ordering, said switchboard being manufactured using said standardized and streamlined process of manufacturing standard designs.

2. The method as claimed in claim 1, which includes identifying the actual needs of groupings of customers by extrapolating from the actual needs of the individual customers beyond what the customers indicate in switchboard specifications.

3. The method as claimed in claim 1, which includes preparing a histogram of frequency of customer orders for existing designs in order to identify the subset of switchboard configurations that in various combinations satisfy a majority of the actual needs of the groupings of customers.

4. The method as claimed in claim 1, which includes ranking existing designs with respect to complexity of the existing designs, in order to identify existing designs that are frequent but are not complex and to include in said subset of switchboard configurations the existing designs that are frequent but are not complex.

5. The method as claimed in claim 1, wherein the majority of the actual needs of the groupings of customers is monitored as a percentage of customer orders satisfied by switchboard designs falling within the subset of switchboard configurations, and the percentage is selected to balance cost of engineering and manufacturing of custom designs for customer orders of switchboards excluded from the subset of switchboard configurations versus cost of manufacturing standard designs for customer orders of switchboards included in the subset of switchboard configurations.

6. The method as claimed in claim 5, wherein the percentage is selected to be about 80%.

7. The method as claimed in claim 1, which includes performing custom design to satisfy customer orders of switchboards that are excluded from the subset of switchboard configurations, and performing automatic configuration to satisfy customer orders of switchboards that are included in the subset of switchboard configurations.

8. The method as claimed in claim 1, which further includes revising a process of custom design and manufacture of non-standard configurations to maximize use of standard components used in the manufacturing of standard designs.

9. The method as claimed in claim 8, which includes optimizing plant layout to include an assembly line having stations for the manufacturing of the standard designs, and a separate plant area for custom assembly.

10. The method as claimed in claim 9, which includes diverting partially assembled switchboard from the assembly line to the separate plant area for custom assembly.

11. The method as claimed in claim 10, which further includes returning an assembled switchboard from the separate plant area for custom assembly to the assembly line to perform testing of standard switchboards and custom switchboards.

12. The method as claimed in claim 1, wherein the process of ordering and manufacturing standard designs from the subset of switchboard configurations is streamlined to manufacture a switchboard from a standard design in about one day prior to a delivery date requested by the customer.

13. The method as claimed in claim 1, wherein the process of ordering and manufacturing standard designs from the subset of switchboard configurations is streamlined by automatic processing of orders in an integrated computer system including an order-to-payment system, a switchboard selector for selecting standard switchboards and custom switchboards, a configuration program for automatic configuration of standard switchboards, and a materials management system.

14. The method as claimed in claim 13, wherein the integrated computer system automatically schedules manufacturing of standard switchboards and ordering of parts for the standard switchboards.

15. A method of manufacturing switchboards comprising the steps of:
   a) identifying a subset of switchboard configurations that in various combinations satisfy a majority of the actual needs of customers;
   b) standardizing and streamlining a process of ordering and manufacturing standard designs from the subset of switchboard configurations;
   c) revising a process of custom design and manufacture of non-standard configurations to maximize use of standard components used in the manufacturing of standard designs; and
   d) manufacturing a switchboard that is ordered using the resulting standardized and streamlined process of ordering, said switchboard being manufactured using either said standardized and streamlined process of manufacturing standard designs or said revised process of custom design and manufacture of non-standard configurations.

16. The method as claimed in claim 15, which includes preparing a histogram of frequency of customer orders for existing designs in order to identify the subset of switchboard configurations that in various combinations satisfy a majority of the actual needs of the customers.

17. The method as claimed in claim 15, which includes ranking existing designs with respect to complexity of the existing designs, in order to identify existing designs that are frequent but are not complex and to include in said subset of switchboard configurations the existing designs that are frequent but are not complex.

18. The method as claimed in claim 15, wherein the majority of the actual needs of the customers is monitored as a percentage of customer orders satisfied by switchboard designs falling within the subset of switchboard configurations, and the percentage is selected to balance cost of engineering and manufacturing of custom designs for customer orders of switchboards excluded from the subset of switchboard configurations versus cost of manufacturing standard designs for customer orders of switchboards included in the subset of switchboard configurations.

19. The method as claimed in claim 18, wherein the percentage is selected to be about 80%.

20. The method as claimed in claim 15, which includes performing custom design to satisfy customer orders of switchboards that are excluded from the subset of switchboard configurations, and performing automatic configuration to satisfy customer orders of switchboards that are included in the subset of switchboard configurations.

21. The method as claimed in claim 20, which includes optimizing plant layout to include an assembly line having stations for the manufacturing of the standard designs, and a separate plant area for custom assembly.

22. The method as claimed in claim 21, which includes diverting partially assembled switchboard from the assembly line to the separate plant area for custom assembly.

23. The method as claimed in claim 22, which further includes returning an assembled switchboard from the separate plant area for custom assembly to the assembly line to perform testing of standard switchboards and custom switchboards.

24. The method as claimed in claim 15, wherein the process of ordering and manufacturing standard designs from the subset of switchboard configurations is streamlined to manufacture a switchboard from a standard design in about one day prior to a delivery date requested by the customer.

25. The method as claimed in claim 15, wherein the process of ordering and manufacturing standard designs from the subset of switchboard configurations is streamlined by automatic processing of orders in an integrated computer system including an order-to-payment system, a switchboard selector for selecting standard switchboards and custom switchboards, a configuration program for automatic configuration of standard switchboards, and a materials management system.

26. The method as claimed in claim 25, wherein the integrated computer system automatically schedules manufacturing of standard switchboards and ordering of parts for the standard switchboards.

27. The method as claimed in claim 15, which includes interviewing individual customers to identify and understand actual needs of the individual customers beyond what the customers indicate in switchboard specifications; and from the actual needs of the individual customers beyond what the customers indicate in switchboard specifications, revising switchboard specifications to more closely correspond to actual needs of groupings of the customers.

28. The method as claimed in claim 27, wherein said subset of switchboard configurations includes respective switchboard configurations to satisfy the actual needs of the groupings of customers.

29. A method of manufacturing switchboards comprising the steps of:
   a) identifying a subset of switchboard configurations that in various combinations satisfy a majority of the actual needs of customers;
   b) standardizing and streamlining a process of ordering and manufacturing standard designs from the subset of switchboard configurations;
   c) revising a process of custom design and manufacture of non-standard configurations to maximize use of standard components used in the manufacturing of standard designs;
   d) integrating a switchboard configuration system for automatic configuration of the standard designs into a computer system having an order-to-payment system, a switchboard selector for selecting standard switchboards and custom switchboards, a configuration program for automatic configuration of standard switchboards, and a materials management system;
   e) performing custom design to satisfy customer orders of switchboards that are excluded from the subset of switchboard configurations, and performing automatic configuration to satisfy customer orders of switchboards that are included in the subset of switchboard configurations; and
   f) manufacturing a switchboard using either said custom design or said automatic configuration.

30. The method as claimed in claim 29, which includes optimizing plant layout to include an assembly line having stations for the manufacturing of the standard designs, and a separate plant area for custom assembly.

31. The method as claimed in claim 30, which includes diverting partially assembled switchboard from the assembly line to the separate plant area for custom assembly.

32. The method as claimed in claim 31, which further includes returning an assembled switchboard from the separate plant area for custom assembly to the assembly line to perform testing of standard switchboards and custom switchboards.

33. The method as claimed in claim 29, wherein the process of ordering and manufacturing standard designs from the subset of switchboard configurations is streamlined to manufacture a switchboard from a standard design in about one day prior to a delivery date requested by the customer.

34. A method of manufacturing switchboards comprising the steps of:
   a) interviewing individual customers to identify and understand actual needs of the individual customers beyond what the customers indicate in switchboard specifications;
   b) from the actual needs of the individual customers beyond what the customers indicate in switchboard specifications, revising switchboard specifications to more closely correspond to actual needs of groupings of customers;
   c) identifying a subset of switchboard configurations that in various combinations satisfy a majority of the actual needs of the groupings of customers;

d) standardizing and streamlining a process of ordering and manufacturing standard designs from the subset of switchboard configurations;

e) revising a process of custom design and manufacture of non-standard configurations to maximize use of standard components used in the manufacturing of standard designs;

f) integrating a switchboard configuration system for automatic configuration of the standard designs into a computer system having a switchboard selector for standard and custom switchboards;

g) performing custom design to satisfy customer orders of switchboards that are excluded from the subset of switchboard configurations, and performing automatic configuration to satisfy customer orders of switchboards that are included in the subset of switchboard configurations; and h) manufacturing a switchboard using either said custom design or said automatic configuration.

35. The method as claimed in claim 34, which includes optimizing plant layout to include an assembly line having stations for the manufacturing of the standard designs, and a separate plant area for custom assembly.

36. The method as claimed in claim 35, which includes diverting partially assembled switchboard from the assembly line to the separate plant area for custom assembly.

37. The method as claimed in claim 36, which further includes returning an assembled switchboard from the separate plant area for custom assembly to the assembly line to perform testing of standard switchboards and custom switchboards.

38. The method as claimed in claim 34, wherein the process of ordering and manufacturing standard designs from the subset of switchboard configurations is streamlined to manufacture a switchboard from a standard design in about one day prior to a delivery date requested by the customer.

39. The method as claimed in claim 34, wherein the switchboard selector is integrated with an order-to-payment system, and the method includes integrating the switchboard configuration system with a materials management system.

40. A method of manufacturing switchboards to satisfy individual customer orders, said method comprising the steps of:

a) receiving respective customer specifications for switchboards to be manufactured;

b) determining whether or not the customer specification for each switchboard can be met by a respective standard switchboard design configuration from a predefined set of standard switchboard designs and a predefined set of standard switchboard components; and when the customer specification for said each switchboard can be met by a respective standard switchboard design configuration from the predefined set of standard switchboard designs and the predefined set of standard switchboard components, automatically producing manufacturing instructions for the respective standard switchboard design configuration from the custom specification for said each switchboard, and; and when the customer specification for said each switchboard cannot be met by a respective standard switchboard design configuration from the predefined set of standard switchboard designs and the predefined set of standard switchboard components, producing manufacturing instructions for a custom switchboard design configuration that will meet the customer specifications for said each switchboard; and c) manufacturing a switchboard using either the manufacturing instructions for the respective standard switchboard design configuration or the manufacturing instructions for the custom switchboard design configuration.

41. The method as claimed in claim 40, wherein each standard switchboard design configuration is a combination of selected ones of the standard switchboard designs, and the standard switchboard designs include designs for utility sections, mains protection sections, and branch and distribution protection sections.

42. The method as claimed in claim 40, wherein the manufacturing instructions automatically produced for the respective standard switchboard design configuration include a set of assembly drawings and a bill of materials for said each switchboard.

43. The method as claimed in claim 40, which includes operating a digital computer system programmed for automatically determining whether or not the customer specification for said each switchboard can be met by a respective standard switchboard design configuration from a predefined set of standard switchboard designs and a predefined set of standard switchboard components; and when the customer specification for said each switchboard can be met by a respective standard switchboard design configuration from the predefined set of standard switchboard designs and the predefined set of standard switchboard components, for automatically producing the manufacturing instructions for the respective standard switchboard design configuration from the customer specification for said each switchboard.

44. The method as claimed in claim 43, wherein the digital computer system is programmed with a product selector program and a materials management system program, and the method further includes operating the digital computer system for entering the customer orders, automatically producing the manufacturing instructions for the standard switchboard design configurations, automatically ordering parts for the switchboards manufactured according to the manufacturing instructions for the standard switchboard design configurations, and automatically scheduling assembly of the switchboards manufactured according to the manufacturing instructions for the standard switchboard design configurations.

45. The method as claimed in claim 40, wherein the manufacture of switchboards from the standard switchboard design configurations is optimized and separated from the manufacture of switchboards from the custom switchboard design configurations.

46. The method as claimed in claim 40, wherein a requested delivery date is received with the customer specifications for said each switchboard, and when the customer specifications for said each switchboard can be met by a respective standard switchboard design configuration from the predefined set of standard switchboard designs and the predefined set of standard switchboard components, the manufacturing instructions are used to manufacture said each switchboard about one day prior to the requested delivery date.

47. The method as claimed in claim 46, which includes charging a customer a premium price when a duration in time, from receipt of the customer specification to the requested delivery date, is substantially shorter than a duration in time that is generally required for designing and manufacturing a switchboard according to a custom switchboard design configuration.

48. The method as claimed in claim 40, wherein the set of standard switchboard designs is predefined so that specifications from about 80% of customer orders for the switchboards are satisfied using standard switchboard design configurations and specifications from the remaining percentage of customer orders for switchboards are satisfied using custom switchboard design configurations.

49. The method as claimed in claim 40, wherein the set of standard switchboard designs is predetermined by an analysis of actual needs of customers for said switchboards, and by identifying a subset of existing switchboard designs that can satisfy the actual needs of at least a majority of the customers.

50. The method as claimed in claim 49, wherein the analysis of actual needs of customers includes customer interviews.

51. The method as claimed in claim 50, wherein the customer interviews are used to determine when customers are specifying complexity that they do not actually need.

52. The method as claimed in claim 49, wherein the step of identifying a subset of existing switchboard designs that can satisfy the actual needs of at least a majority of the customers includes preparing a histogram of frequency of customer orders for the existing switchboard designs.

53. The method as claimed in claim 49, which further includes ranking the existing switchboard designs with respect to complexity of the existing switchboard designs, in order to identify and include in said subset of existing switchboard designs the existing switchboard designs that are frequent but are not complex.

54. The method as claimed in claim 40, wherein the set of standard switchboard designs is predetermined by including, in the set of standard switchboard designs, new designs of utility sections that have been submitted to utilities for approval prior to receipt of orders from customers serviced by the utilities for switchboards including the new designs.

55. The method as claimed in claim 40, wherein human participation and judgement are used in the production of manufacturing instructions for the custom switchboard design configurations that will meet the customer specifications.

56. The method as claimed in claim 40, which further includes indicating why certain customer specifications for a switchboard cannot be met by a respective standard design configuration from the predefined set of standard switchboard designs and the predefined set of standard switchboard components.

57. The method as claimed in claim 40, wherein each standard switchboard design configuration has a continuous current capacity of no more than 4000 amperes, a maximum voltage rating of 480 volts alternating current (Vac), a short circuit current rating of no more than 200 kiloamperes (kA), and an aluminum or copper bus.

58. A method of improving production and sales of switchboards, said method comprising the steps of:
  a) conducting a review of production and sales of the switchboards, including customer interviews to determine discrepancies between actual needs of the customers and customer needs expressed in respective customer specifications for the switchboards;
  b) selecting a reduced set of standard switchboard configuration classes so that a predefined majority of customer orders can be satisfied by the standard switchboard configuration classes;
  c) optimizing manufacturing capabilities for manufacturing of the switchboards from the standard switchboard configuration classes;
  d) processing customer orders by determining whether or not a respective switchboard specification associated with each customer order can be satisfied by a switchboard configured from the standard switchboard configuration classes; when the respective switchboard specification can be satisfied by a switchboard configured from the standard switchboard configuration classes, producing manufacturing instructions for the switchboard by configuring the switchboard from the standard switchboard configuration classes; and when the respective switchboard specification cannot be satisfied by a switchboard configured from the standard switchboard configuration classes, producing manufacturing instructions for the switchboard by a custom design process; and
  e) manufacturing a switchboard using either said manufacturing instructions produced by configuring the switchboard from the standard switchboard configuration classes, or said manufacturing instructions produced by said custom design process.

59. The method as claimed in claim 58, which includes operating a digital computer system programmed for automatically determining whether or not the respective switchboard specification can be satisfied by a switchboard configured from the standard switchboard configuration classes; and when the respective switchboard specification can be satisfied by a switchboard configured from the standard switchboard configuration classes, for automatically producing manufacturing instructions for the switchboard by configuring the switchboard from the standard switchboard configuration classes.

60. The method as claimed in claim 59, wherein the manufacturing instructions automatically produced for the switchboard include a set of assembly drawings and a bill of materials for the switchboard.

61. The method as claimed in claim 59, wherein the digital computer system is programmed with a product selector program and a materials management system program, and the method further includes operating the digital computer for entering the customer orders; and when the respective switchboard specification can be satisfied by a switchboard configured from the standard switchboard configuration classes, for automatically producing manufacturing instructions for the switchboard by configuring the switchboard from the standard switchboard configuration classes and for automatically scheduling assembly of the switchboard.

62. The method as claimed in claim 58, wherein a requested delivery date is associated with each customer order, and when the respective switchboard specification can be satisfied by a switchboard configured from the standard switchboard configuration classes, the manufacturing instructions are used to manufacture the switchboard about one day prior to the requested delivery date.

63. The method as claimed in claim 58, wherein the reduced set of standard switchboard configuration classes is selected so that switchboard specifications associated with about 80% of customer orders for the switchboards are satisfied by standard design configurations and specifications from the remaining percentage of customer orders for the switchboards are satisfied by custom design configurations.

64. The method as claimed in claim 58, wherein the selecting of the reduced set of standard switchboard configuration classes includes preparing a histogram of frequency of customer orders for existing designs for the switchboards.

65. The method as claimed in claim 64, which further includes ranking the existing designs with respect to complexity of the existing designs, in order to identify existing designs that are frequent but are not complex and to include in said reduced set of standard switchboard configuration classes the existing designs that are frequent but are not complex.

66. The method as claimed in claim 58, wherein the selecting of the reduced set of standard switchboard configuration classes includes submitting new designs to customers for customer approval prior to receipt of customer orders for the new designs, and including approved new designs in the reduced set of standard switchboard configuration classes.

67. The method as claimed in claim 58, which includes implementation of a sales office and manufacturing plant roll-out schedule for switching over from custom design and assembly of the switchboards to the processing of customer orders in accordance with said step d).

68. The method as claimed in claim 67, which includes using computer-based spreadsheet tools for monitoring the implementation of the sales office and manufacturing plant roll-out schedule.

69. The method as claimed in claim 58, wherein each switchboard configured from the standard switchboard configuration classes has a continuous current capacity of no more than 4000 amperes, a maximum voltage rating of 480 volts alternating current (Vac), a short circuit current rating of no more than 200 kiloamperes (kA), and an aluminum or copper bus.

* * * * *